(12) United States Patent
Li et al.

(10) Patent No.: US 11,778,894 B2
(45) Date of Patent: Oct. 3, 2023

(54) BORON-CONTAINING ORGANIC LIGHT-EMITTING DIODE DEVICE AND PREPARATION METHOD THEREOF

(71) Applicant: JIANGSU SUNERA TECHNOLOGY CO.,LTD., Wuxi (CN)

(72) Inventors: Chong Li, Wuxi (CN); Zhonghua Ye, Wuxi (CN); Zhaochao Zhang, Wuxi (CN); Lichun Wang, Wuxi (CN)

(73) Assignee: JIANGSU SUNERA TECHNOLOGY CO., LTD., Wuxi (CN)

( * ) Notice: Subject to any disclaimer, the term of this patent is extended or adjusted under 35 U.S.C. 154(b) by 811 days.

(21) Appl. No.: 16/964,205

(22) PCT Filed: Sep. 25, 2018

(86) PCT No.: PCT/CN2018/107220
§ 371 (c)(1),
(2) Date: Jul. 23, 2020

(87) PCT Pub. No.: WO2019/062685
PCT Pub. Date: Apr. 4, 2019

(65) Prior Publication Data
US 2021/0043841 A1    Feb. 11, 2021

(30) Foreign Application Priority Data

Sep. 29, 2017  (CN) .......................... 201710909661.X

(51) Int. Cl.
*H01L 51/00* (2006.01)
*H01L 51/50* (2006.01)
(Continued)

(52) U.S. Cl.
CPC ......... *H10K 85/322* (2023.02); *H10K 85/633* (2023.02); *H10K 85/654* (2023.02);
(Continued)

(58) Field of Classification Search
CPC .................................................... H01L 51/008
See application file for complete search history.

(56) References Cited

U.S. PATENT DOCUMENTS

2016/0056393 A1*  2/2016  Oikawa ............... H01L 51/5028
548/440
2016/0329512 A1*  11/2016  Nishide ................. H01L 51/504

FOREIGN PATENT DOCUMENTS

| CN | 103483364 A | 1/2014 |
| CN | 106467553 A | 3/2017 |

(Continued)

OTHER PUBLICATIONS

Nakanotani et al., Nature Communications, May 30, 2014, pp. 1-7.*
English-language translation of CN-106467553-A.*
Ahmad et al., J. Mater. Chem. C, 2022, 10, 4785.*

*Primary Examiner* — Vu A Nguyen
(74) *Attorney, Agent, or Firm* — Bayramoglu Law Offices LLC

(57) ABSTRACT

Disclosed is an organic light-emitting diode device (OLED) structure, in particular to a high-efficiency organic light-emitting diode device comprising a boron-containing compound. The organic light-emitting diode device prepared by the present invention comprises: an anode, a hole injection or transport layer, a light-emitting layer, an electron injection or transport layer, and a cathode, wherein the light-emitting layer comprises a host material and a doping material, the host material can be composed of a single material or a mixture of materials with different structures; the doping material is a boron-containing organic compound with a singlet-triplet energy gap of not more than 0.2 eV; the singlet and triplet energy levels of the host material are higher than those of the doping material, which can prevent the energy return and avoid the reduction in the light emitting efficiency of the device. Further provided is a (Continued)

preparation method of the organic light-emitting diode device.

22 Claims, 1 Drawing Sheet

(51) Int. Cl.
*H10K 85/30* (2023.01)
*H10K 85/60* (2023.01)
*H10K 50/11* (2023.01)
*H10K 50/15* (2023.01)
*H10K 50/16* (2023.01)
*H10K 101/10* (2023.01)

(52) U.S. Cl.
CPC ..... *H10K 85/6572* (2023.02); *H10K 85/6574* (2023.02); *H10K 50/11* (2023.02); *H10K 50/15* (2023.02); *H10K 50/16* (2023.02); *H10K 2101/10* (2023.02)

(56) References Cited

FOREIGN PATENT DOCUMENTS

| | | | |
|---|---|---|---|
| CN | 107507921 | A | 12/2017 |
| JP | 2009094124 | A | 4/2009 |

* cited by examiner

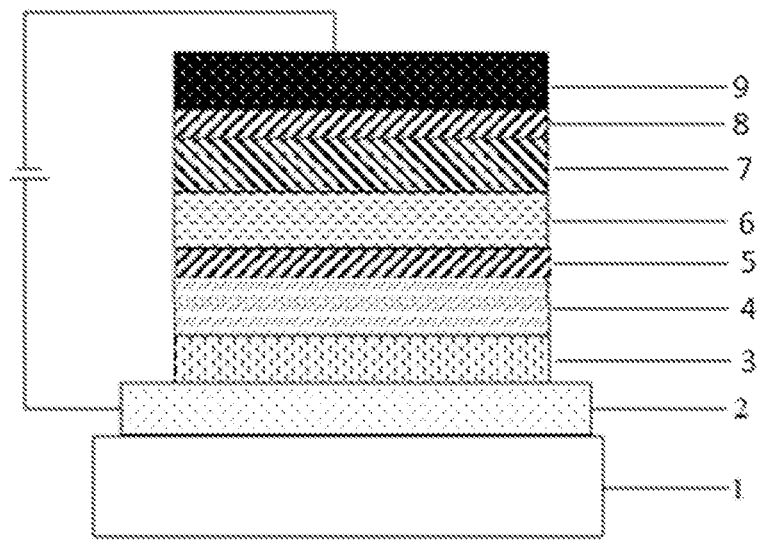

BORON-CONTAINING ORGANIC LIGHT-EMITTING DIODE DEVICE AND PREPARATION METHOD THEREOF

CROSS REFERENCE TO THE RELATED APPLICATIONS

This application is the national phase entry of International Application No. PCT/CN2018/107220, filed on Sep. 25, 2018, which is based upon and claims priority to Chinese Patent Application No. 201710909661.X, filed on Sep. 29, 2017, the entire contents of which are incorporated herein by reference.

TECHNICAL FIELD

The present invention relates to the technical field of semiconductors, in particular to an application of a boron-containing organic compound as a light-emitting layer doping material to an organic light-emitting diodes and a device fabricating method.

BACKGROUND

Organic light-emitting diode (OLED, Organic Light-Emitting Diode) device technology can be used to fabricate not only a novel display product but also a novel lighting product. It is expected to replace the existing liquid crystal display and fluorescent lamp lighting, and has a promising application prospect. The OLED device is of a sandwich structure, and includes an electrode material film layer and organic functional materials sandwiched between different electrode film layers, and various functional materials are overlapped with one another according to purposes so as to together form an OLED device. Positive and negative charges in the organic functional material film layer are acted by the electric field and then combined in the light-emitting layer when the OLED device serves as a current device and a voltage is applied to electrodes at two ends of the OLED device, that is, the OLED electroluminescence is generated.

The application of organic light-emitting diodes (OLEDs) in large-area flat panel displays and lighting has aroused widespread concern in industry and academia. However, traditional organic fluorescent materials can only use the 25% singlet exciton formed by electrical excitation to emit light, and the internal quantum efficiency of the device is low (up to 25%). The external quantum efficiency is generally lower than 5%, which is still far from the efficiency of phosphorescent devices. Although the phosphorescent material enhances the intersystem crossing due to the strong spin-orbit coupling at the center of the heavy atom, singlet excitons and triplet excitons formed by electrical excitation can be effectively used to emit light, making the internal quantum efficiency of the device up to 100%. However, phosphorescent materials are expensive, have poor material stability, and have serious device efficiency roll-off, which limits their application in OLEDs. Thermally activated delayed fluorescence (TADF) materials are the third generation of organic light-emitting materials developed after organic fluorescent materials and organic phosphorescent materials. Such materials generally have a small singlet-triplet energy gap ($\Delta EST$), and triplet excitons can be converted into singlet excitons by reverse intersystem crossing to emit light. This can make full use of the singlet excitons and triplet excitons formed under electrical excitation, and the internal quantum efficiency of the device can reach 100%. Moreover, the materials have controllable structure, stable properties, low price and no need of precious metals, and can be broadly applied in the field of OLEDs.

Although theoretically the TADF materials can achieve 100% exciton utilization, there are actually the following problems: (1) The T1 and S1 states of the molecule are designed to have strong CT characteristics and a very small energy gap of the S1-T1 state. Although the high T1→S1 state exciton conversion rate can be achieved through the TADF process, it also causes low S1 state radiation transition rate, therefore, it is difficult to have (or achieve at the same time) both high exciton utilization and high fluorescence radiation efficiency; (2) Even though doped devices have been used to mitigate the quenching effect of T exciton concentration, most TADF material devices have a serious efficiency roll-off at high current densities.

As far as the actual demand of the current OLED display lighting industry is concerned, the current development of OLED materials is far from enough, lagging behind the requirements of panel manufacturing companies, and especially for TADF materials, obtaining high-efficiency and long lifetime devices is a problem for the commercial application of the materials.

SUMMARY

In response to the above problems in the prior art, the applicant provides an organic light-emitting diode device with a boron-containing compound as a light-emitting layer doping material and a preparation method thereof, thereby improving the efficiency and lifetime of the device and meeting the requirements of panel manufacturing enterprises.

The Technical Solutions of the Present Invention are as Follows:

An organic light-emitting diode device with a structure at least comprising: a substrate layer, an anode layer, a light-emitting layer and a cathode layer, wherein preferably, the structure further comprising: an anode, a hole injection/transport layer, a light-emitting layer, an electron injection/transport layer and a cathode;

the light-emitting layer comprises a host material and a doping material; the doping material is an boron-containing organic compound with a singlet-triplet energy gap of not more than 0.2 eV and a spectral FWHM (Full Width at Half Maximum) of not more than 120 nm; meanwhile, the singlet and triplet energy levels of the host material are both higher than those of the doping material; the energy gap between the lowest singlet energy level and the lowest triplet energy level of the host material is less than or equal to 0.2 eV; the lowest triplet energy level of the host material is greater than or equal to the lowest singlet energy level of the doping material.

Preferably, the singlet-triplet energy gap of the boron-containing organic compound is not greater than 0.1 eV.

Preferably, the triplet energy level in the film phase state of the host material with the lowest energy is greater than the triplet energy level of the doping material by 0.1 eV or more.

Preferably, the singlet-triplet energy gap in the film phase state of the host material with the lowest energy is not more than 0.15 eV.

Preferably, the host material of the light-emitting layer is composed of a single material, and the doping material of the light-emitting layer has a mass doping concentration of 0.5% to 30%; more preferably, the doping material of the light-emitting layer has a mass doping concentration of 3% to 30%. More preferably, the doping material of the light-emitting layer has a mass doping concentration of 5% to 15%.

Alternatively, the host material of the light-emitting layer is composed of a mixture of two materials with different structures, and the doping material of the light-emitting layer has a mass doping concentration of 0.5% to 30%. Preferably, the doping material of the light-emitting layer has a mass doping concentration of 3% to 30%. More preferably, the doping material of the light-emitting layer has a mass doping concentration of 5% to 15%.

The boron-containing organic compound takes the boron element as the core to bond with other groups by way of sp2 hybrid orbital; the other groups connected to boron are hydrogen atom, substituted or unsubstituted cycloalkyl with 3 to 10 carbon atoms, substituted or unsubstituted heterocycloalkyl with 1 to 10 carbon atoms, substituted or unsubstituted aryl with 6 to 60 carbon atoms, or substituted or unsubstituted heteroaryl with 5 to 60 carbon atoms; and the other groups connected to boron are connected individually, or are directly bonded to each other to form a ring or connected through other groups to form a ring before being connected to boron.

Preferably, in the boron-containing organic compound, the group connected to boron is substituted or unsubstituted phenyl, substituted or unsubstituted biphenyl, substituted or unsubstituted terphenyl, substituted or unsubstituted pyrimidinyl, substituted or unsubstituted pyridyl, substituted or unsubstituted naphthyl, substituted or unsubstituted anthryl, substituted or unsubstituted phenanthrenyl, substituted or unsubstituted triazinyl, substituted or unsubstituted quinolinyl, substituted or unsubstituted dibenzofuranyl, substituted or unsubstituted dibenzothienyl, substituted or unsubstituted 9,9-dimethylfluorenyl, substituted or unsubstituted 9,9-diphenylfluorenyl, substituted or unsubstituted carbazolyl, substituted or unsubstituted benzocarbazolyl, substituted or unsubstituted thienyl, substituted or unsubstituted benzothienyl, substituted or unsubstituted furanyl, substituted or unsubstituted benzofuranyl, substituted or unsubstituted benzimidazolyl, substituted or unsubstituted acridinyl, substituted or unsubstituted phenoxazinyl, or substituted or unsubstituted phenothiazinyl; and the groups connected with boron are connected individually, or are directly bonded to each other to form a ring or connected through other groups to form a ring before being connected to boron.

Preferably, the boron-containing organic compound is represented by formula (1):

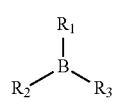

formula (1)

wherein $R_1$, $R_2$, and $R_3$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_1$, $R_2$, and $R_3$ do not simultaneously represent hydrogen atom.

Preferably, the boron-containing organic compound is represented by formula (2):

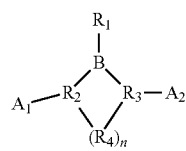

formula (2)

wherein $R_1$, $R_2$, $R_3$, $A_1$ and $A_2$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_1$, $R_2$, and $R_3$ do not simultaneously represent hydrogen atom;

in formula (2), n is equal to 0 or 1;

when n is equal to 0, $R_2$ and $R_3$ are bonded to each other to form a ring;

when n is equal to 1, $R_4$ independently represents oxygen atom, sulfur atom, boron atom substituted by alkyl or aryl, alkylene substituted by linear or branched alkyl with 1 to 10 carbon atoms, alkylene substituted by aryl, imino substituted by alkyl, imino substituted by aryl, substituted or unsubstituted arylene with 6 to 60 carbon atoms, or substituted or unsubstituted heteroarylene with 5 to 60 carbon atoms.

Preferably, the boron-containing organic compound is represented by formula (3):

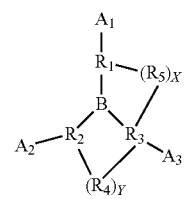

formula (3)

wherein $R_1$, $R_2$, $R_3$, $A_1$, $A_2$, and $A_3$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_1$, $R_2$, and $R_3$ do not simultaneously represent hydrogen atom;

in formula (3), X and Y are independently equal to 0 or 1;

when X and Y are independently equal to 0, $R_2$ and $R_3$ are bonded to each other to form a ring, and $R_1$ and $R_3$ are bonded to each other to form a ring;

when X and Y are independently equal to 1, $R_4$ and $R_5$ independently represent oxygen atom, sulfur atom, boron atom substituted by alkyl or aryl, alkylene substituted by linear or branched alkyl with 1 to 10 carbon atoms, alkylene substituted by aryl, imino substituted by alkyl, imino substituted by aryl, substituted or unsubstituted arylene with 6 to 60 carbon atoms, or substituted or unsubstituted heteroarylene with 5 to 60 carbon atoms.

Preferably, the boron-containing organic compound is represented by formula (4):

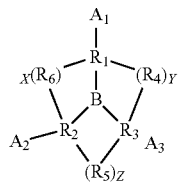

formula (4)

wherein $R_1$, $R_2$, $R_3$, $A_1$, $A_2$, and $A_3$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_1$, $R_2$, and $R_3$ do not simultaneously represent hydrogen atom;

in formula (4), X, Y and Z are independently equal to 0 or 1;

when X, Y and Z are independently equal to 0, $R_2$ and $R_3$ are bonded to each other to form a ring, $R_1$ and $R_3$ are bonded to each other to form a ring, and $R_1$ and $R_2$ are bonded to each other to form a ring;

when X, Y and Z are independently equal to 1, $R_4$, $R_5$ and $R_6$ independently represent oxygen atom, sulfur atom, boron atom substituted by alkyl or aryl, alkylene substituted by linear or branched al with 1 to 10 carbon atoms, alkylene substituted by aryl, imino substituted by alkyl, imino substituted by aryl, substituted or unsubstituted arylene with 6 to 60 carbon atoms, or substituted or unsubstituted heteroarylene with 5 to 60 carbon atoms.

Preferably, the boron-containing organic compound is represented by formula (5):

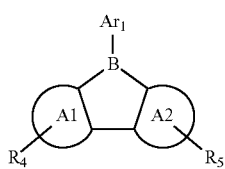

formula (5)

wherein $Ar_1$, A1, and A2 independently represent substituted or unsubstituted aryl with 6 to 60 carbon atoms or substituted or unsubstituted heteroaryl with 2 to 60 carbon atoms; $R_4$ and $R_5$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_4$ and $R_5$ do not simultaneously represent hydrogen atom.

Preferably, the boron-containing organic compound is represented by formula (6):

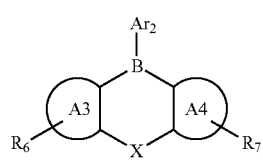

formula (6)

wherein $Ar_2$, A3, and A4 independently represent substituted or unsubstituted aryl with 6 to 60 carbon atoms or substituted or unsubstituted heteroaryl with 5 to 60 carbon atoms; $R_6$ and $R_7$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_6$ and $R_7$ do not simultaneously represent hydrogen atom.

X represents oxygen atom, sulfur atom, boron atom substituted by alkyl or aryl, alkylene substituted by a linear alkyl with 1 to 10 carbon atoms, alkylene substituted by branched alkyl with 1 to 10 carbon atoms, alkylene substituted by aryl, imino substituted by alkyl, or imino substituted by aryl.

Preferably, in formula (5) and formula (6), $Ar_1$, $Ar_2$, A1, A2, A3, and A4 independently represent substituted or unsubstituted phenyl, substituted or unsubstituted biphenyl, substituted or unsubstituted terphenyl, substituted or unsubstituted pyrimidine, substituted or unsubstituted pyridyl, substituted or unsubstituted naphthyl, substituted or unsubstituted anthryl, substituted or unsubstituted phenanthryl, substituted or unsubstituted triazinyl, substituted or unsubstituted quinolinyl, substituted or unsubstituted dibenzofuranyl, substituted or unsubstituted dibenzothienyl, substituted or unsubstituted 9,9-dimethylfluorenyl, substituted or unsubstituted 9,9-diphenyl Fluorenyl, substituted or unsubstituted carbazolyl, substituted or unsubstituted benzocarbazolyl, substituted or unsubstituted thienyl, substituted or unsubstituted benzothienyl, substituted or unsubstituted furanyl, substituted or unsubstituted benzofuranyl, substituted or unsubstituted benzimidazolyl, substituted or unsubstituted acridinyl, substituted or unsubstituted phenoxazinyl, or substituted or unsubstituted phenothiazinyl.

Preferably, in formula (5) and formula (6), $R_4$, $R_5$, $R_6$ and $R_7$ independently represent formula (7), (8) or (9):

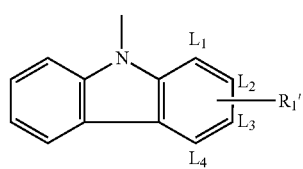

formula (7)

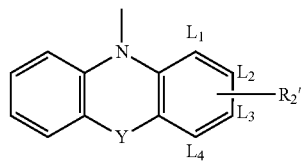

formula (8)

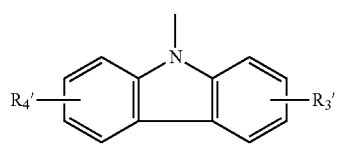

formula (9)

wherein $R_1'$ and $R_2'$ independently represents hydrogen atom or a structure of formula (10);

formula (10)

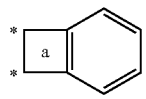

in formula (10), a is

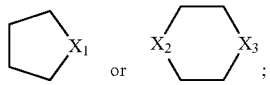

$X_1$, $X_2$, and $X_3$ independently represent oxygen atom, sulfur atom, selenium atom, alkylene substituted by linear or branched alkyl with 1 to 10 carbon atoms, alkylene substituted by aryl, imino substituted by alkyl, or imino substituted by aryl;

formula (10) is connected to formula (7) or formula (8) through $CL_1$-$CL_2$ bond, $CL_2$-$CL_3$ bond, or $CL_3$-$CL_4$ bond;

$R_3'$ and $R_4'$ independently represent hydrogen atom, cycloalkyl or heteroalkyl with 3 to 10 carbon atoms, substituted or unsubstituted phenyl, substituted or unsubstituted naphthyl, substituted or unsubstituted pyrimidinyl, substituted or unsubstituted carbazolyl, substituted or unsubstituted dibenzofuranyl, substituted or unsubstituted 9,9-dimethylfluorenyl, substituted or unsubstituted dibenzothienyl, substituted or unsubstituted N-phenylcarbazolyl, or substituted or unsubstituted arylamino;

Y represents oxygen atom, sulfur atom, alkylene substituted by linear alkyl with 1 to 10 carbon atoms, alkylene substituted by branched alkyl with 1 to 10 carbon atoms, alkylene substituted by aryl, imino substituted by alkyl, or imino substituted by aryl.

As the doping material, the boron-containing organic compound provided by the present application emits a blue, green, yellow or red light.

In the organic light-emitting diode device provided by the present application, the host material is one or more of ketone, pyridine, pyrimidine, pyrazine, triazine, carbazole, fluorene, quinoline, furan, thiophene, imidazole, and acridine compounds.

The organic light-emitting diode device provided by the present application further comprises a hole injection/transport layer, and the hole injection/transport layer comprises one or more of a hole injection layer, a hole transport layer, a buffer layer, and an electron block layer.

Preferably, the material of the hole injection layer is represented by the following structural formula (1b), (2b) or (3b):

formula (1b)

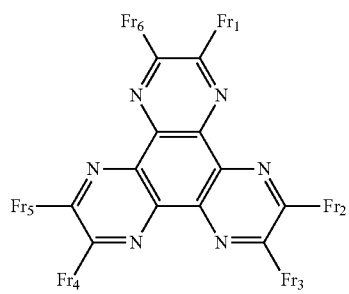

formula (2b)

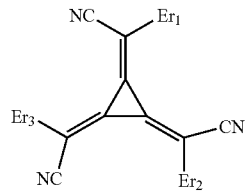

formula (3b)

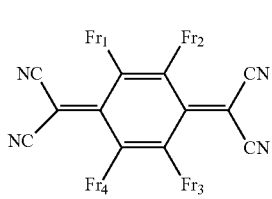

wherein, in formula (2b), $Er_1$ to $Er_3$ independently represent substituted or unsubstituted aryl with 6 to 60 carbon atoms or substituted or unsubstituted heteroaryl with 5 to 60 carbon atoms; $Er_1$ to $Er_3$ are identical or different;

wherein, in formula (1b) and formula (3b), $Fr_1$ to $Fr_6$ independently represent hydrogen atom, nitrile group, halogen, amide group, alkoxy, ester group, nitro group, carbon atom substituted by linear or branched alkyl with 1 to 60 carbon atoms, substituted or unsubstituted aryl with 6 to 60 carbon atoms, or substituted or unsubstituted heteroaryl with 5 to 60 carbon atoms.

Preferably, the material of the hole transport layer is one of carbazole, fluorene, pyrazoline, furan, thiophene, xanthene, dimethylanthracene, and triarylamine compounds.

In the organic light-emitting diode device provided by the present application, the electron injection/transport layer comprises one or more of an electron injection layer, an electron transport layer, and a hole block layer. Preferably, the material of the electron injection layer is a compound containing lithium or cesium. Preferably, the material of the electron transport layer is one of pyrimidines, pyridines, naphthalenes, anthracenes, phenanthrenes, triazines, quinolines, dibenzofurans, dibenzothiophenes, fluorenes, spirofluorenes, benzothiophenes, benzofurans, and benzimidazolyl compounds. In the organic light-emitting diode device provided by the present application, the anode is made of inorganic material or organic conductive polymer material; the inorganic material is metal oxide, or is gold, copper, or silver; and the cathode is made of lithium, magnesium, calcium, strontium, aluminum, ytterbium, or indium, or their alloys with copper, gold, or silver, or metal and metal fluoride are alternated to form an electrode layer.

Preferably, the metal oxide is indium tin oxide, indium zinc oxide or indium gallium zinc oxide.

Preferably, the organic conductive polymer is one or more of polyimide, polyethylene, polypropylene, polystyrene, polyaniline, polythiophene, polyvinylbenzenesulfonic acid, and polyethylene terephthalate.

Preferably, the material of the cathode is an alloy of magnesium and silver in a ratio of 1:99-99:1. Preferably, the material of the cathode is laminated lithium fluoride and aluminum layer, wherein the aluminum layer is the outermost layer of the organic light-emitting diode device.

Further, in the organic light-emitting diode device, the boron-containing compound is one of the following structural formulas:
B-1
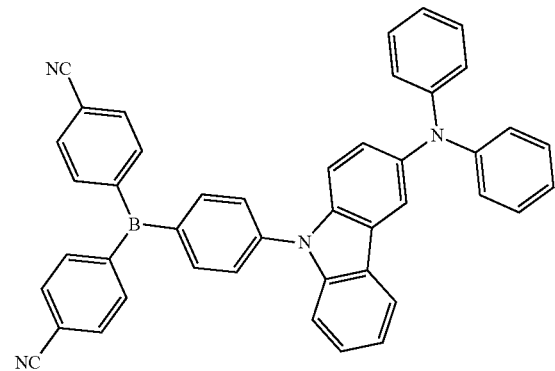
B-4
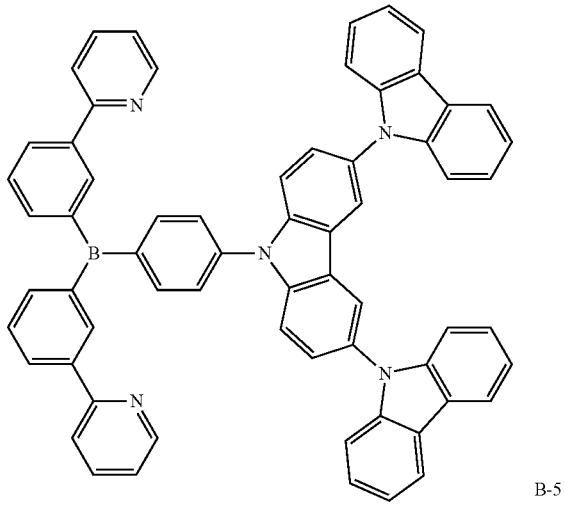
B-2
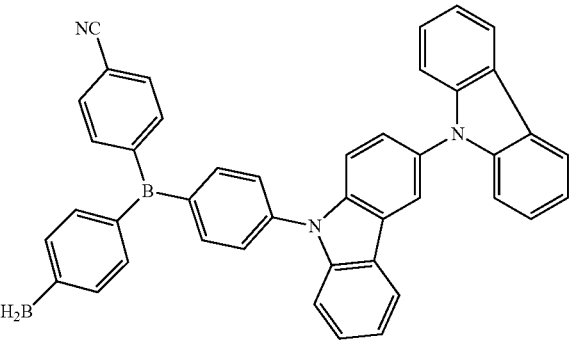
B-5
B-6
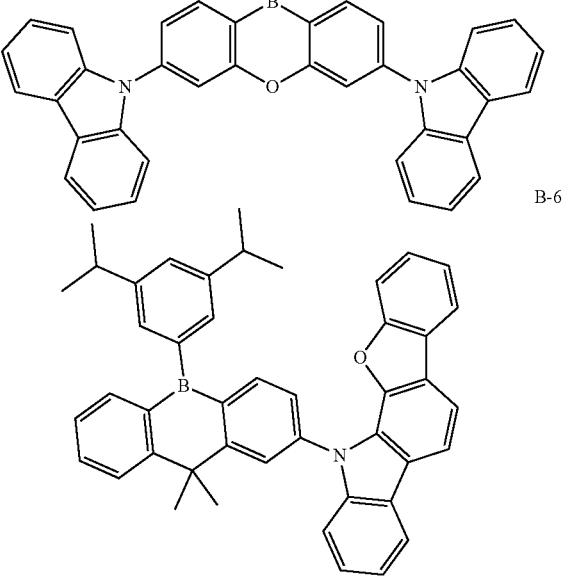
B-3
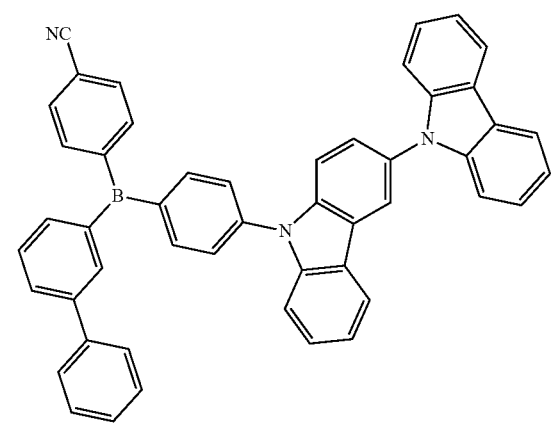
B-7
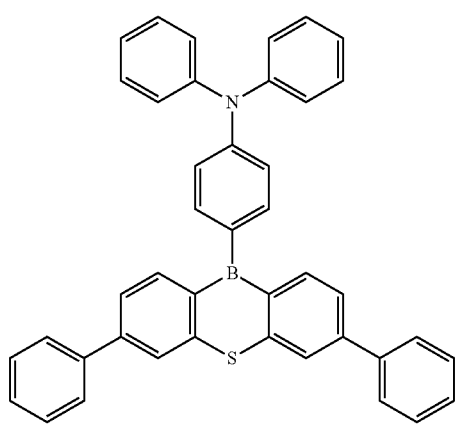

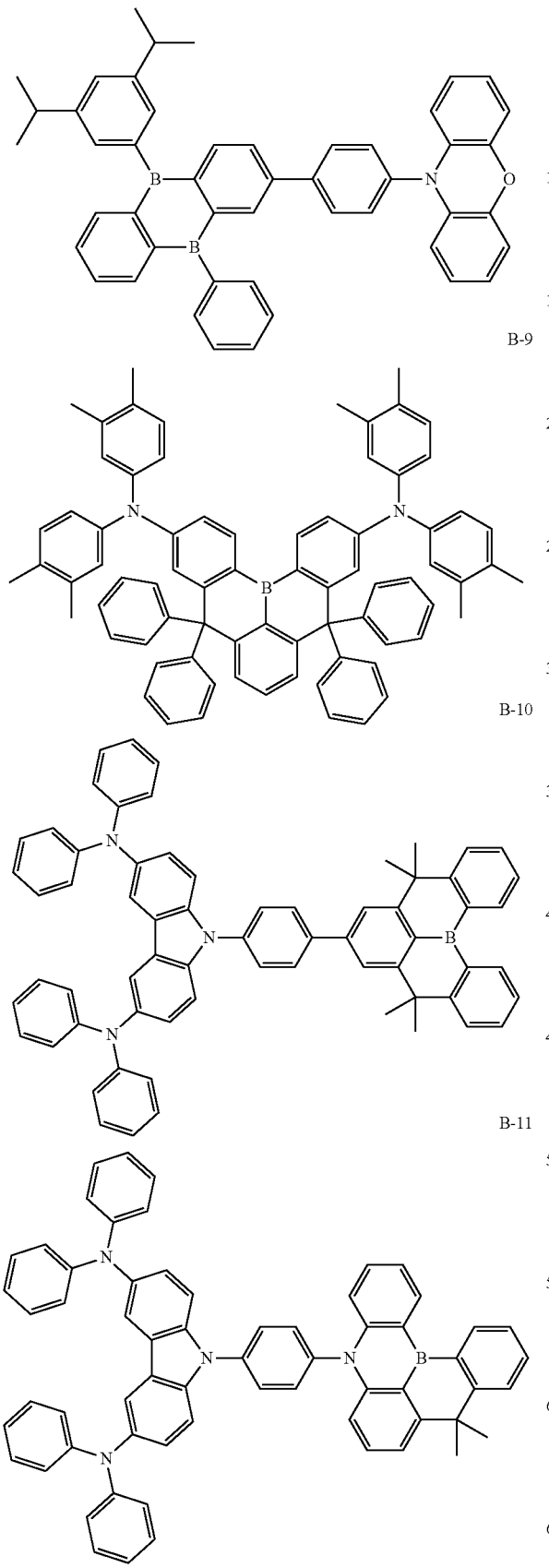
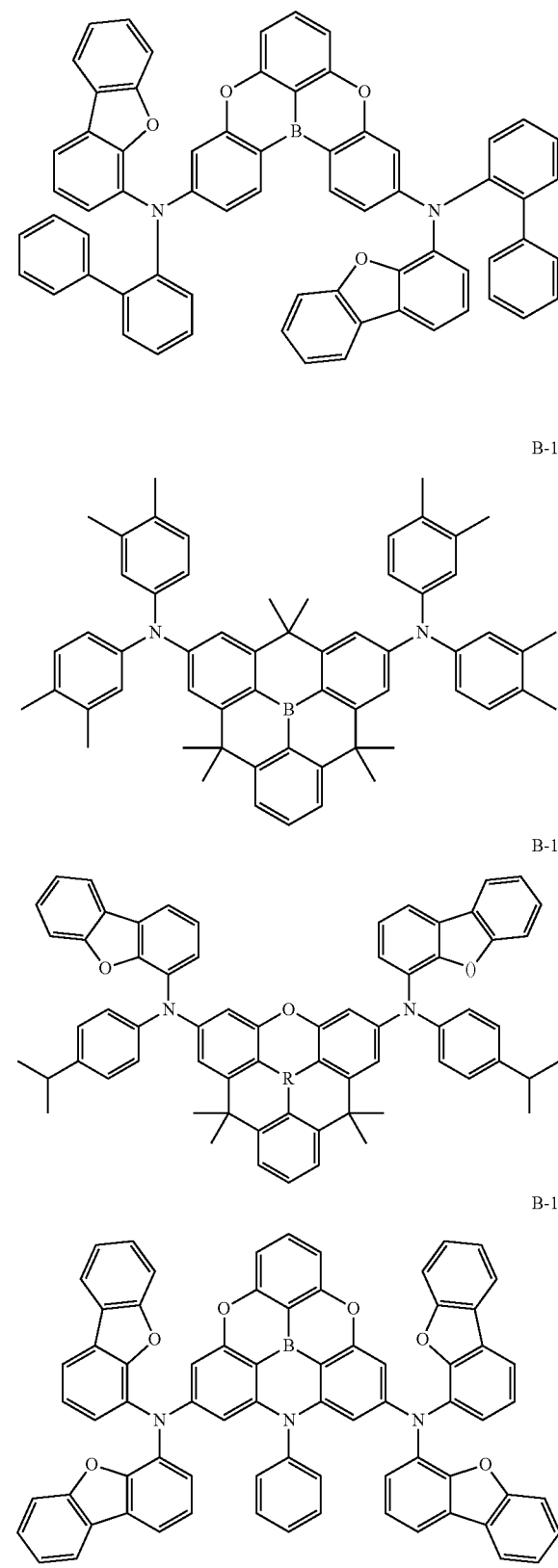

B-16
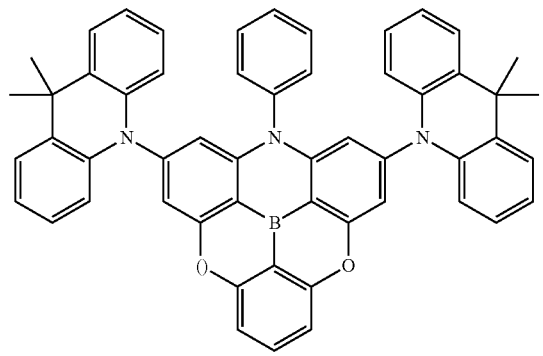
B-17
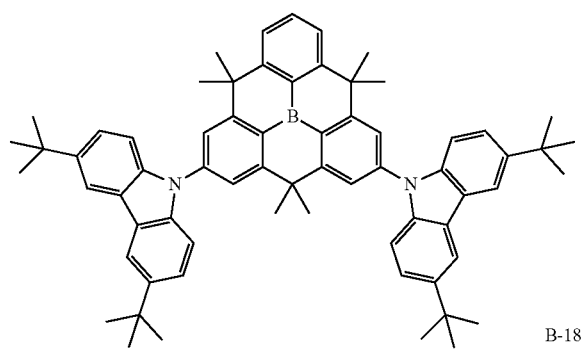
B-18
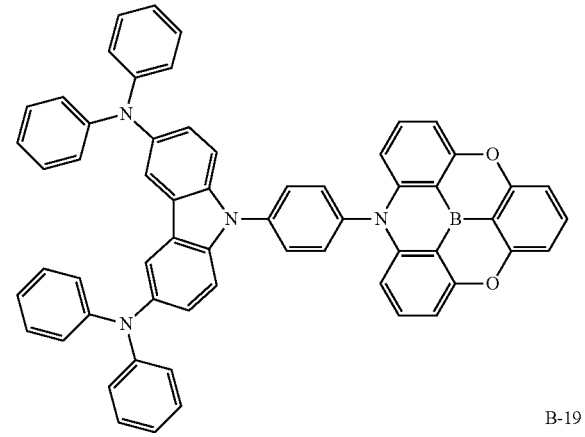
B-19
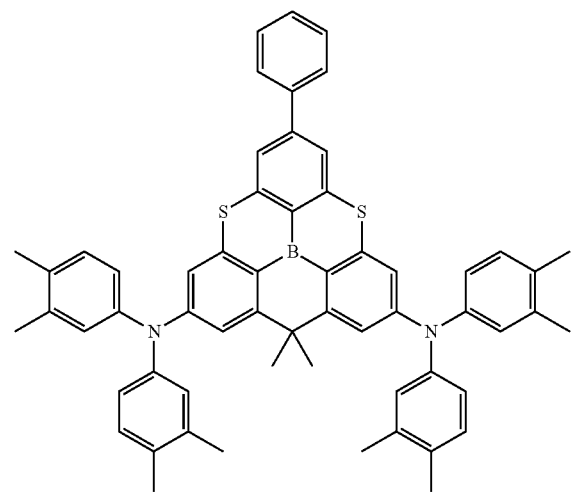
B-20
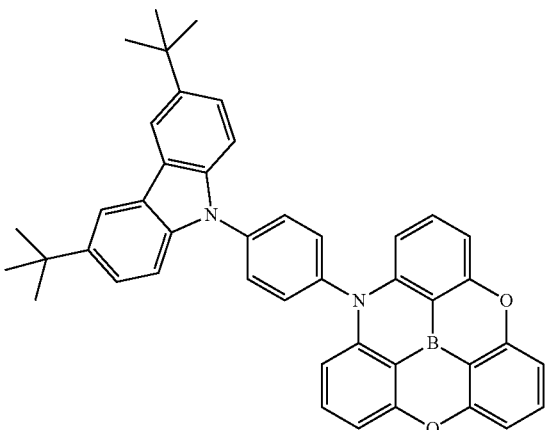
B-21
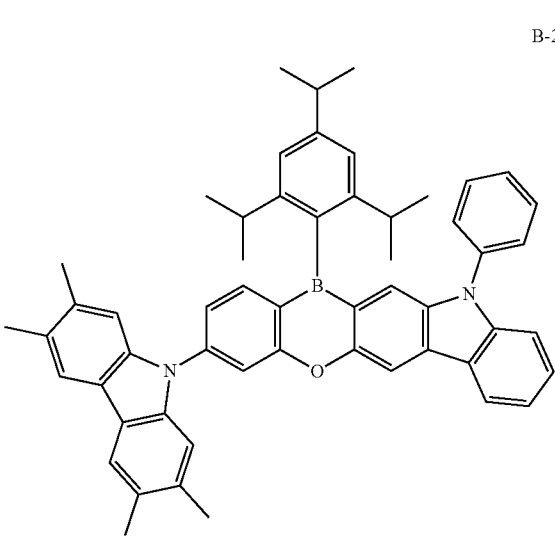
B-22
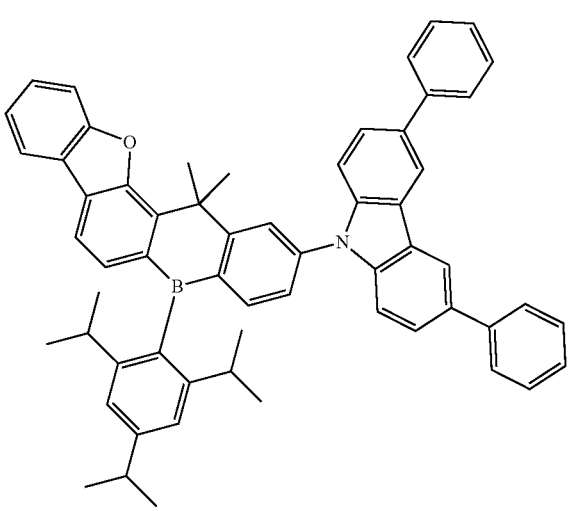

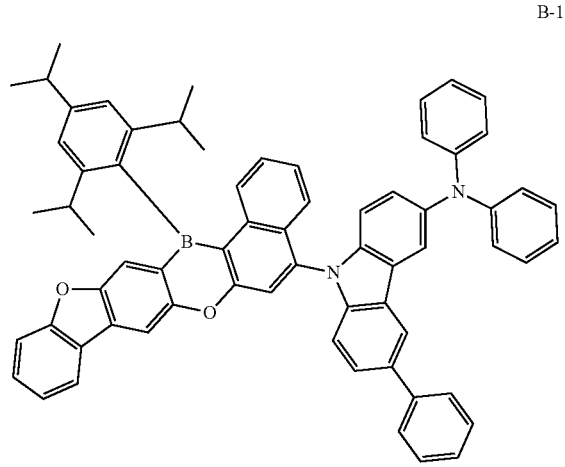
B-13
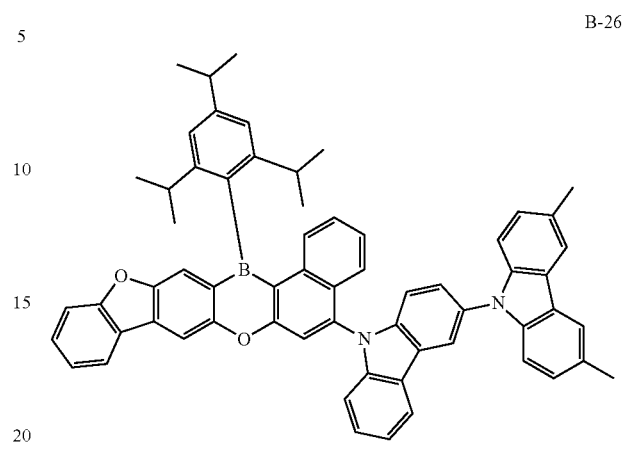
B-26
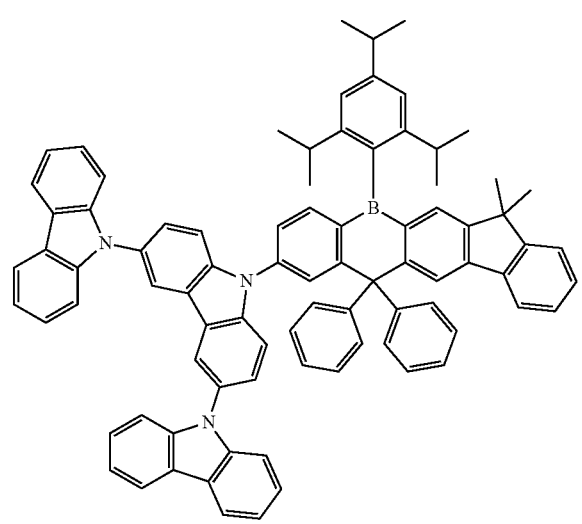
B-24
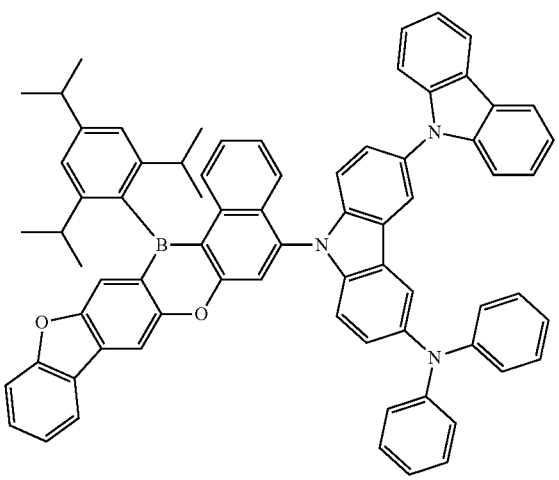
B-27
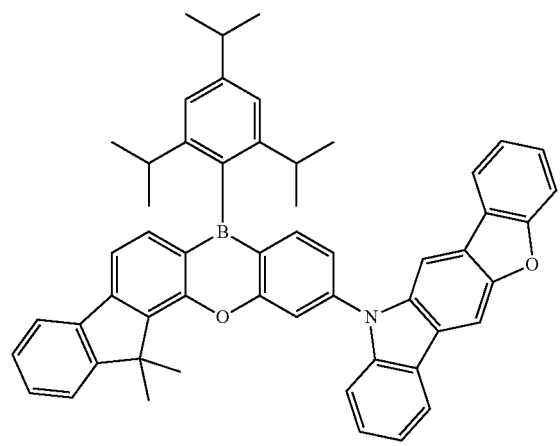
B-25
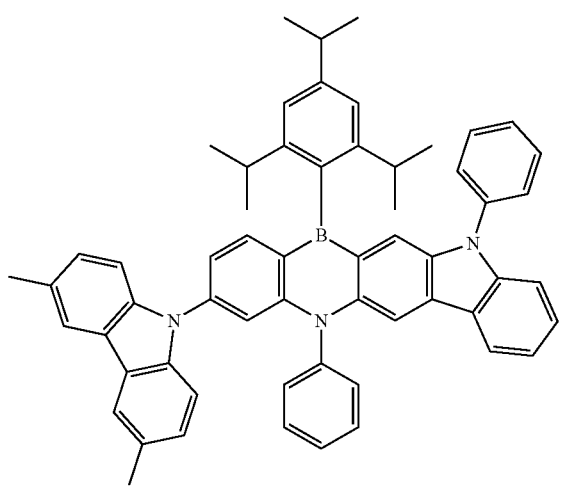
B-28

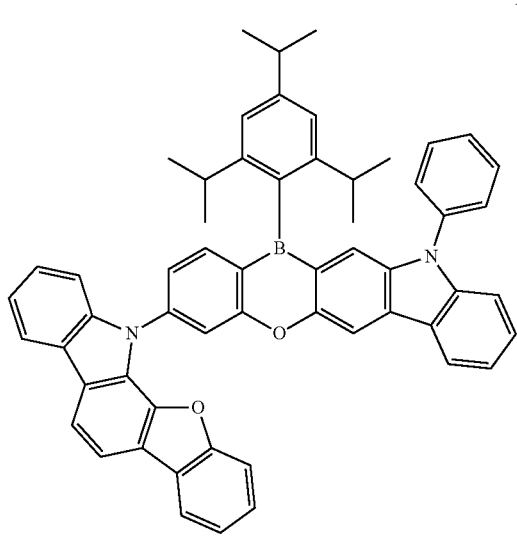
B-29
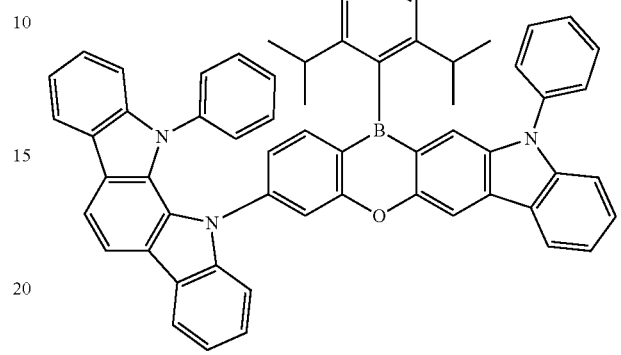
B-32
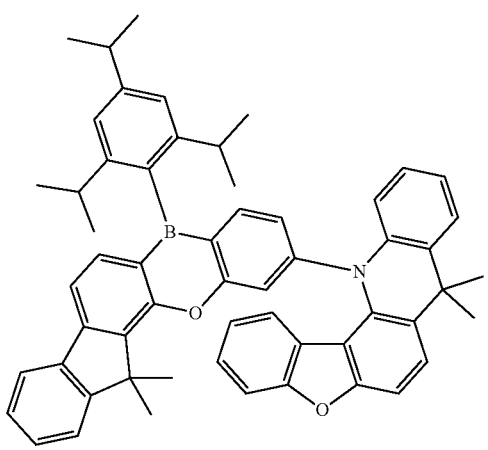
B-30
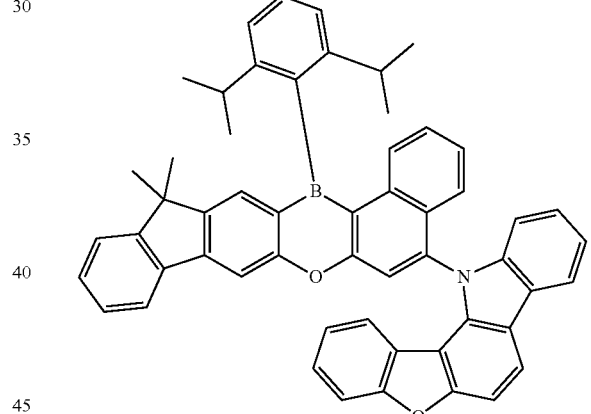
B-33
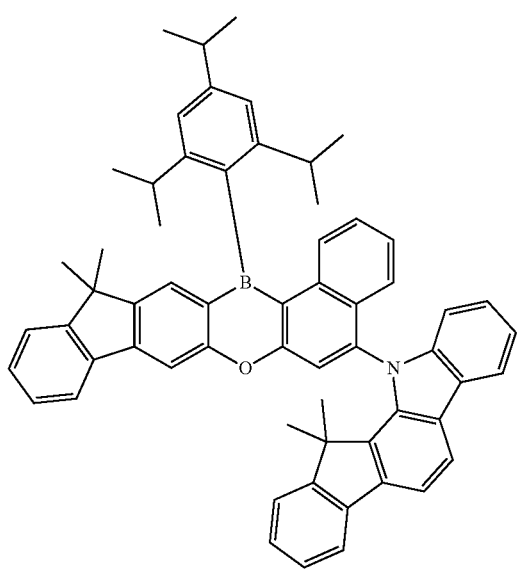
B-31
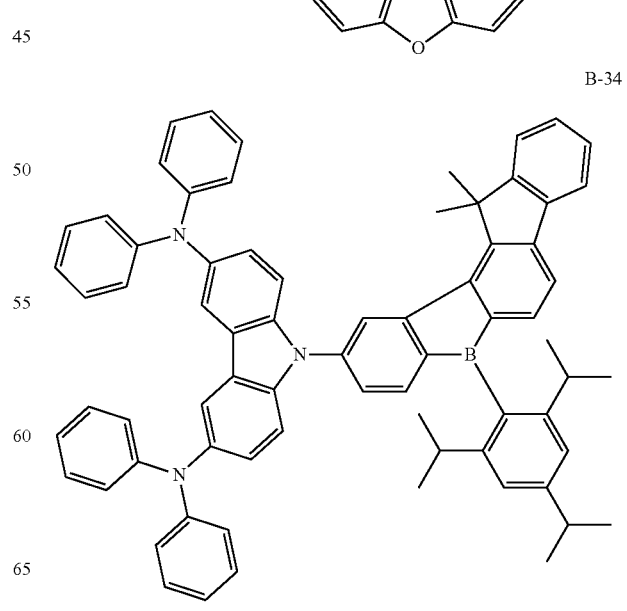
B-34

B-35
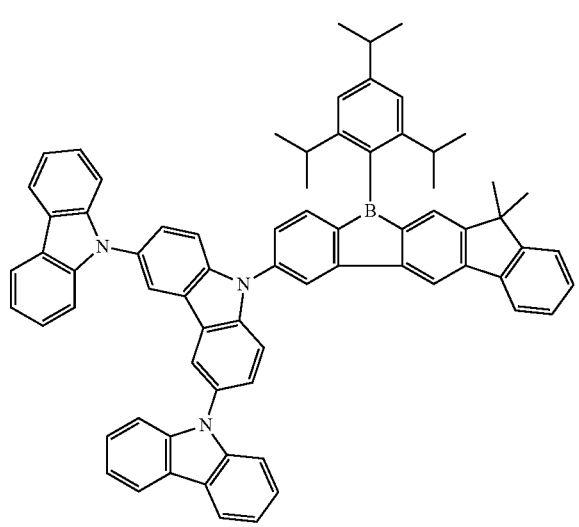
B-36
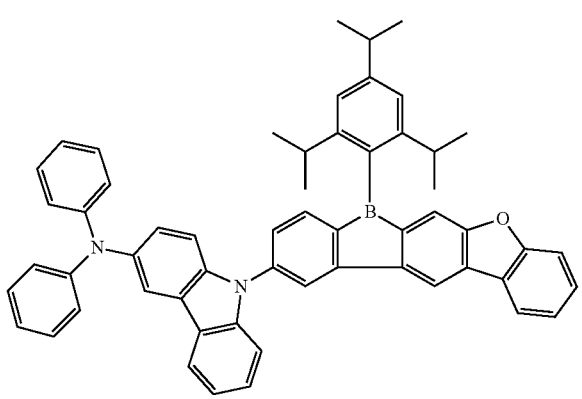
B-37
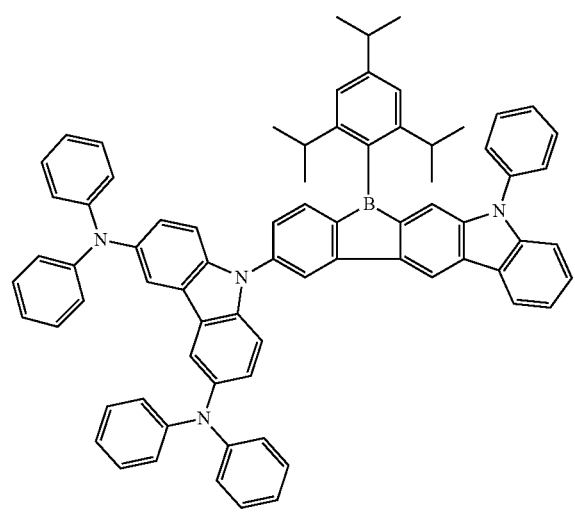
B-38
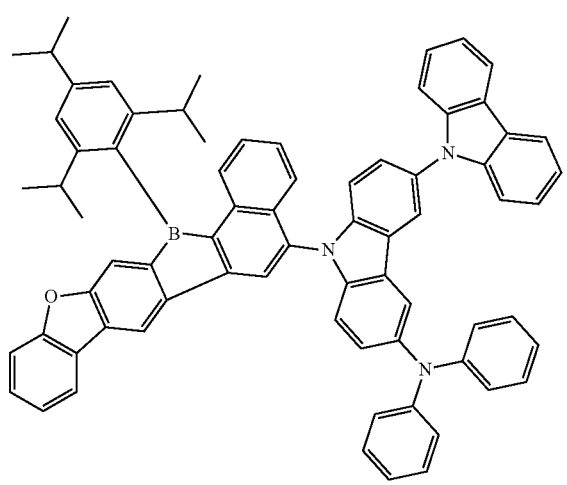
B-39
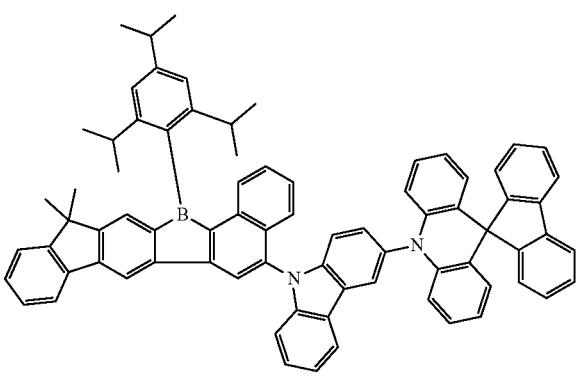
B-40
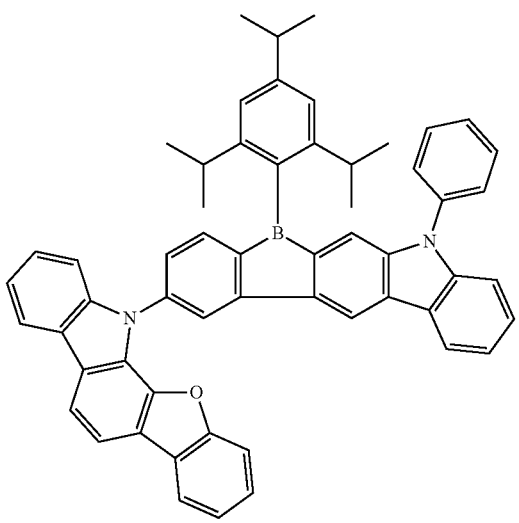

B-41
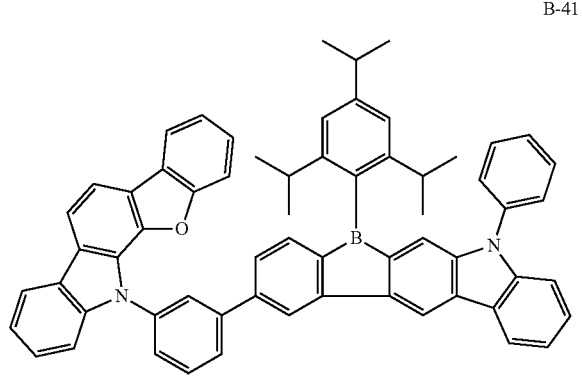
B-42
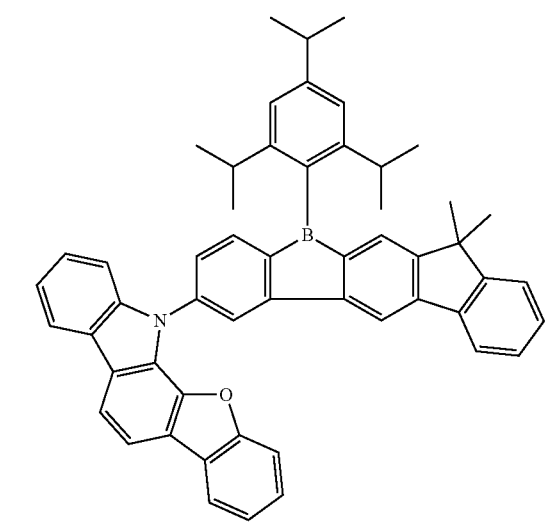
B-43
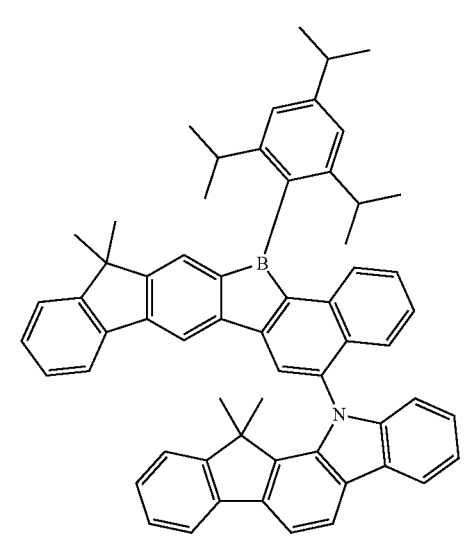
B-44
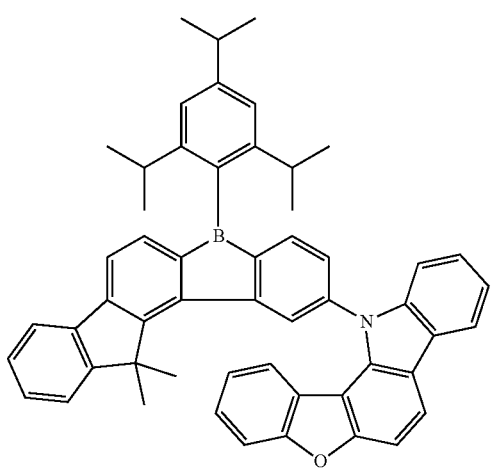
B-45
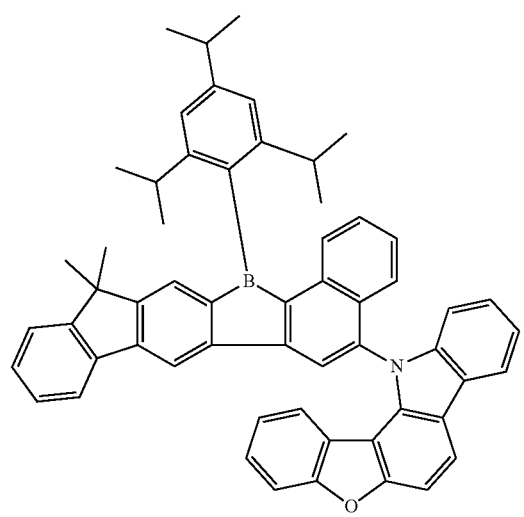
B-46
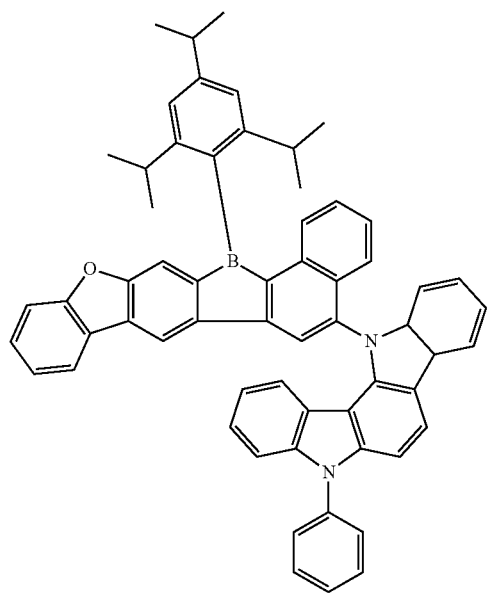

B-47

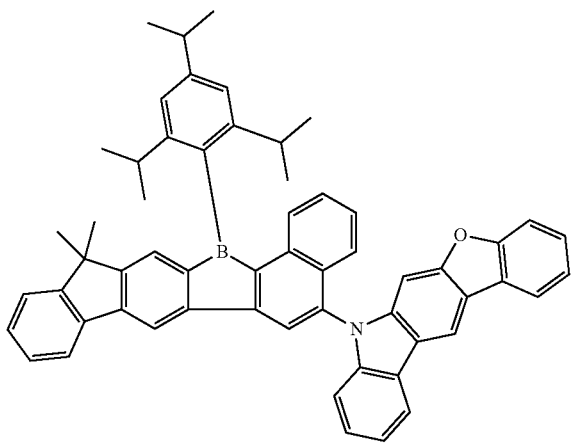

B-48

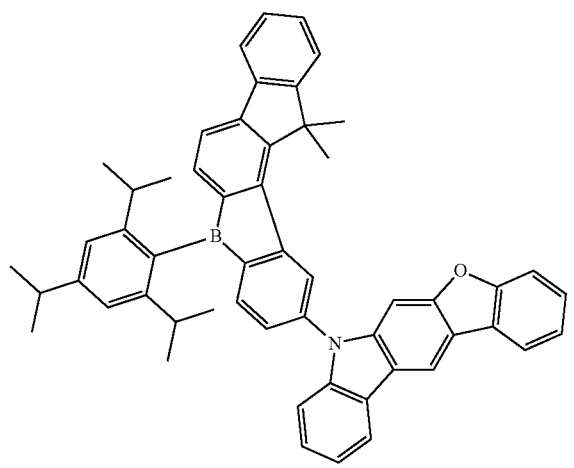

B-49

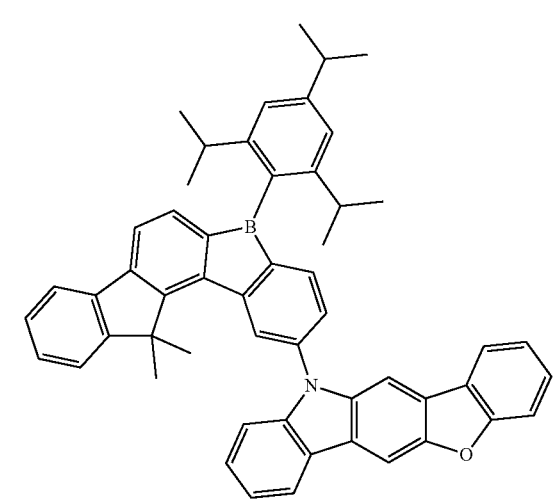

B-50

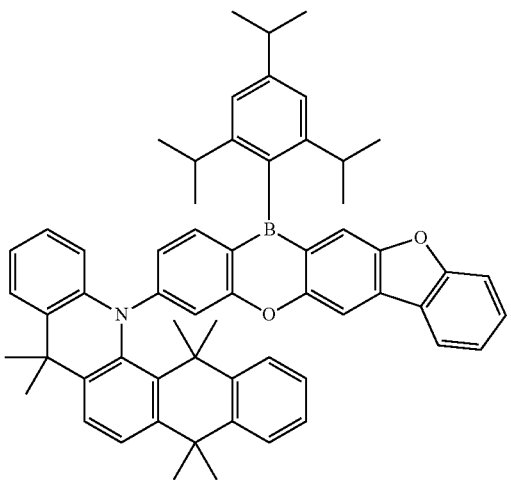

B-51

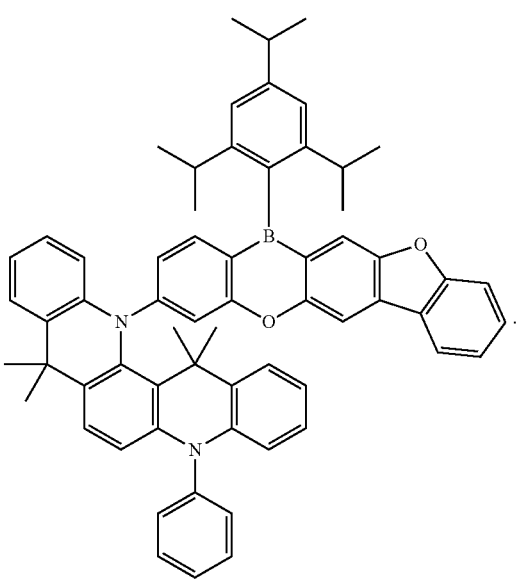

Based on the boron-containing compound of the above structure, the bonding with other atoms is performed through the sp2 hybrid form of boron. In the resulting structure, since boron is an electron-deficient atom, it can form a charge transfer state or reverse space resonance with an electron donating group or a weak electron withdrawing group. The charge transfer state or reverse space resonance effect leads to the separation of the HOMO and LUMO orbits distribution, and the singlet-triplet energy gap of the material is reduced, resulting in delayed fluorescence and improving device efficiency.

Based on the boron-containing compound of the above structure, due to the strong electron-withdrawing ability of boron atom, the material formed with boron atom as the core can obtain a very small singlet-triplet energy gap, and moreover because of its faster fluorescence radiation rate, the delayed fluorescence lifetime of the material can be effectively reduced, thereby reducing the triplet quenching effect of the material and improving device efficiency.

The test data of boron-containing materials B-1, B-6, B-10, B-15, B-20, B-25, B-30, B-34, B-38, B-40 are used to characterize the singlet-triplet energy gap, transient radiation rate and delayed fluorescence lifetime of the materials and indicate the material properties of the boron-containing compounds of the above structure, as shown in Table 1.

TABLE 1

| Name of material | HOMO/LUMO overlap degree | Est (eV) | Transient radiation rate (S-1) | Delayed fluorescence lifetime (us) |
|---|---|---|---|---|
| B-1 | 0.10 | 0.12 | 5.5*E7 | 10.8 |
| B-6 | 0.13 | 0.15 | 6.0*E7 | 15.8 |
| B-10 | 0.08 | 0.07 | 6.2*E7 | 1.2 |
| B-15 | 0.04 | 0.08 | 4.3*E7 | 1.0 |
| B-20 | 0.14 | 0.10 | 6.0*E7 | 5.4 |
| B-25 | 0.20 | 0.20 | 7.3*E7 | 35.2 |
| B-30 | 0.04 | 0.08 | 5.8*E7 | 1.8 |
| B-34 | 0.30 | 0.19 | 5.0*E6 | 60.5 |
| B-38 | 0.28 | 0.14 | 5.5*E7 | 50.5 |
| B-40 | 0.17 | 0.15 | 1.0*E7 | 30.5 |

Note:
HOMO/LUMO overlap degree is calculated by ORCA quantum chemistry software, using the DFT of B3LYP and the base set of PBE0.

Based on the boron-containing compound of the above structure, the bond formed by the connection with boron has good bond energy stability. The excited-state compound formed by the material receiving electrical excitation has a lower energy than the bond energy formed by the connection with boron, so the chemical stability of the material is improved; moreover, because its molecules have a relatively parallel stacking structure, the stacking between the molecules is relatively tight, so that the glass transition temperature of the material is increased.

The bond energy stability, thermal stability, and spectral FWHM of the materials are characterized through the test data of materials B-1, B-6, B-10, B-1, B-20, B-25, B-30, B-34, B-38, and B-40, as shown in Table 2.

TABLE 2

| Name of material | Excited-state S1 energy (eV) | Boron-X bond energy (eV) | Glass transition temperature (° C.) | Decomposition temperature (° C.) (5%) | Spectral FWHM |
|---|---|---|---|---|---|
| B-1 | 2.61 | 2.84 | 112 | 380 | 60 nm |
| B-6 | 2.50 | 2.80 | 118 | 390 | 70 nm |
| B-10 | 2.65 | 2.79 | 109 | 401 | 55 nm |
| B-15 | 2.86 | 2.92 | 114 | 392 | 60 nm |
| B-20 | 2.92 | 3.00 | 120 | 410 | 62 nm |
| B-25 | 2.70 | 2.95 | 110 | 398 | 58 nm |
| B-30 | 2.48 | 2.82 | 114 | 401 | 62 nm |
| B-34 | 2.32 | 2.78 | 125 | 414 | 62 nm |
| B-38 | 2.90 | 3.08 | 113 | 401 | 48 nm |
| B-40 | 2.35 | 2.90 | 128 | 418 | 56 nm |

Based on the boron-containing compound of the above structure, the compound with a ring structure formed by boron atom has strong rigidity, the excited-state configuration formed when the material is excited is stable, and the conformational relaxation hardly occurs; its conformational reorganization energy is low, resulting in a narrower FWHM of the luminescent spectrum. The narrower FWHIM can effectively prevent color changes caused by different declination angles of sight axis, and can effectively use the spectral energy to improve the color purity of a device.

It can be found that the boron-containing compound of the above structure has a narrower spectral FWHM, which is close to the general traditional fluorescent materials, but much narrower than the current FWHM (about 100 nm) of the delayed fluorescent material, indicating that such compounds has higher color purity and luminous efficiency.

Further, the organic light-emitting diode device emits blue light with a wavelength of 440-480 nm;

Further, the organic light-emitting diode device emits green light with a wavelength of 480-540 nm;

Further, the organic light-emitting diode device emits yellow light with a wavelength of 540-590 nm;

Further, the organic light-emitting diode device emits red light with a wavelength of 590-640 nm;

Further, the host material of the organic light-emitting diode device can be represented by the following general formulas:

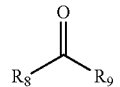

formula (1h)

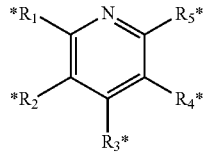

formula (2h)

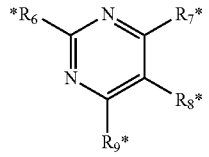

formula (3h)

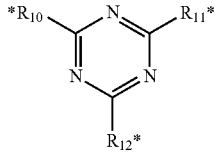

formula (4h)

formula (5h)

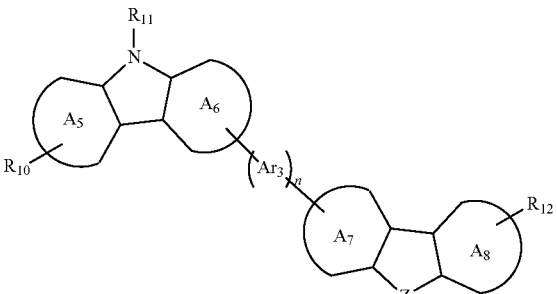

wherein $R_8$ to $R_{12}$ and $R_1{}^*$ to $R_{12}{}^*$ independently represent hydrogen atom, substituted or unsubstituted cycloalkyl with 3 to 10 carbon atoms, substituted or unsubstituted heterocycloalkyl with 1 to 10 carbon atoms, substituted or unsubstituted aryl with 6 to 60 carbon atoms, or substituted or unsubstituted heteroaryl with 2 to 60 carbon atoms; and $R_8$ and $R_9$ are bonded to form a ring or are not bonded to form a ring;

$Ar_3$ represents substituted or unsubstituted aryl with 6 to 60 carbon atoms or substituted or unsubstituted heteroaryl with 2 to 60 carbon atoms; n=0, 1 or 2;

Z represents oxygen atom, sulfur atom, alkylene substituted by linear alkyl with 1 to 10 carbon atoms, alkylene substituted by branched alkyl with 1 to 10 carbon atoms, alkylene substituted by aryl, alkyl substituted by aryl or tertiary amino substituted by aryl.

Further, the host material of the organic light-emitting diode device may be of one or more of the following structures;
H1
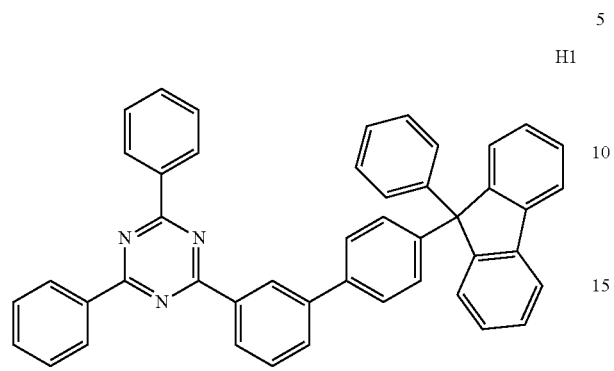
H2
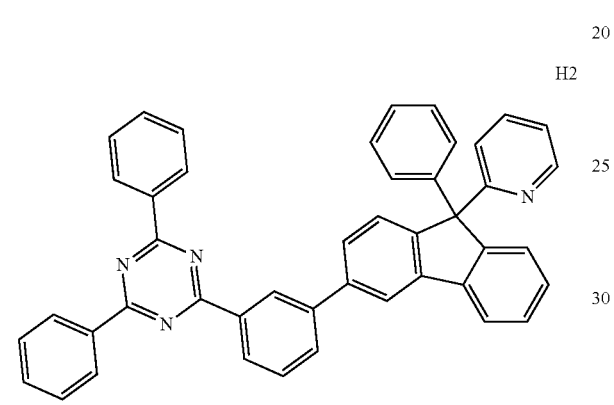
H3
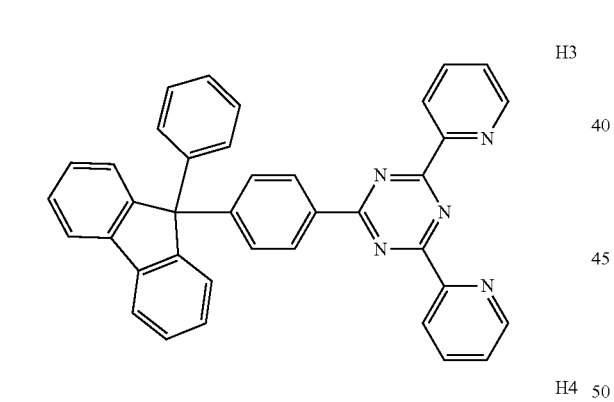
H4
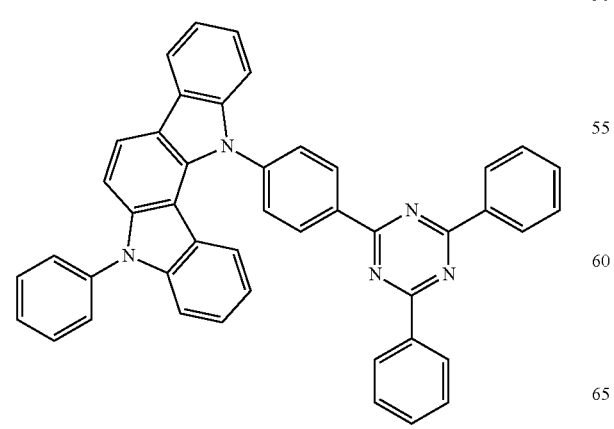
H5
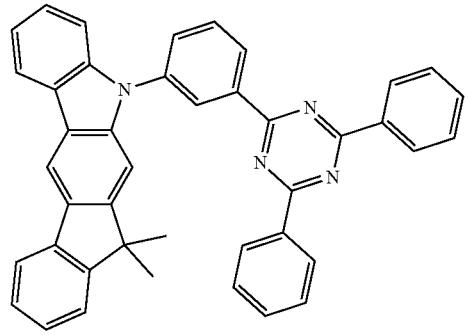
H6
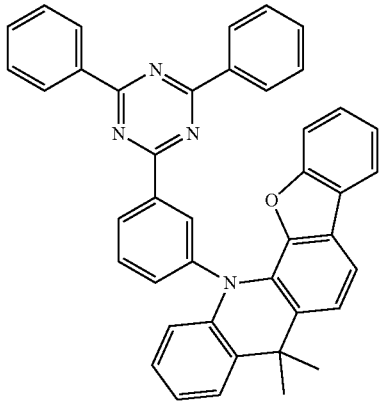
H7
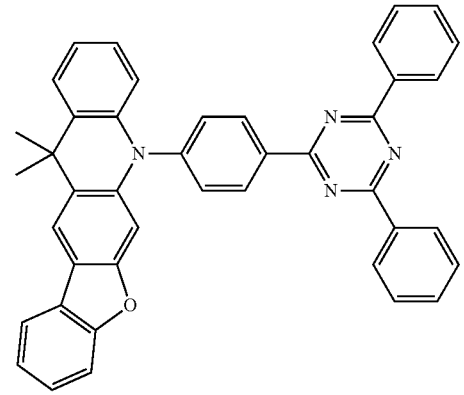
H8
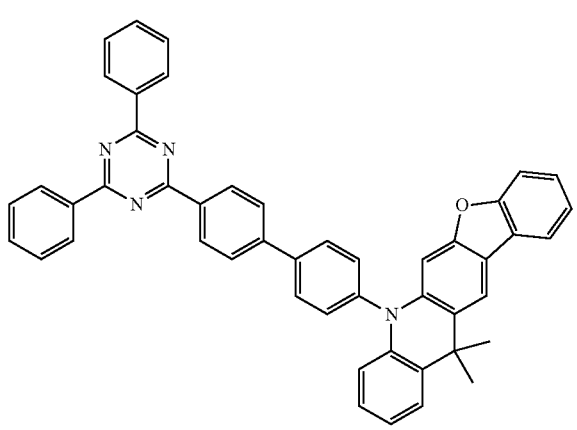

H9
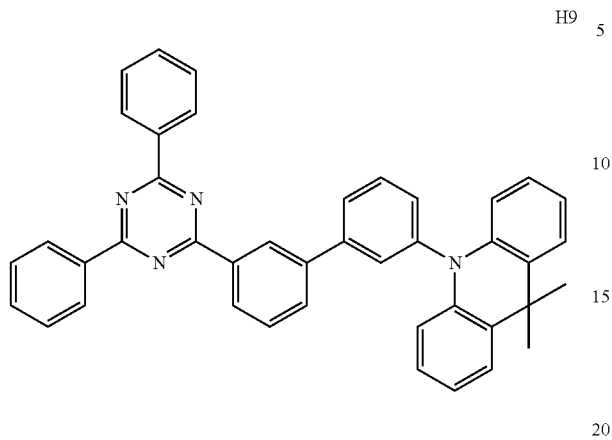
H10
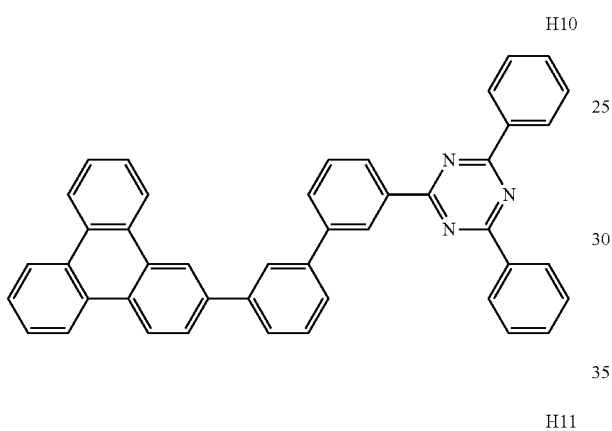
H11
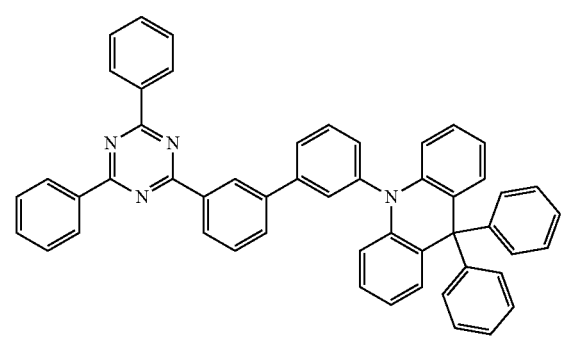
H12
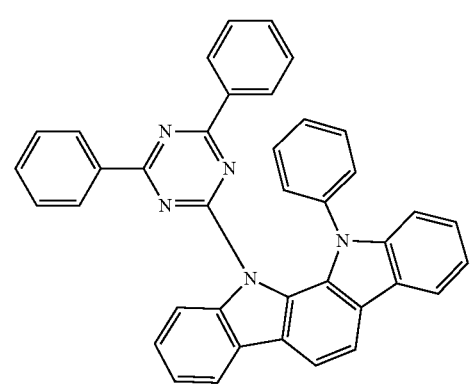
H13
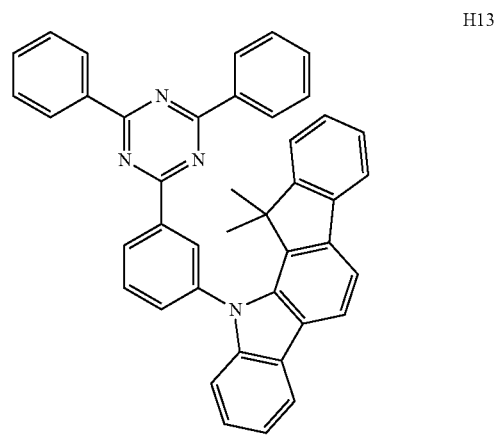
H14
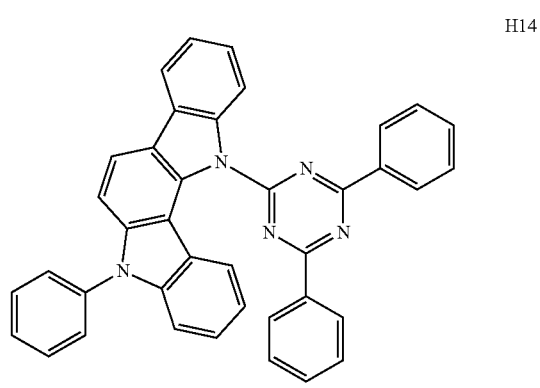
H15
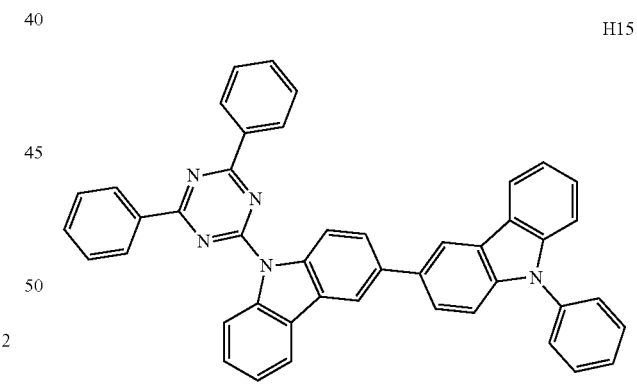
H16
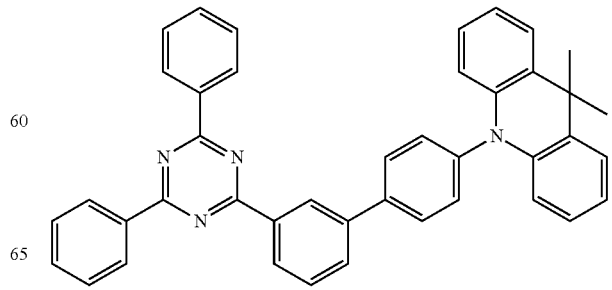

H17
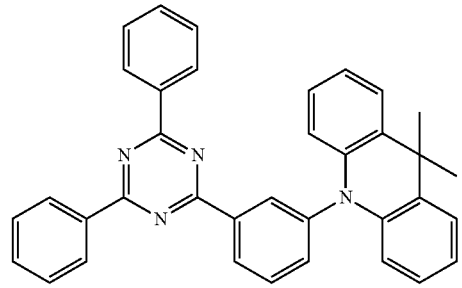
H18
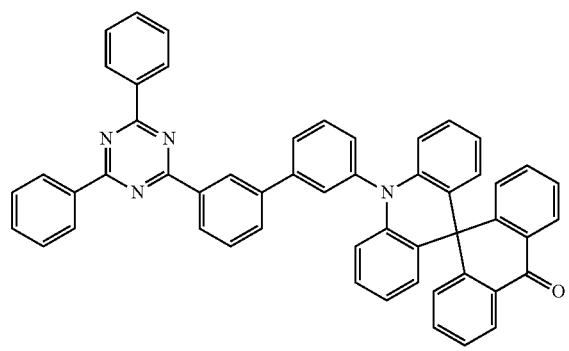
H19
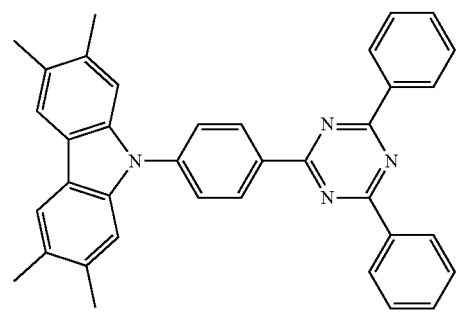
H20
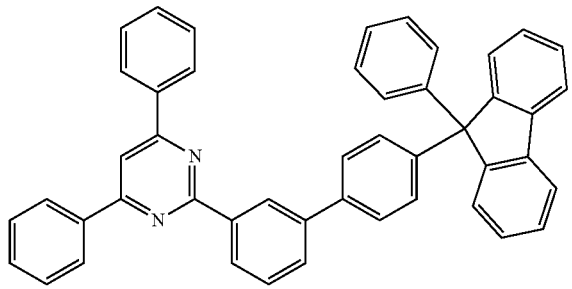
H21
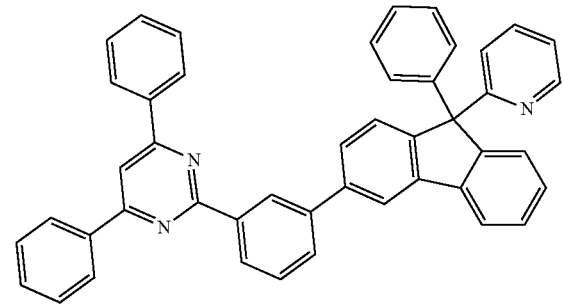
H22
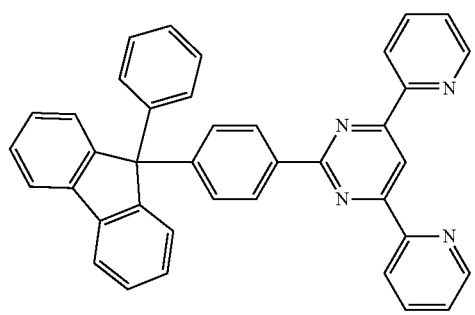
H23
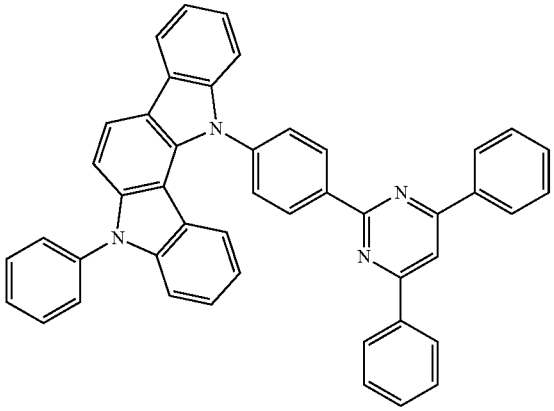
H24
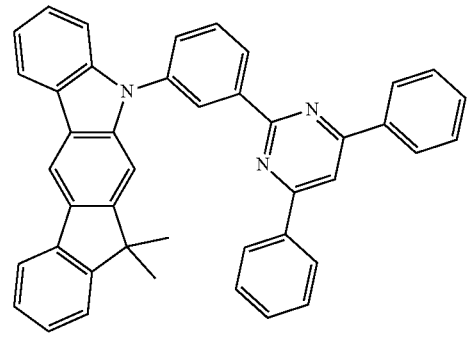
H25
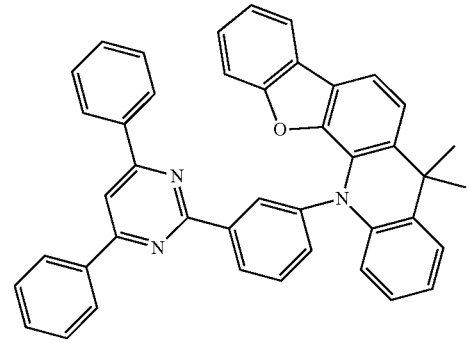

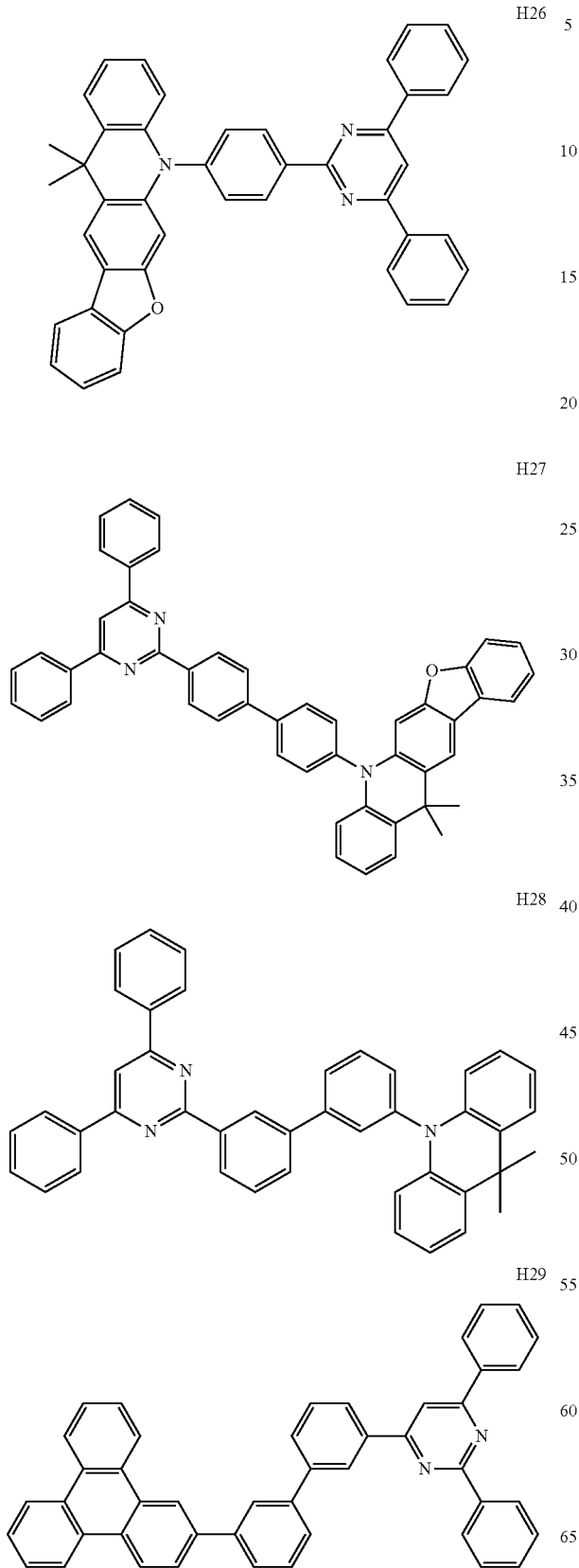
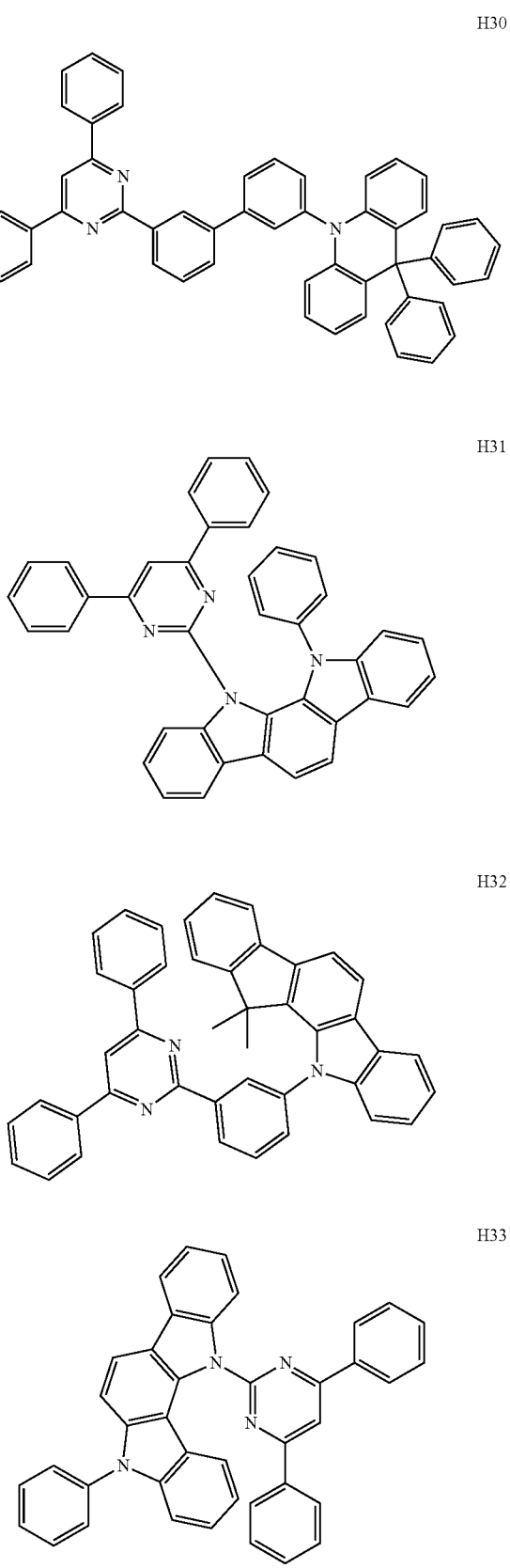

-continued
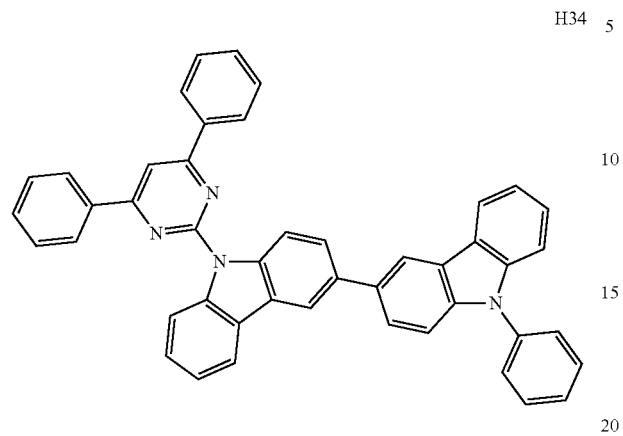
H34
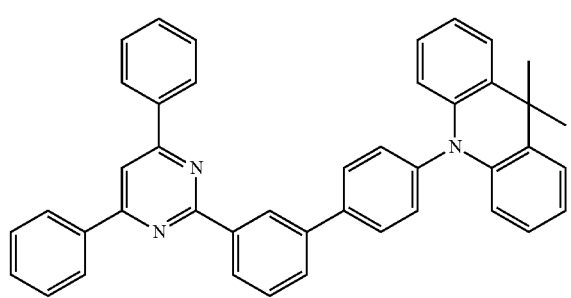
H35
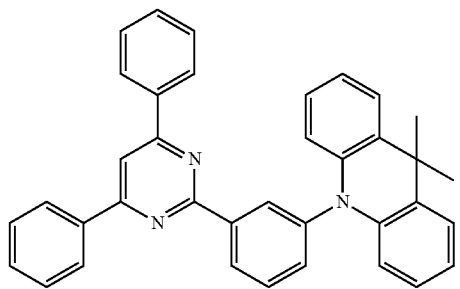
H36
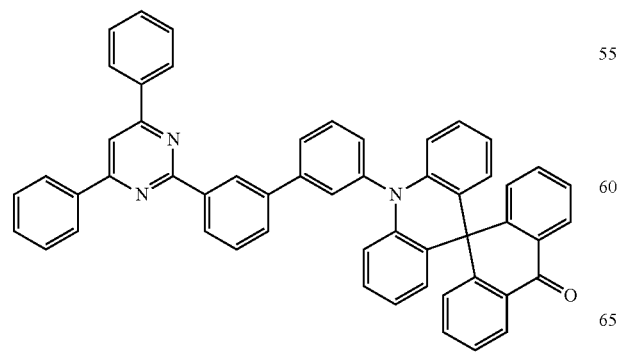
H37
-continued
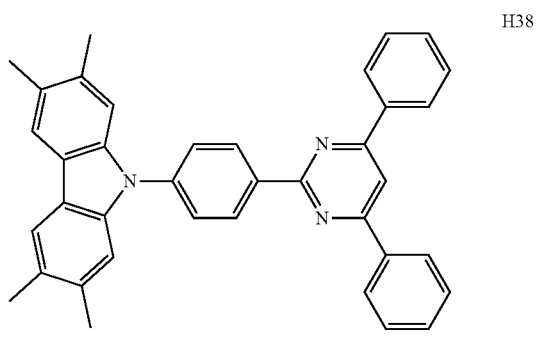
H38
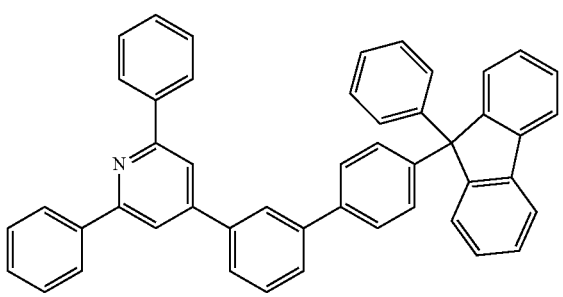
H39
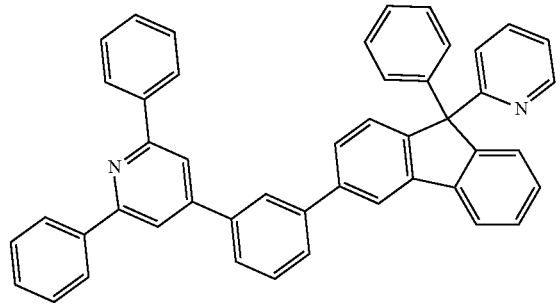
H40
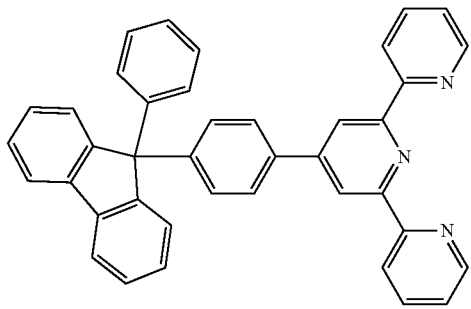
H41

H42
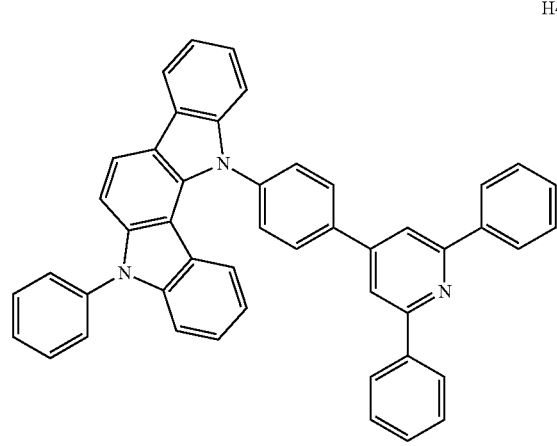
H43
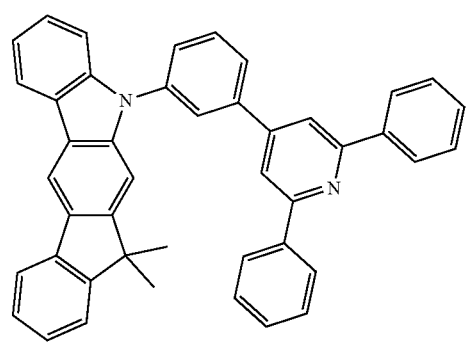
H44
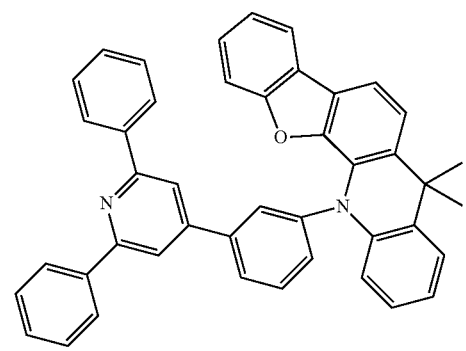
H45
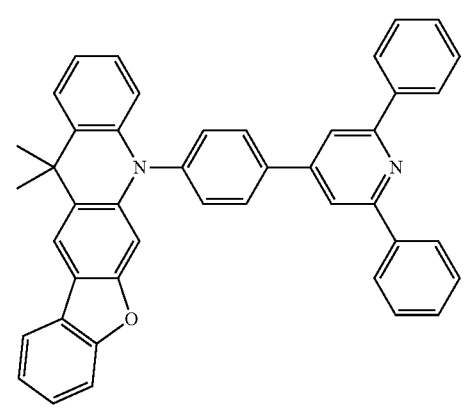
H46
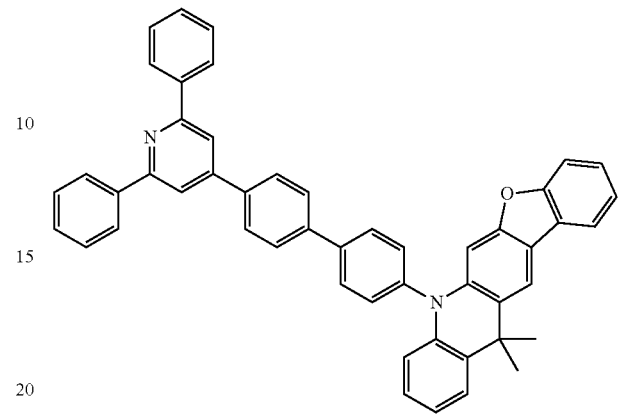
H47
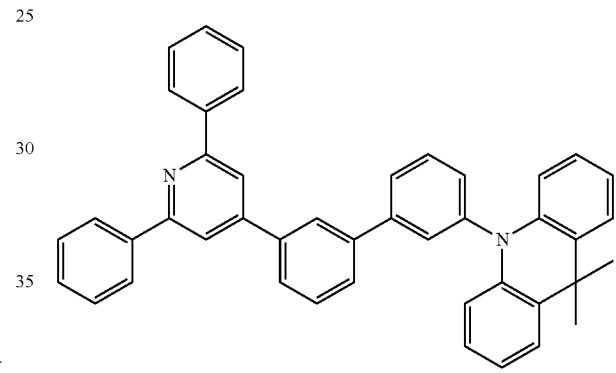
H48
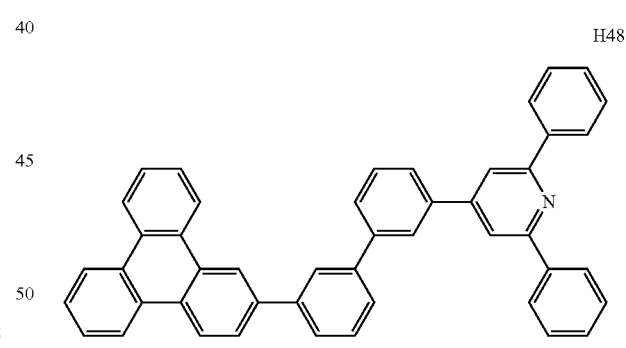
H49
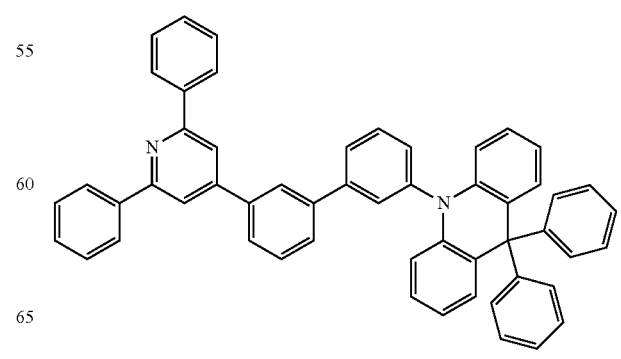

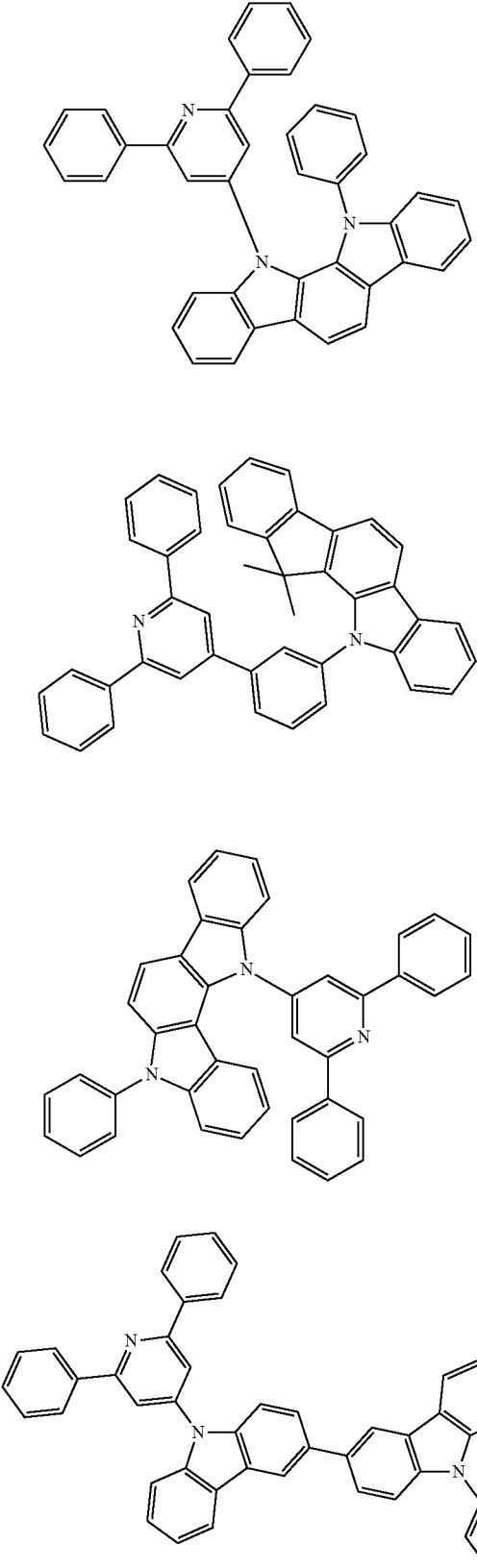
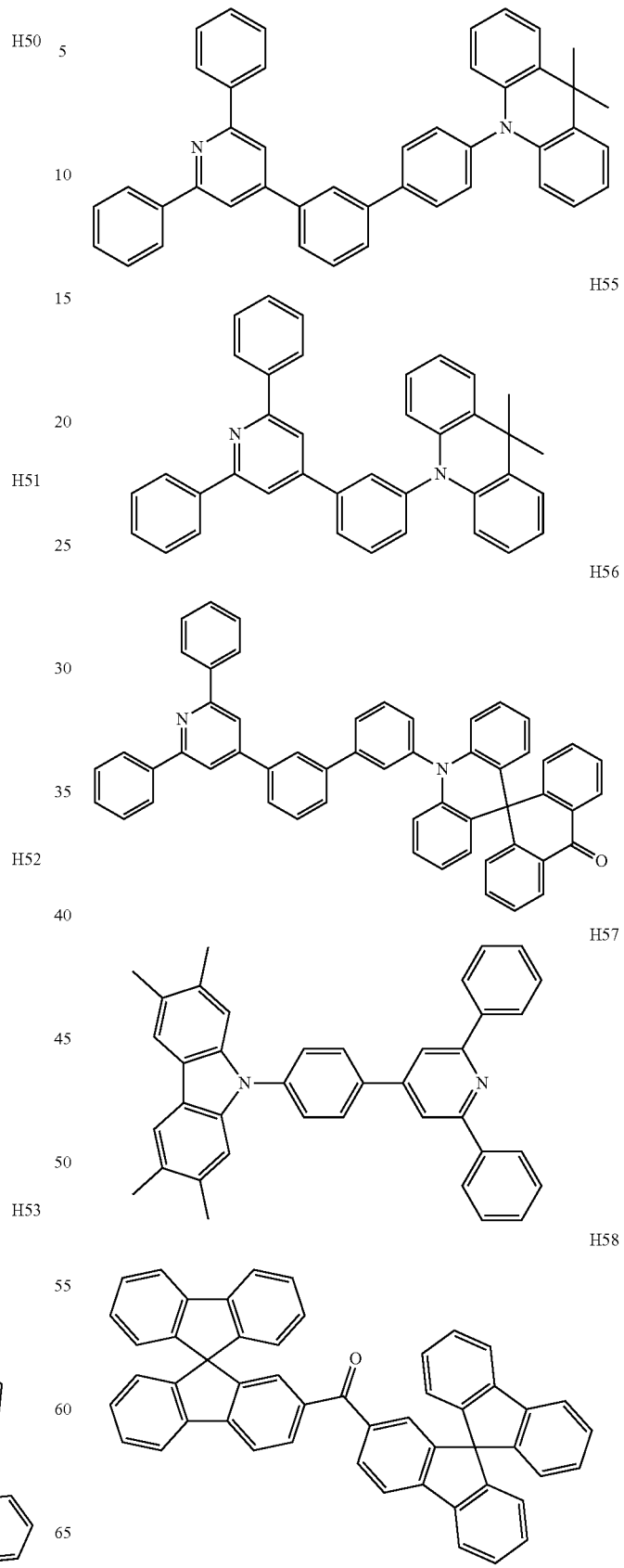

41
-continued
H59
H60
H61
H62
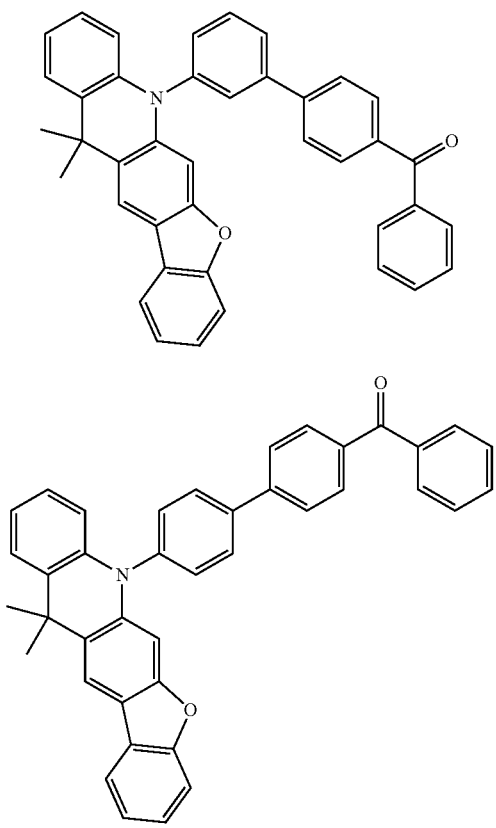
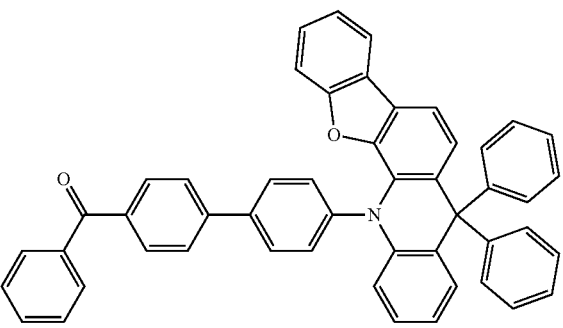
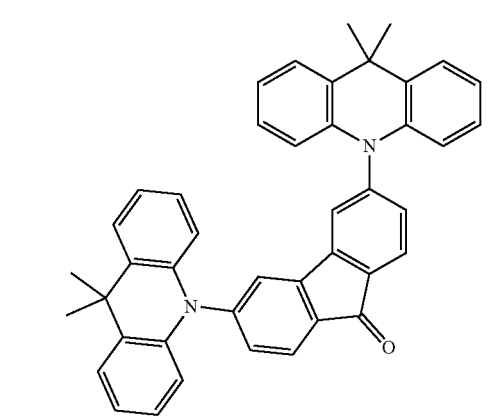
42
-continued
H63
H64
H65
H66
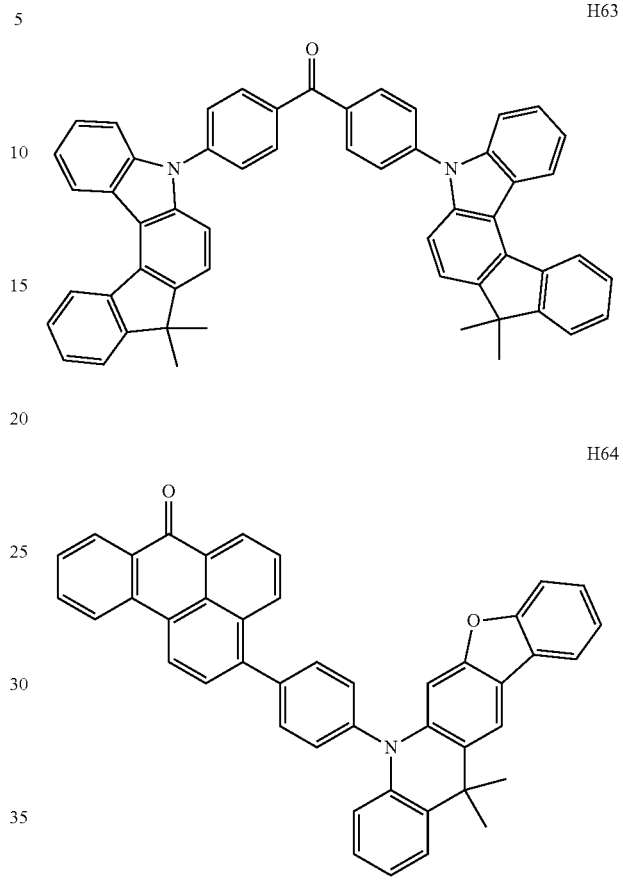
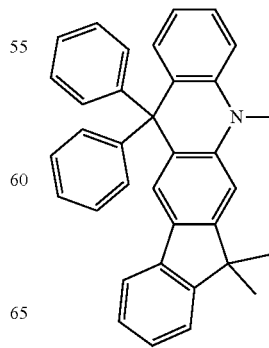

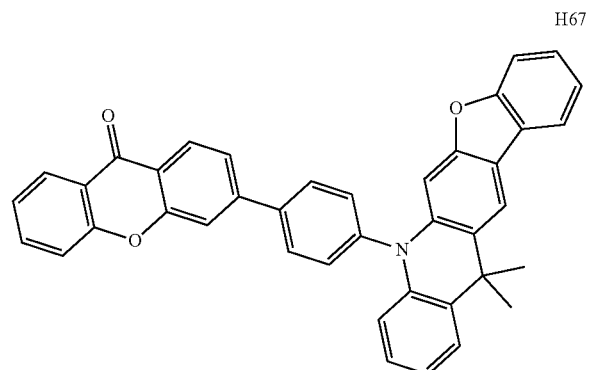
H67
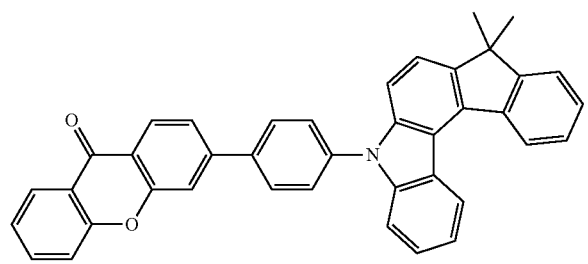
H68
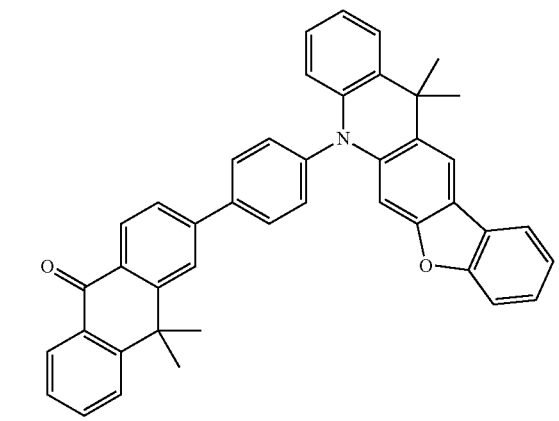
H69
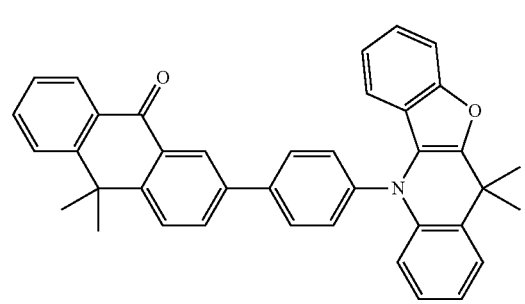
H70
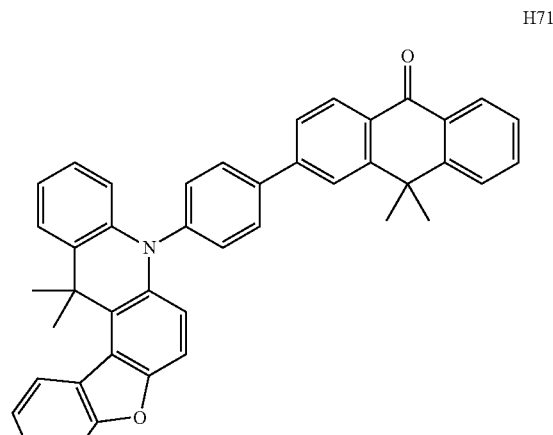
H71
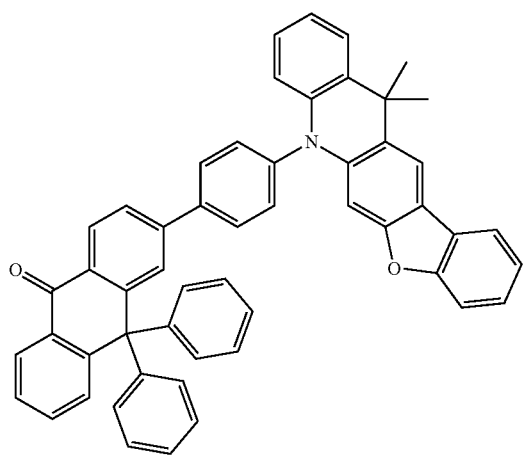
H72
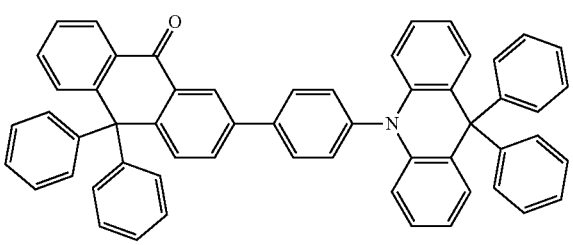
H73
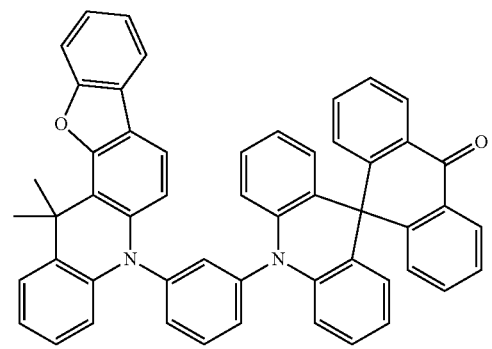
H74

-continued
H75
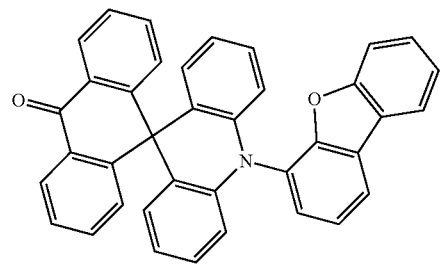
H76
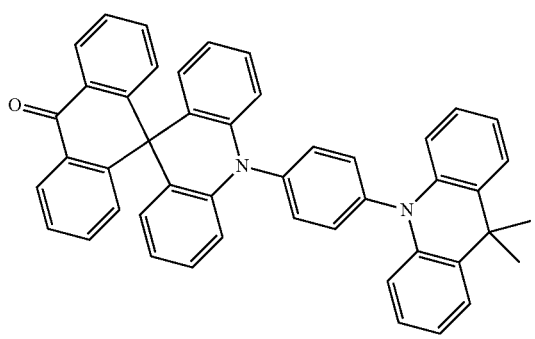
H77
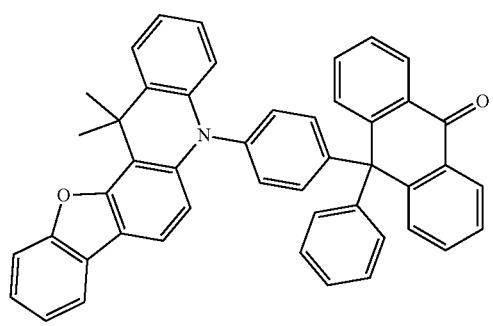
H78
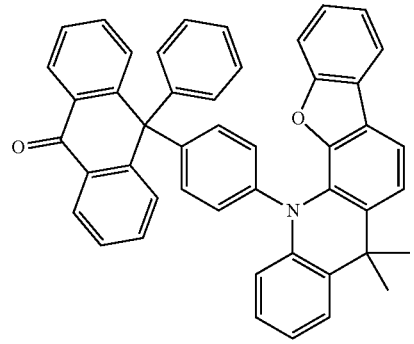
H79
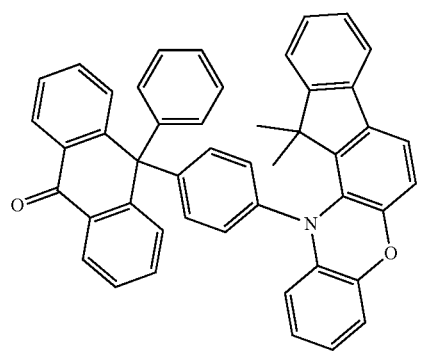
-continued
H80
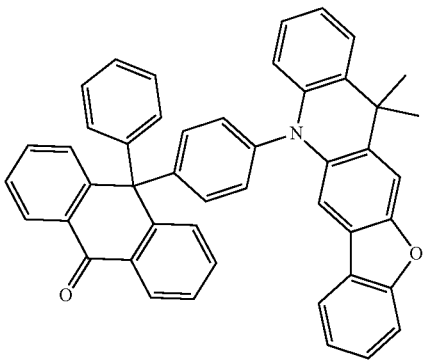
H81
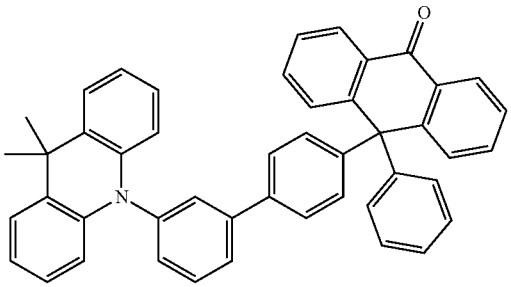
H82
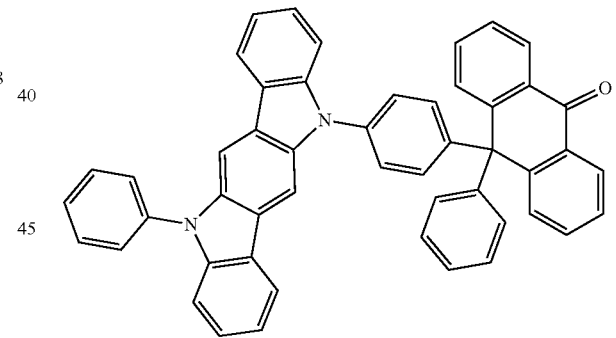
H83
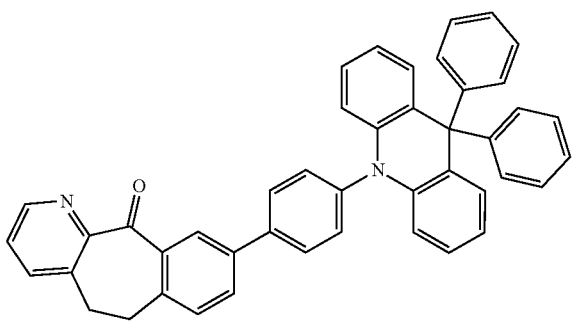

-continued
H84
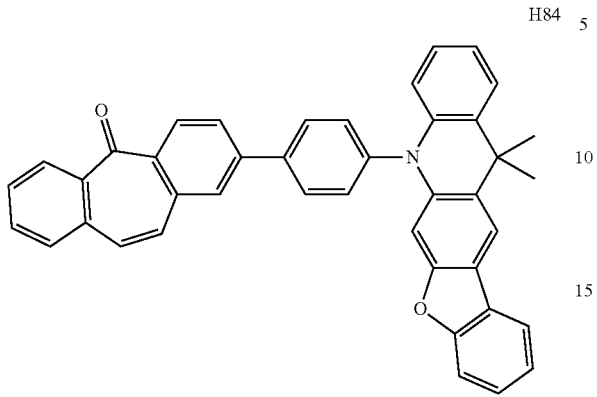
H85
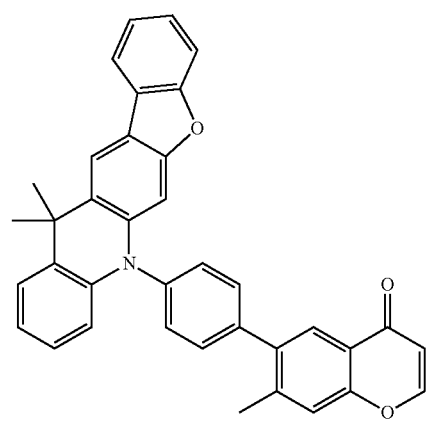
H86
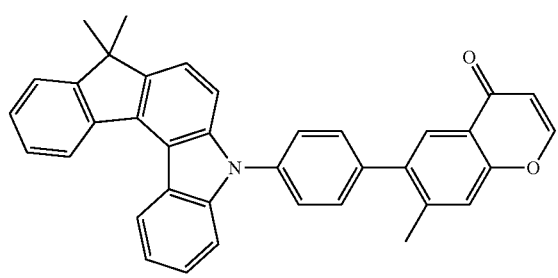
H87
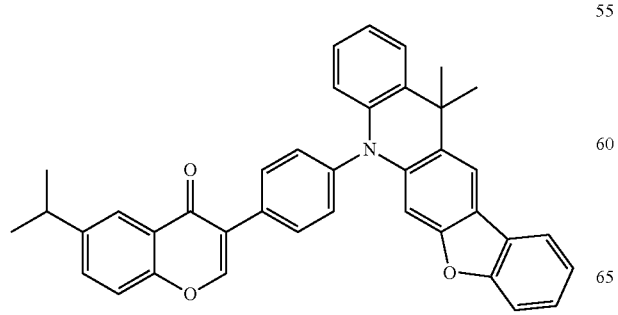
-continued
H88
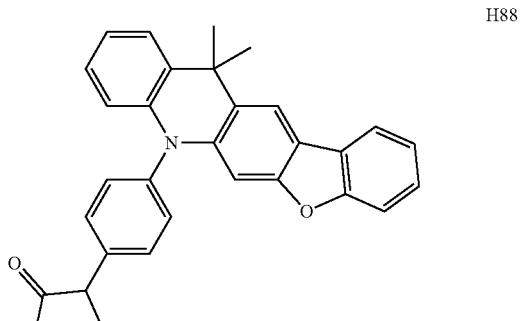
H89
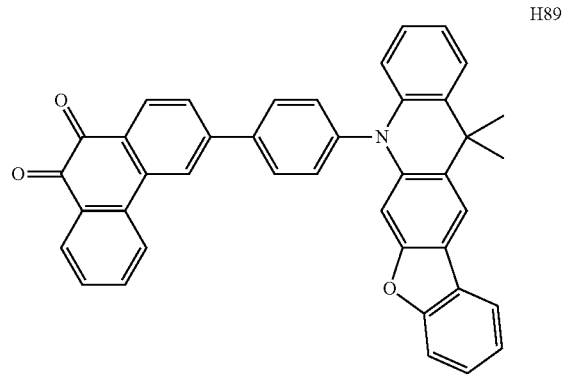
H90
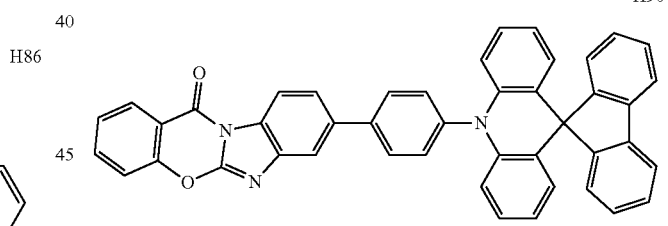
H91
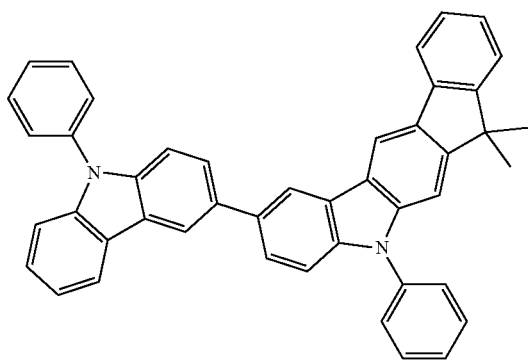

H92
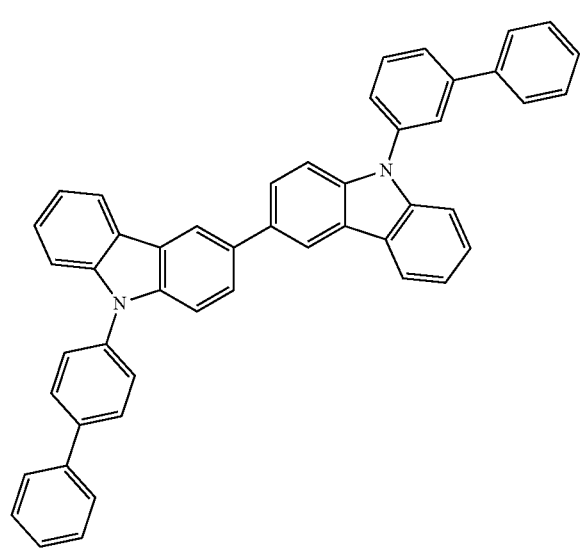
H93
H94
H95
H96
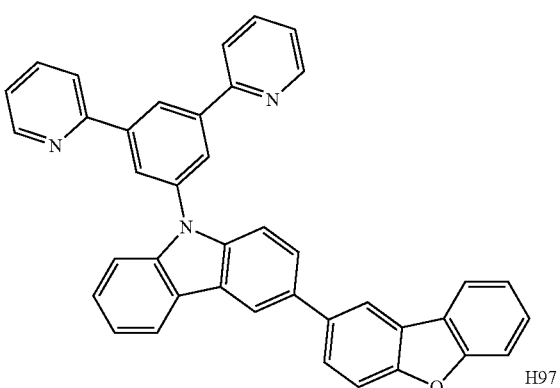
H97
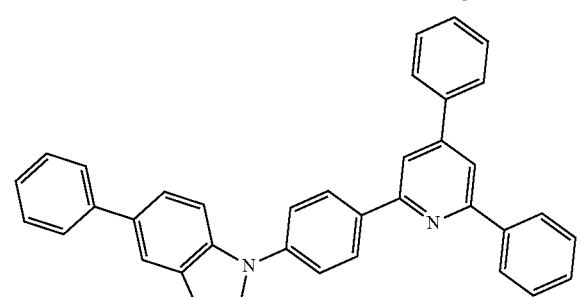
H98
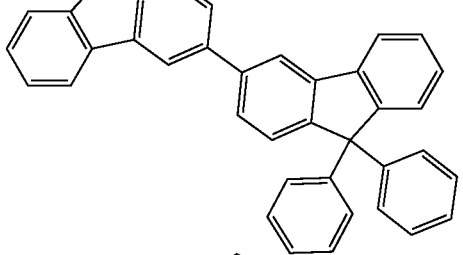
H99
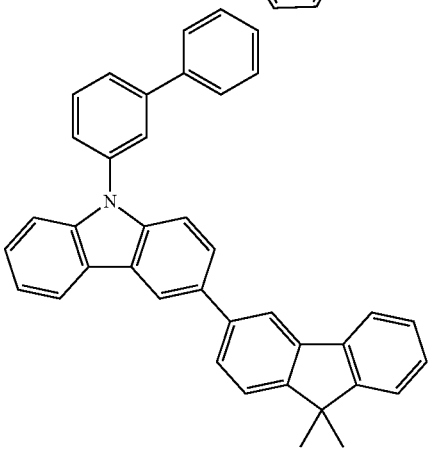

H100
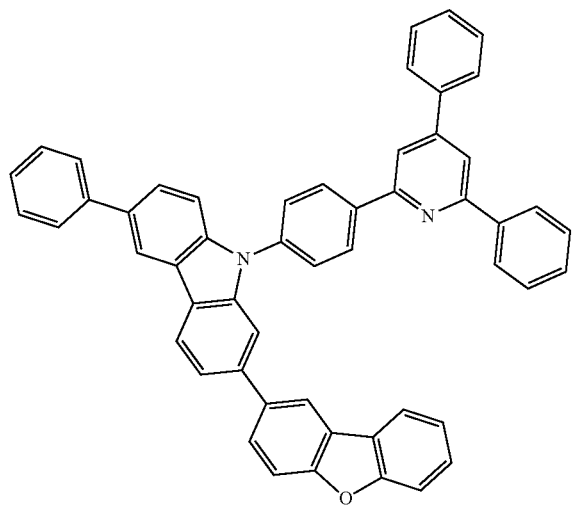
H104
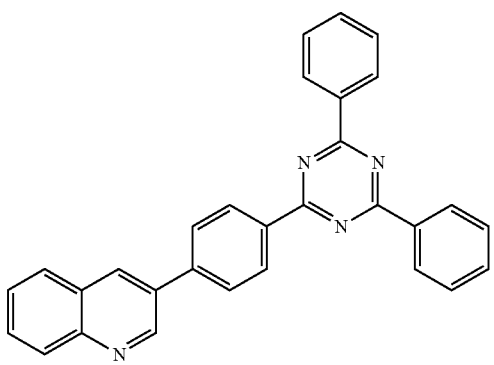
H101
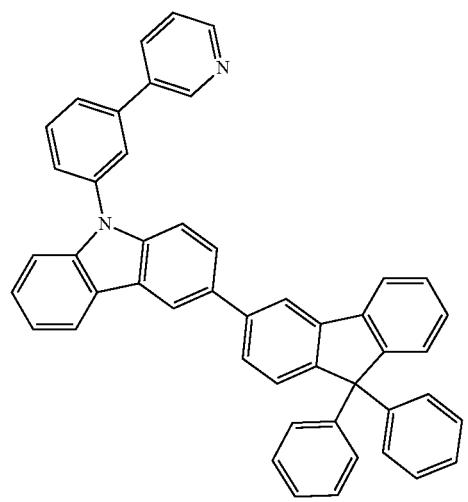
H105
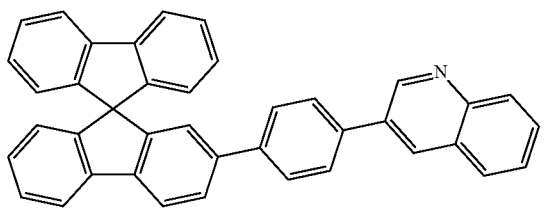
H106
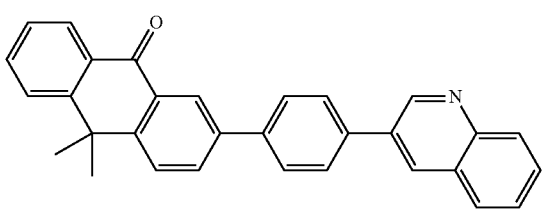
H102
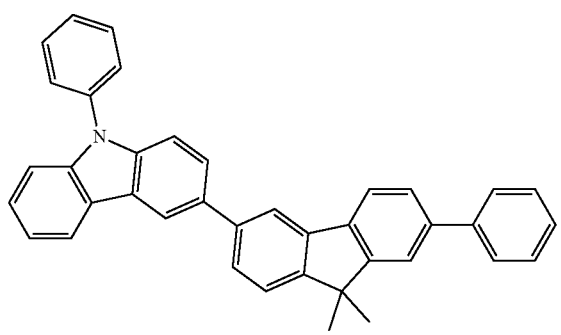
H107
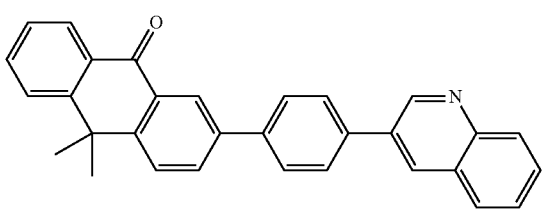
H103
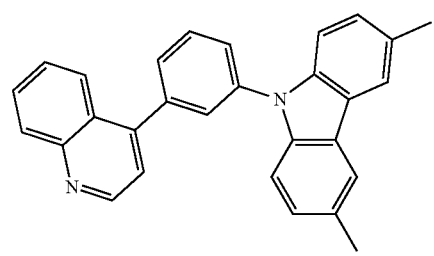
H108
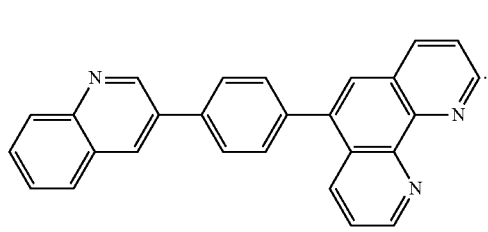

Further, the hole injection layer uses a compound represented by any one of the following structural formulas:
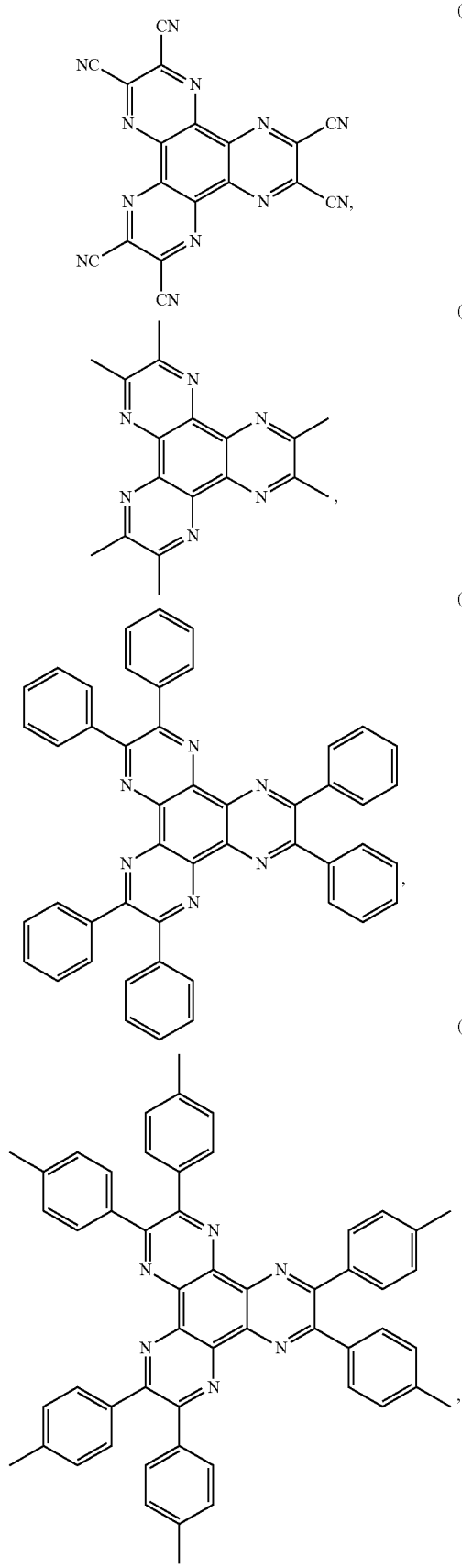
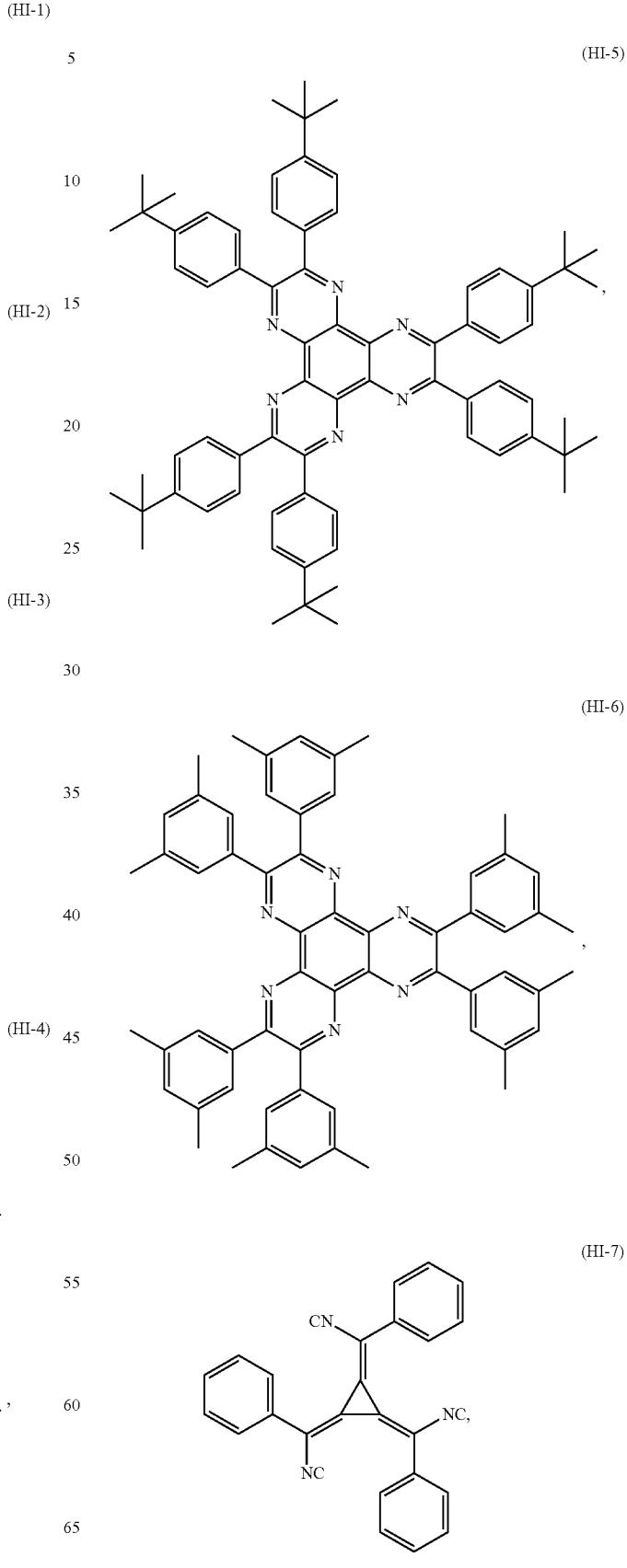

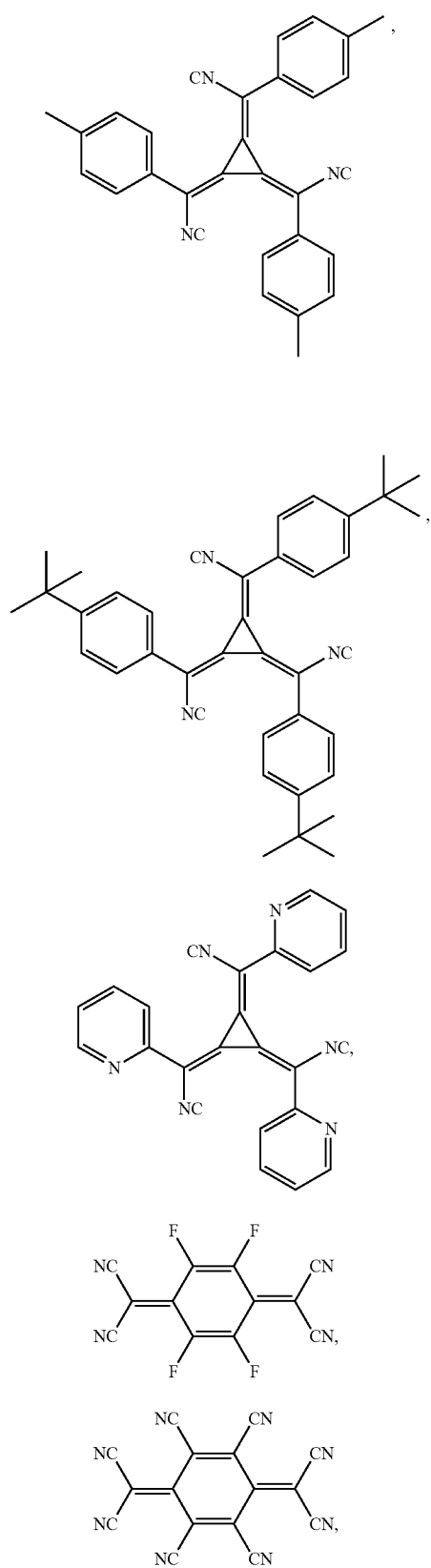
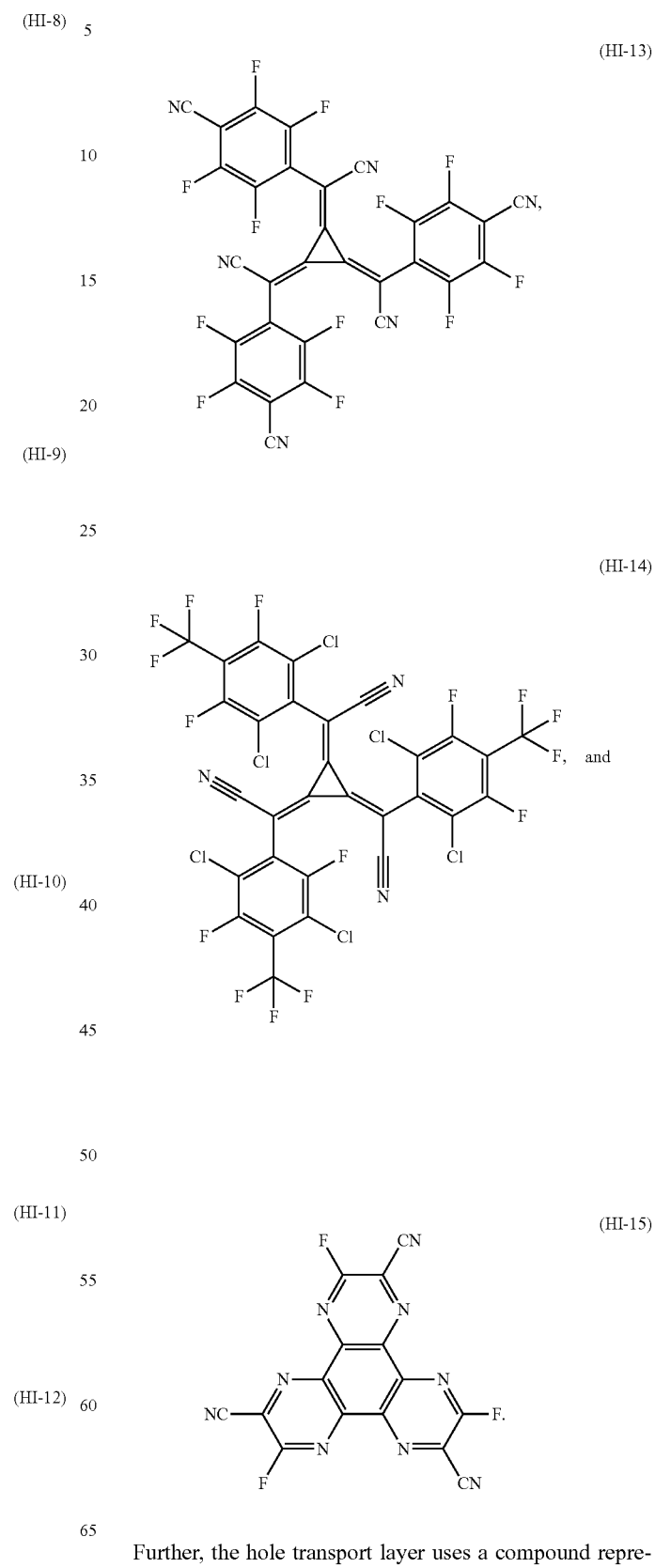
Further, the hole transport layer uses a compound represented by any one of the following structural formulas:

(HT-1)
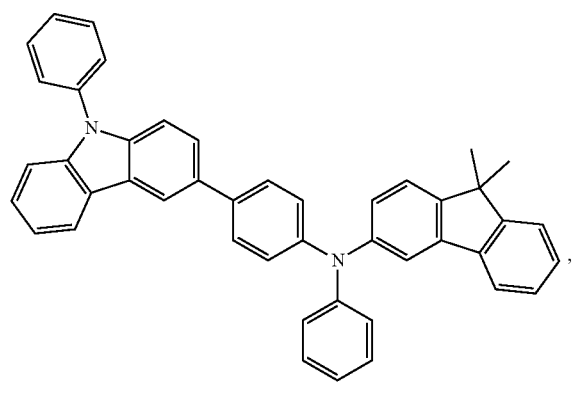
(HT-2)
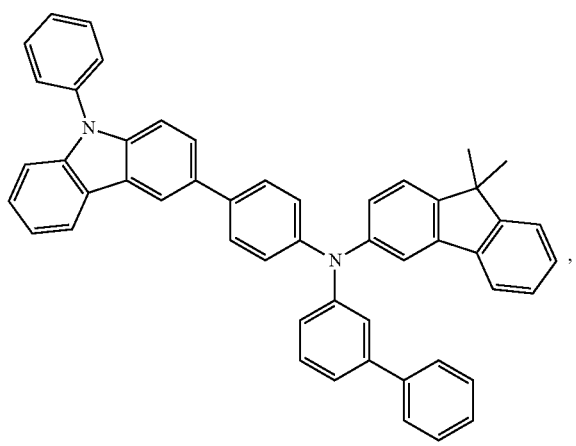
(HT-3)
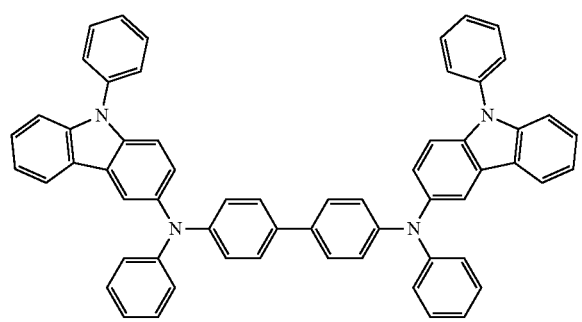
(HT-4)
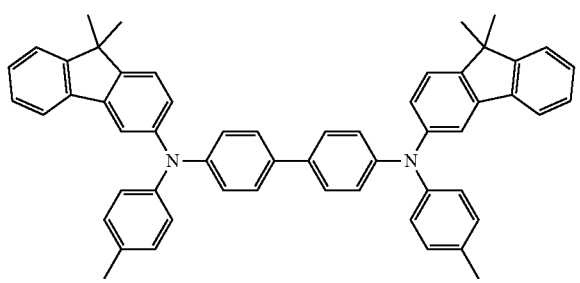
(HT-5)
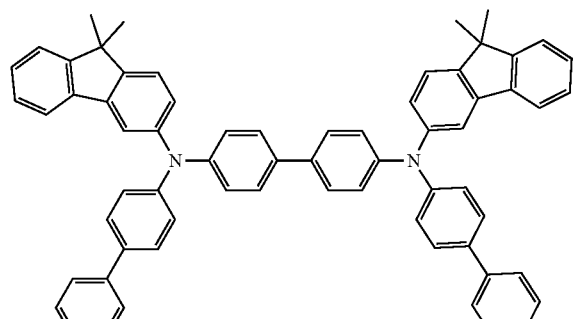
(HT-6)
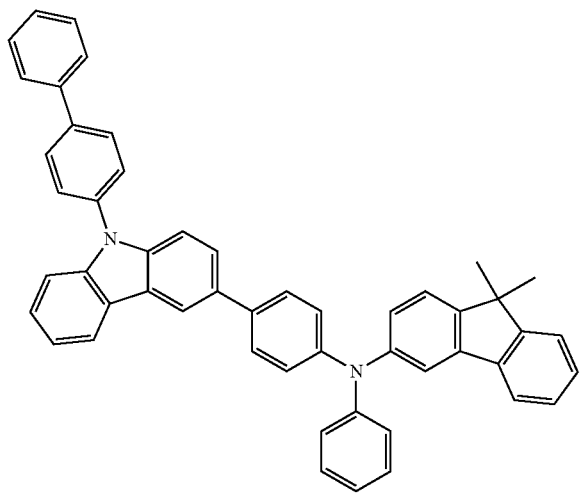

-continued
(HT-7)
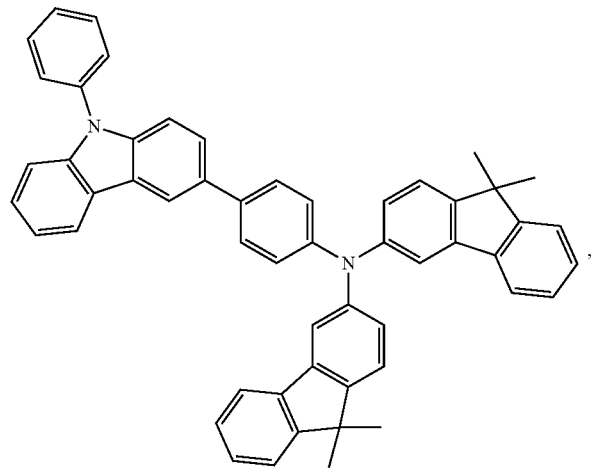
(HT-8)
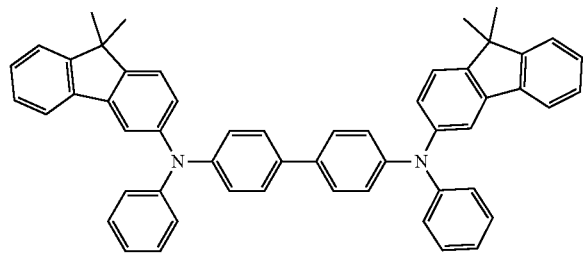
(HT-9)
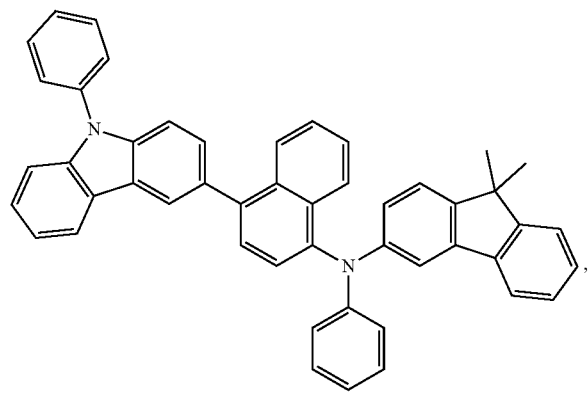
(HT-10)
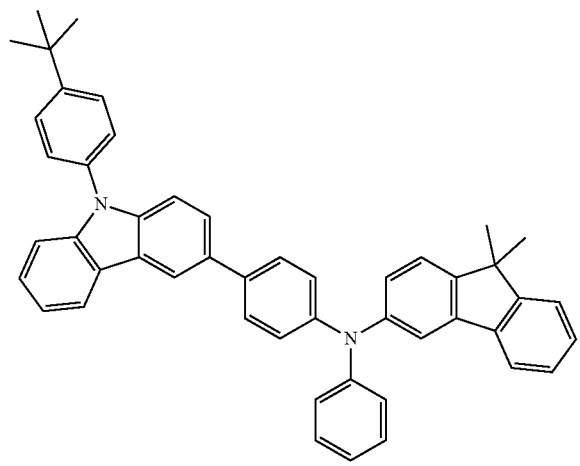
(HT-11)
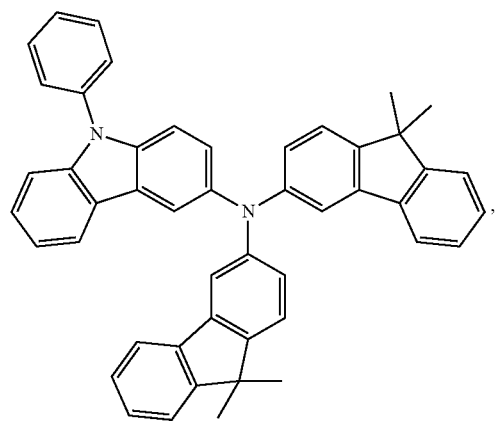
(HT-12)
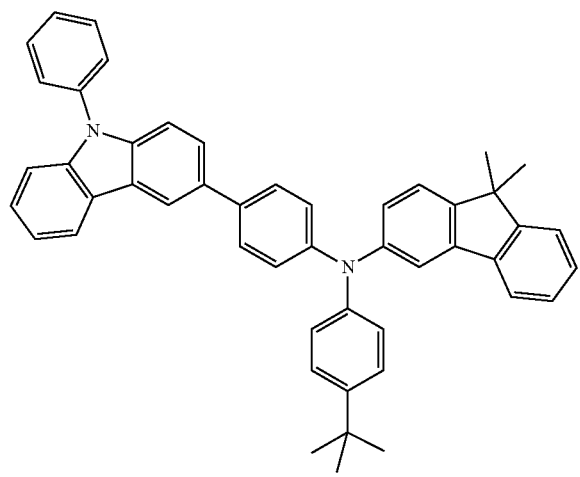

-continued
(HT-13)
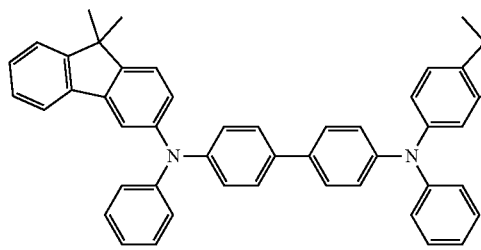
(HT-14)
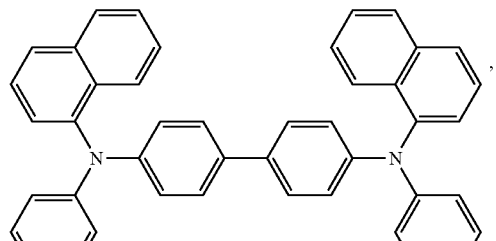
(HT-15)
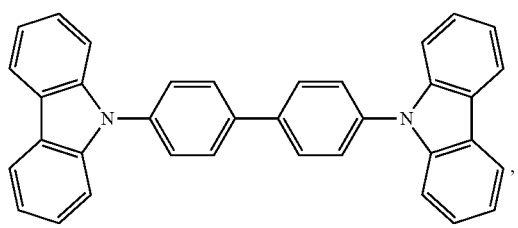
(HT-16)
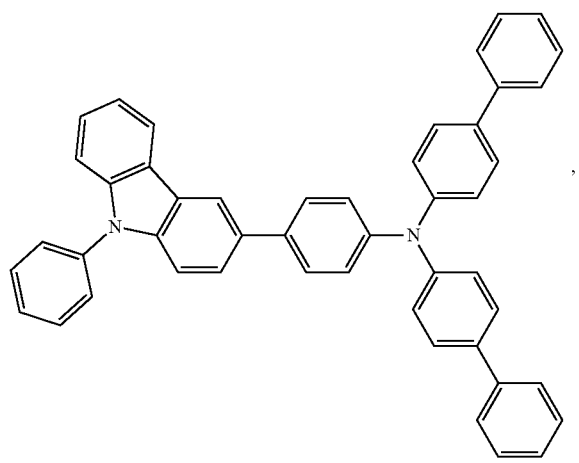
(HT-17)
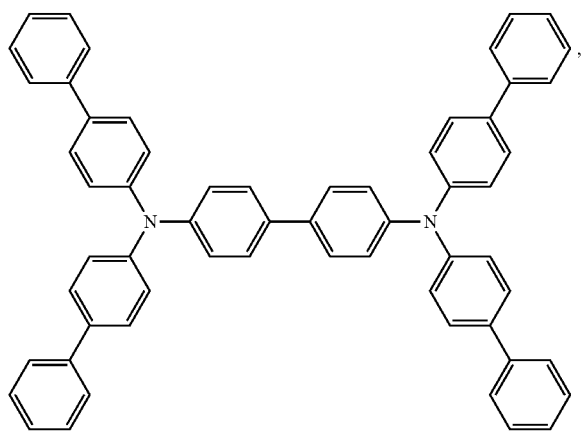
(HT-18)
(HT-19)
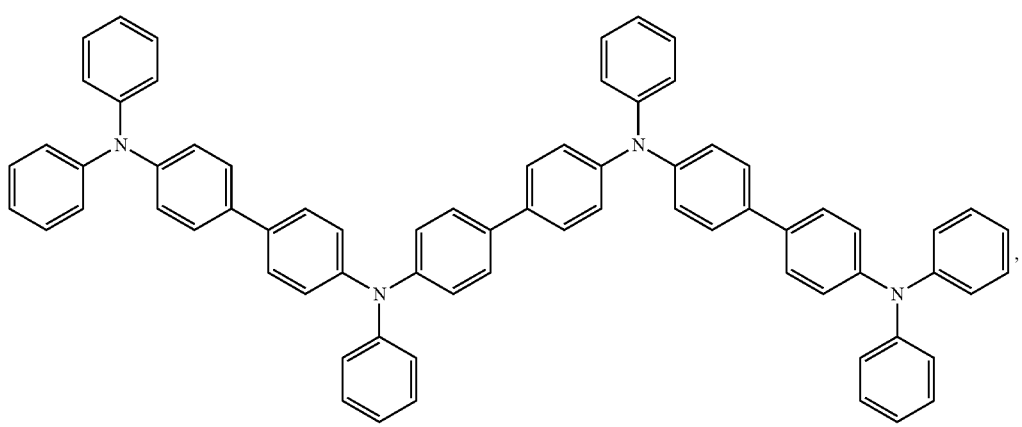

-continued
(HT-20)
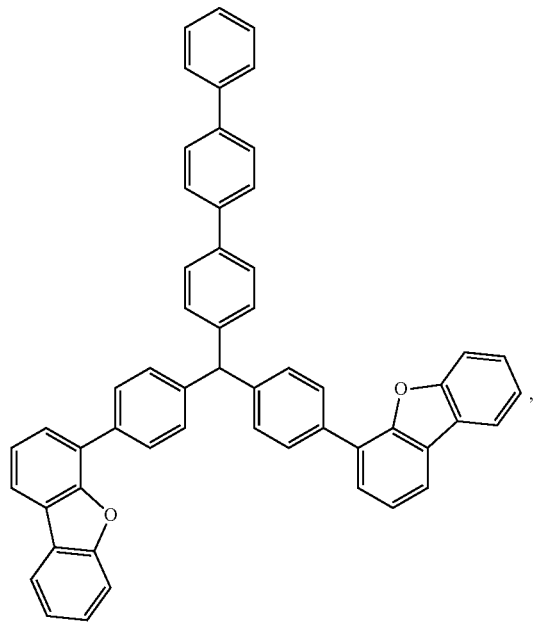
(HT-21)
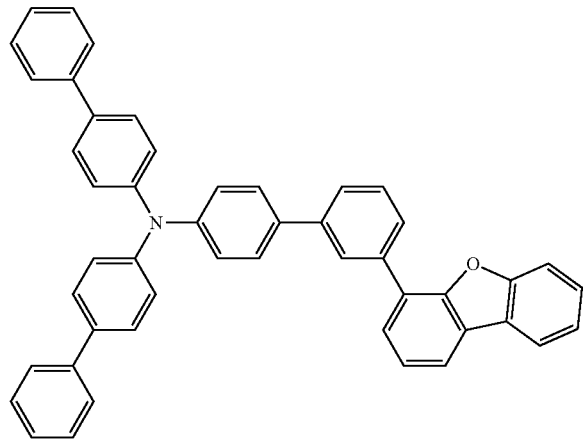
(HT-22)
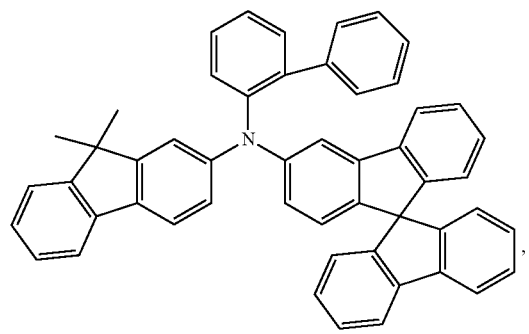
(HT-23)
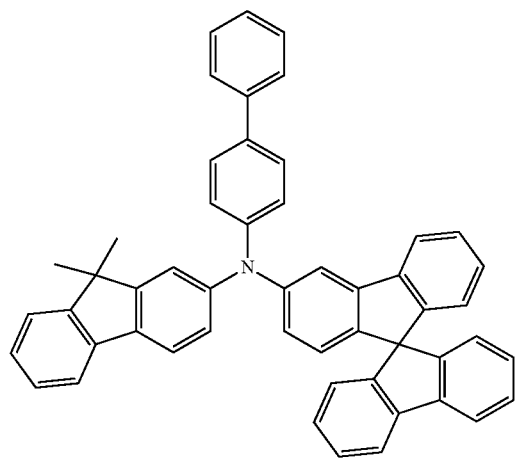
(HT-24)
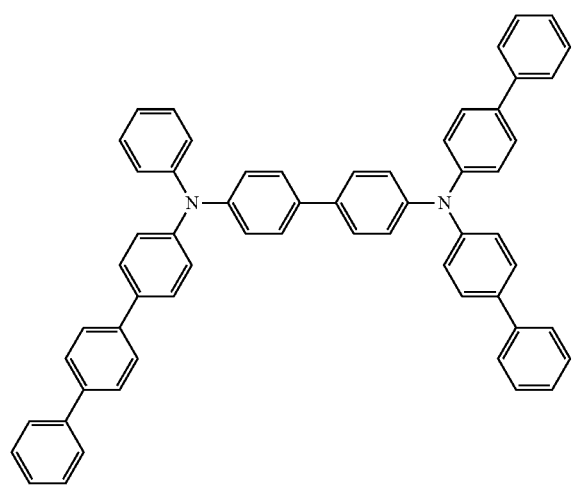
(HT-25)
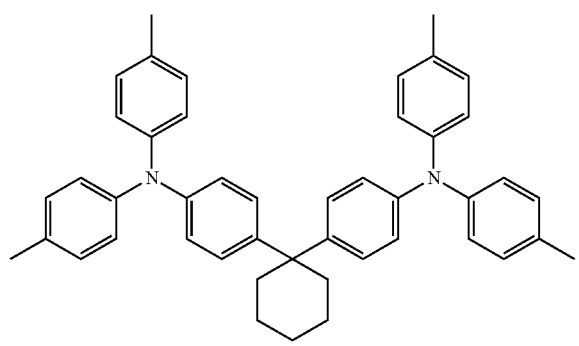

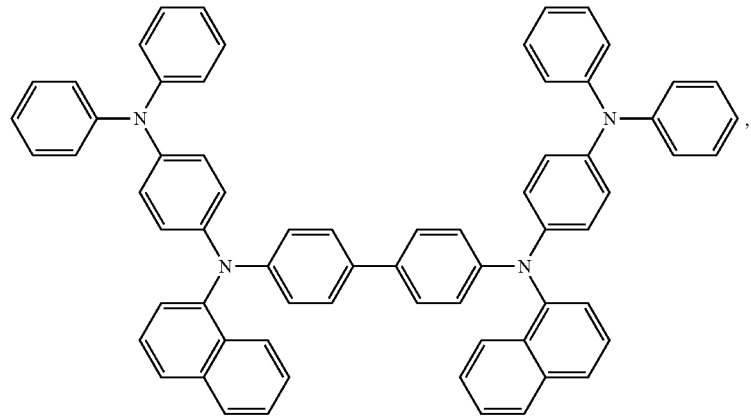
(HT-26)
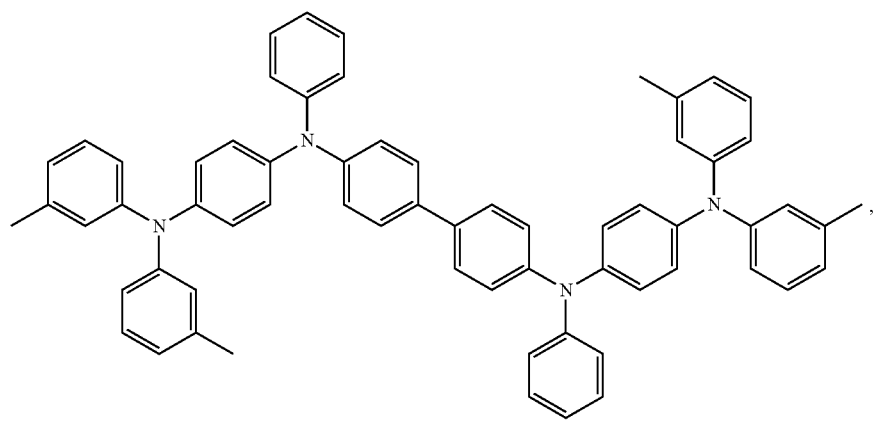
(HT-27)
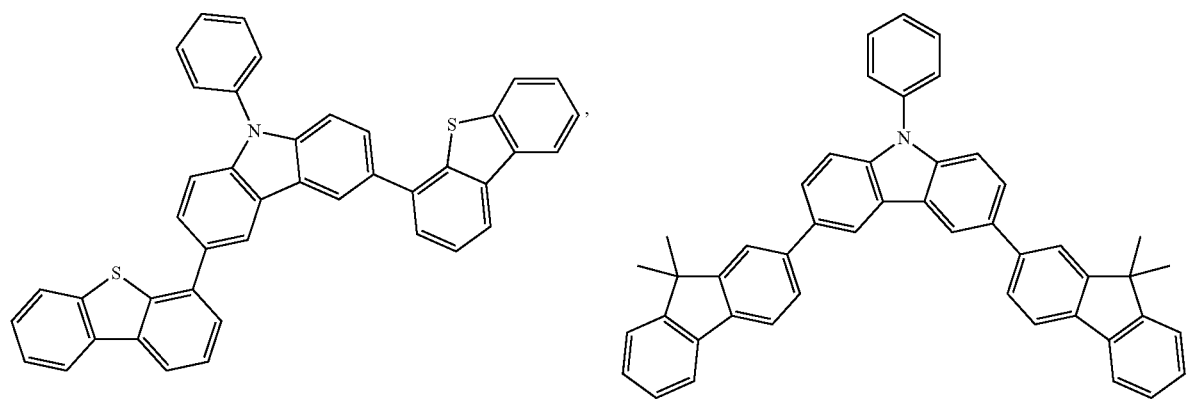
(HT-28)       (HT-29)

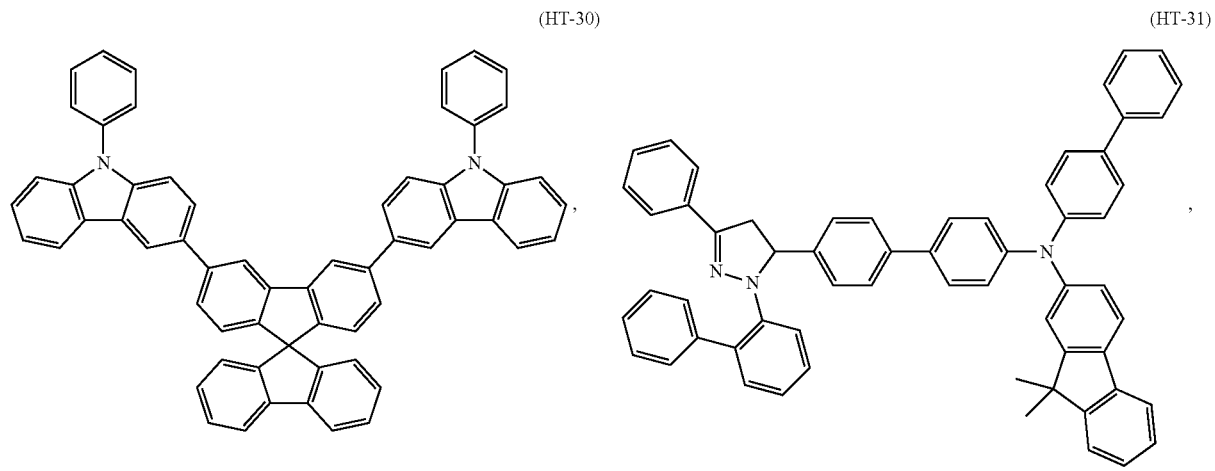
(HT-30) (HT-31)
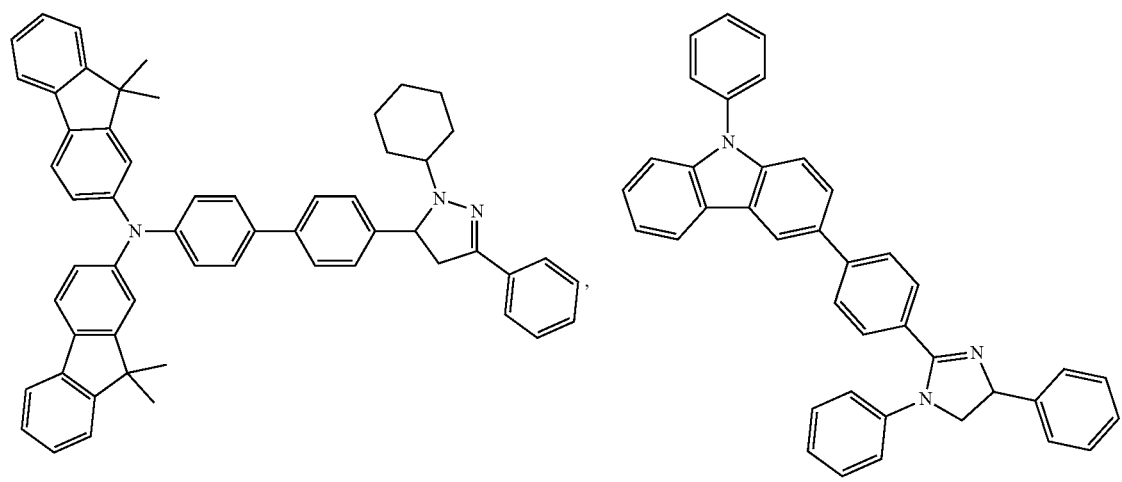
(HT-32) (HT-33)
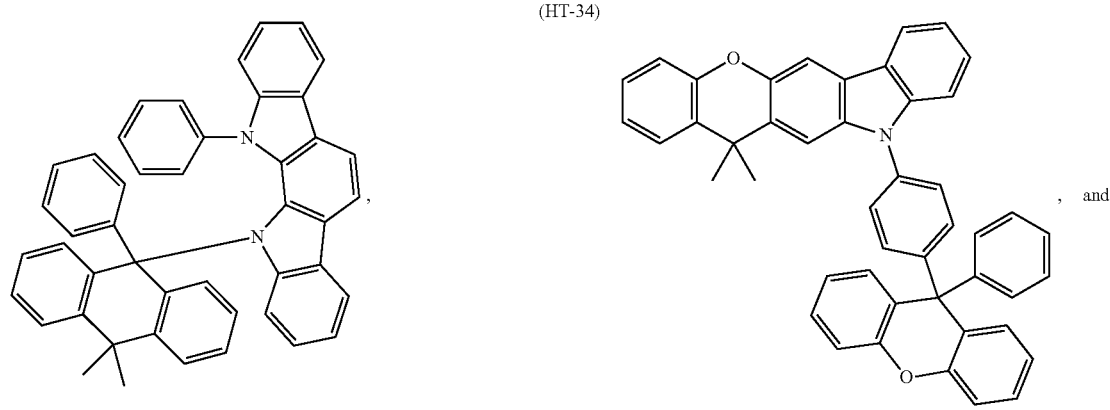
(HT-34) (HT-35), and (HT-36)

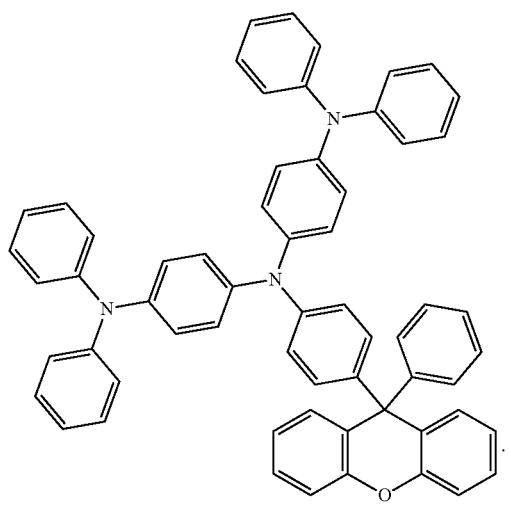

Further, the organic light-emitting diode device is characterized in that the material of the electron transport layer is a compound represented by formula (1C), (2C), (3C), (4C) or (5C):

formula (1C)

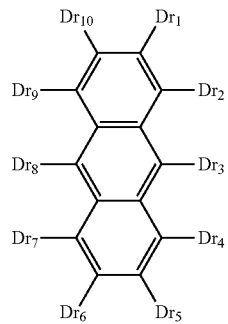

formula (2C)

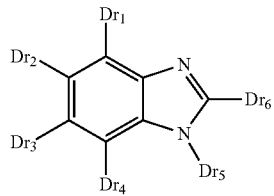

formula (3C)

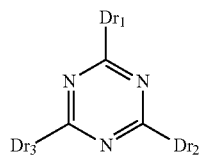

formula (4C)

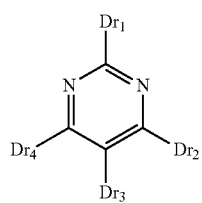

formula (5C)

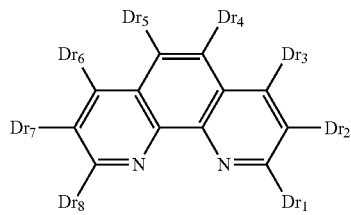

Wherein, $Dr_1$ to $Dr_{10}$ in formula (1C), (2C), (3C), (4C) or (5C) independently represent hydrogen atom, substituted or unsubstituted aryl with 6 to 60 carbon atoms or substituted or unsubstituted heteroaryl with 1 to 60 carbon atoms;

Further, the electron transport layer uses a compound represented by any one of the following structural formulas:

(ET-1)

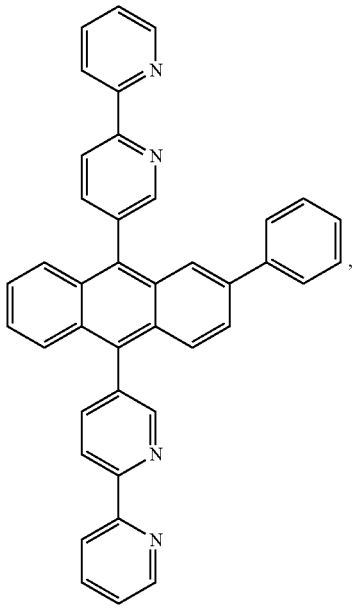

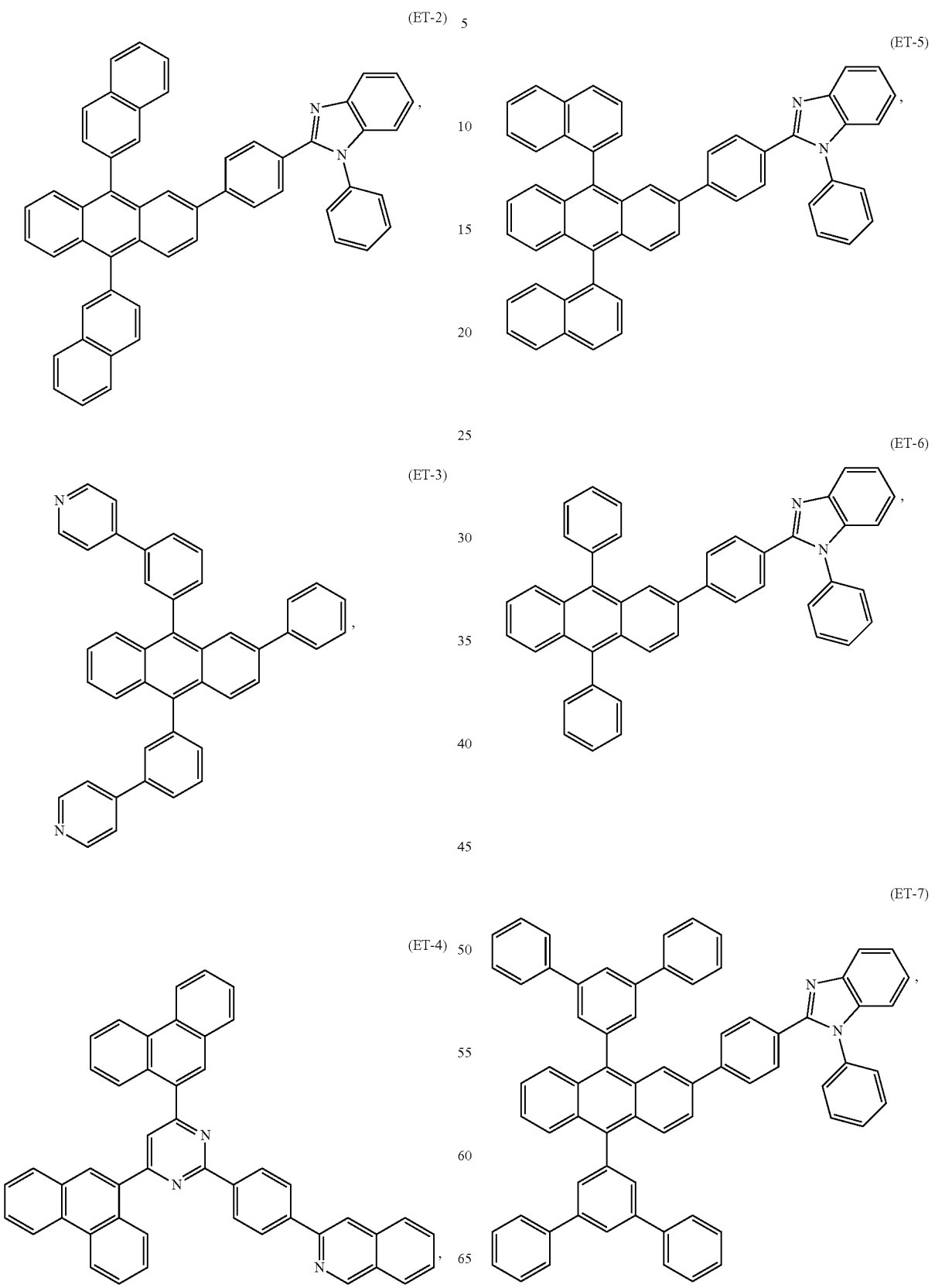

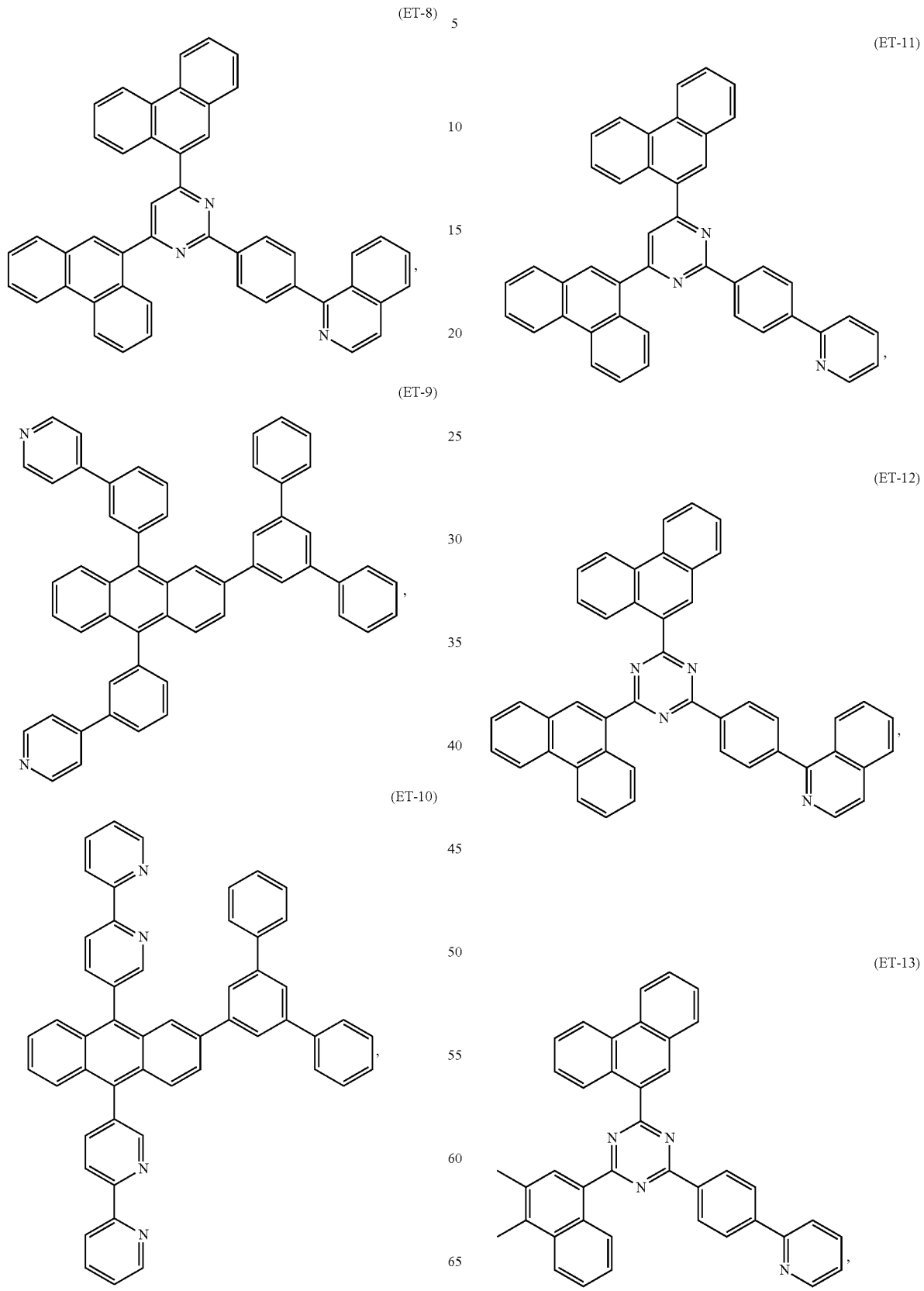

(ET-14)
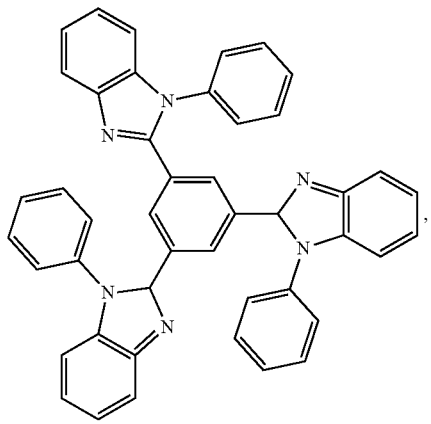
(ET-15)
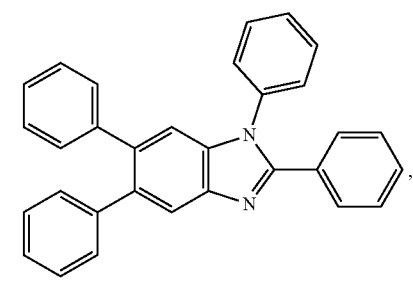
(ET-16)
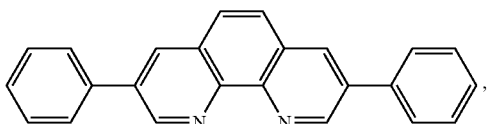
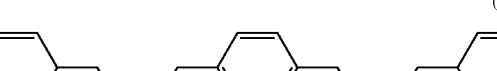
(HT-18)
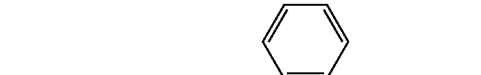
(ET-19)
(ET-20)
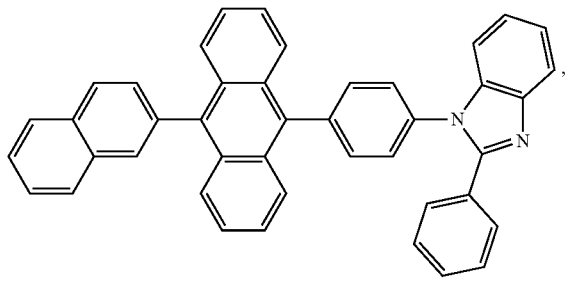
(ET-21)
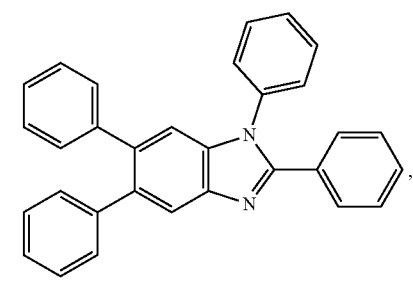
(ET-22)
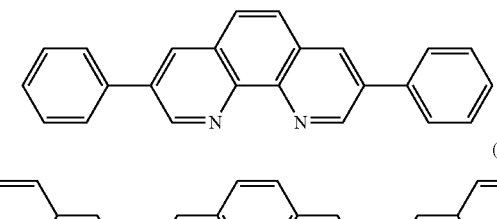
(ET-23)
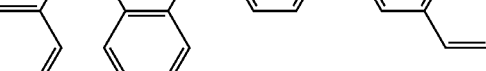

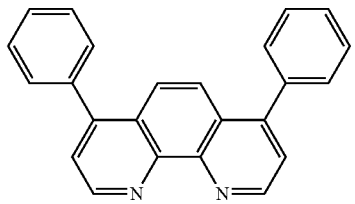

(ET-23)

The present invention achieves the following beneficial effects:

Based on the boron-containing compound of the above structure, the bonding with other atoms is performed through the sp2 hybrid form of boron. In the resulting structure, since boron is an electron-deficient atom, it can form a charge transfer state or reverse space resonance with an electron donating group or a weak electron withdrawing group. The transfer state or reverse space resonance effect leads to the separation of the HOMO and LUMO orbits distribution, and the singlet-triplet energy gap of the material is reduced, resulting in delayed fluorescence.

Due to the strong electron-withdrawing ability of boron atom, the material formed with boron atom as the core can obtain a very small singlet-triplet energy gap, and moreover because of its faster fluorescence radiation rate, the delayed fluorescence lifetime of the material can be effectively reduced, thereby reducing the triplet quenching effect of the material and improving device efficiency.

Based on the boron-containing compound of the above structure, the bond formed by the connection with boron has good bond energy stability. The excited-state compound formed by the material receiving electrical excitation has a lower energy than the bond energy formed by the connection with boron, so the chemical stability of the material is improved; moreover, because its molecules have a relatively parallel stacking structure, the stacking between the molecules is relatively tight, so that the glass transition temperature of the material is increased. Good thermal stability of the material helps to increase the service lifetime of a device.

Based on the boron-containing compound of the above structure, the compound with a ring structure formed by boron atom has strong rigidity, the excited-state configuration formed when the material is excited is stable, and the conformational relaxation hardly occurs; its conformational reorganization energy is low, resulting in a narrower FWHM of the luminescent spectrum. The narrower FWHM can effectively prevent color changes caused by different declination angles of sight axis, and can effectively use the spectral energy to improve the color purity of a device.

Based on the boron-containing compound of the above structure, in particular, its singlet-triplet energy gap is less than 0.1 eV, the reverse intersystem crossing process can be used effectively and the triplet energy can be made a full use; moreover, because its delayed fluorescence lifetime is short, the energy loss and device lifetime reduction caused by the triplet-triplet quenching can be effectively avoided. Selecting the host material whose triplet and singlet energy levels are higher than those of the boron-containing compound can effectively prevent the reduction in device efficiency caused by the energy returning. In particular, selecting a host material with a singlet-triplet energy gap of less than 0.2 eV can utilize the reverse intersystem crossing process of the triplet state of the host material to improve device efficiency. Selecting a dual-subject collocation can effectively increase the exciton recombination area and increase the carrier recombination rate, thereby improving the efficiency and lifetime of the device.

BRIEF DESCRIPTION OF THE DRAWINGS

The FIGURE is a schematic structural diagram of a device using the compound of the present invention, where 1, a transparent substrate layer, 2, an anode layer, 3, a hole injection layer, 4, a hole transport layer, 5, an electron block layer, 6, a light-emitting layer, 7, an electron transport layer/hole block layer, 8, an electron injection layer, 9, a cathode electrode layer.

DETAILED DESCRIPTION OF THE EMBODIMENTS

The principle and features of the present invention are described below with reference to the accompanying drawing. The illustrated embodiments are only for explaining the present invention, but not intended to limit the scope of the present invention.

The FIGURE is a schematic structural diagram of an organic light-emitting diode device with a structure according to the present invention, where the transparent substrate layer 1 can be a glass substrate or a plastic substrate with good mechanical strength, thermal stability, transparency, surface flatness, ease of handling, and water resistance.

The anode layer 2 can be made of a conductor with a high work function (specifically, 4.0 eV or more) to assist hole injection; the material of the anode includes but is not limited to metal, metal oxide, and/or conductive polymer, such as: metal nickel, platinum, vanadium, chromium, copper, zinc, gold or alloy, zinc oxide, indium oxide, indium tin oxide (ITO), indium zinc oxide (IZO), poly (3-methylthiophene), poly (3,4-(extended ethyl-1,2-dioxy) thiophene), polypyrrole and polyaniline.

The cathode reflective electrode layer 9 can be made of a conductor with a low work function (specifically, 3.8 eV or less) to assist electron injection. The material of the cathode includes but is not limited to metal, metal oxide and/or conductive polymer, such as: magnesium, calcium, sodium, potassium, titanium, indium, aluminum, silver and the like, LiF/Al, LiF/Ca, LiO$_2$/Al, BaF$_2$/Ca;

The hole transport region can be a single-layer structure formed of a single material, a single-layer structure formed of multiple different materials, or a multilayer structure formed of multiple different materials, for example, the hole transport region may be a single-layer structure formed of multiple different materials, or may be a structure having a hole injection layer or a hole transport layer, a structure having a hole injection layer or a hole transport layer or a buffer layer, a structure having a hole injection layer or a buffer layer, a structure having a hole transport layer or a buffer layer, a structure having a hole injection layer or a hole transport layer or an electron block layer, or a structure having a hole transport layer or an electron block layer, but the hole transporting region is not limited thereto; in the FIGURE, the hole transport region includes a hole injection layer 3, a hole transport layer 4, a buffer layer (not shown in the drawing) and an electron block layer 5.

The electron transport region includes one or more of a hole block layer, an electron transport layer, and an electron injection layer; for example, the electron transport region may be a structure having an electron transport layer or an electron injection layer, a structure having a hole block layer or an electron transport layer or an electron injection layer, but is not limited thereto; in the FIGURE, the electron transport region includes a hole block/electron transport layer 7 and an electron injection layer 8.

The light-emitting layer 6 includes a host material and a doping material. The host material can be composed of a single material or a mixture of materials with different structures; the doping material is a boron-containing organic compound with a singlet-triplet energy gap of not more than 0.2 eV; the singlet and triplet energy levels of the host material are higher than those of the doping material.

Preferably, the doping material of the light-emitting layer is a boron-containing organic compound with a singlet-triplet energy gap of not more than 0.1 eV; preferable, the triplet energy level in the film phase state of the host material with the lowest energy is greater than the triplet energy level of the doping material by 0.1 eV or more; preferable, the singlet-triplet energy gap in the film phase state of the host material with the lowest energy is not more than 0.2 eV.

Preferably, the host material of the light-emitting layer is composed of a single material, and the mass doping concentration of the doping material is 3% to 30%;

Preferably, the host material of the light-emitting layer is composed of a mixture of two materials with different structures, the mass ratio of the two materials is 1:10-10:1; and the mass doping concentration of the doping material is 3% to 30%; preferably, the mass doping concentration of the doping material in the light-emitting layer is 5% to 15%.

The method for forming each layer of the organic light-emitting diode device can use vacuum evaporation, spin coating, drop casting, inkjet printing, laser printing, or LB film method. When vacuum coating is used, vacuum deposition can be performed at a deposition rate of about 0.01 Å/s to 100 Å/s and at a deposition temperature in the range of about 100° C. to about 500° C.; when the film is formed by spin coating, spin coating can be performed a spin coating rate in the range of 2000 to 5000 rpm and at a temperature in the range of 20° C. to 200° C.

In the organic light-emitting diode device of the present invention, the thickness of each thin film is not limited. Generally speaking, if the film is too thin, defects such as pinholes are likely to occur. On the contrary, if it is too thick, a high applied voltage is required and the low efficiency will be caused, so the range of 0.1-1000 nm is generally preferred. The present invention will be further described in detail below with reference to examples. For convenience of explanation, the English abbreviations and specific structures of the compounds are shown as follows:

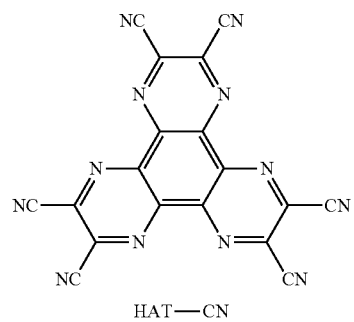

HAT—CN

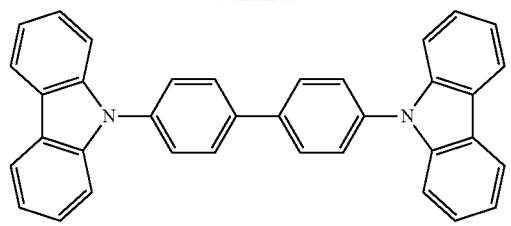

CBP

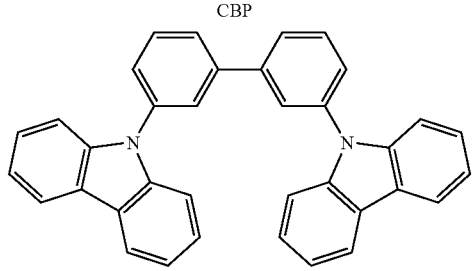

mCBP

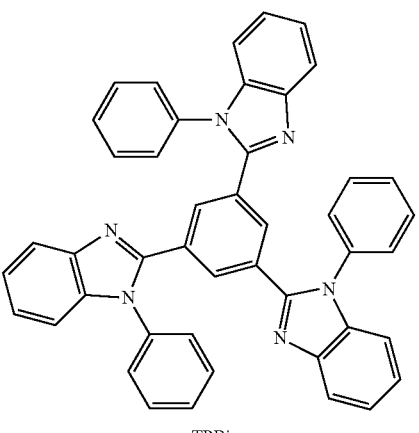

TPBi

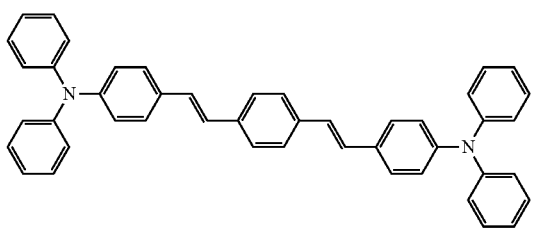

DSA—Ph

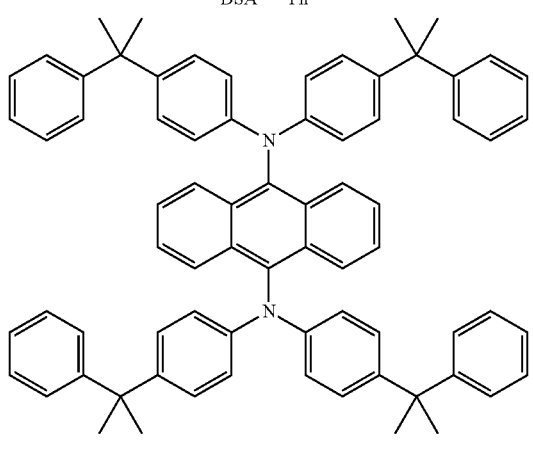

GD-19

-continued

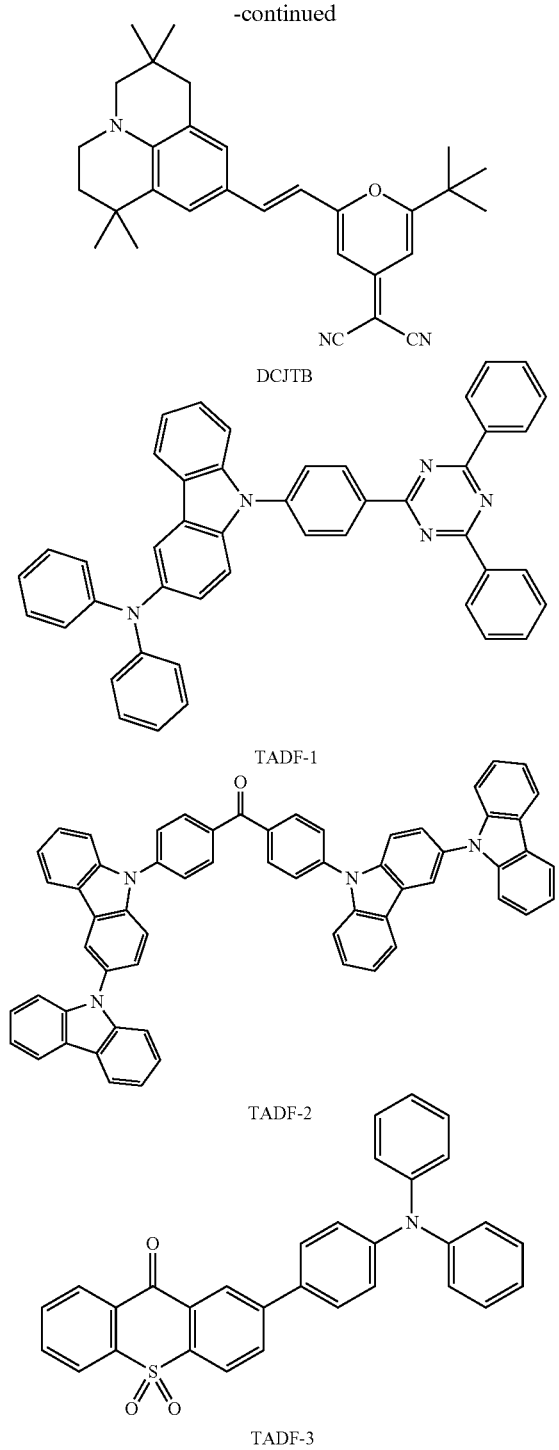

DCJTB

TADF-1

TADF-2

TADF-3

Comparative Example 1: The Specific Preparation Process of the Device is as Follows An ITO anode layer 2 on a transparent glass substrate layer 1 was cleaned ultrasonically with deionized water, acetone and alcohol separately, each for 15 minutes, and then treated in a plasma cleaner for 2 minutes; a HAT-CN film with a thickness of 10 nm was formed on the ITO anode layer 2 by vapor deposition and this layer functions as a hole injection layer 3; an NPB film with a thickness of 50 nm was then formed by vapor deposition and this layer functions as a hole transport layer 4; a TCTA film with a thickness of 60 nm was formed by vapor deposition and this layer functions as an electron block layer 5; then, a light-emitting layer 6 with a thickness of 40 nm was formed by vapor deposition, wherein, CBP is used as a host material, GD-19 is used as a doping material, and the mass doping concentration is 6%; TPBi with a thickness of 35 nm was formed on the light-emitting layer 6 by vacuum vapor deposition, and this organic material layer functions as a hole block layer/an electron transport layer 7; an electron injection layer LiF with a thickness of 1 nm was formed on the hole block layer or the electron transport layer 7 by vacuum vapor deposition and this layer functions as an electron injection layer 8; and a cathode Al (80 nm) was formed on the electron injection layer 8 by vacuum vapor deposition and this layer is a cathode electrode layer 9.

After the fabrication of the organic light-emitting diode device was completed according to the above steps, the IVL data and brightness attenuation lifetime of the device were measured, and the results are as shown in Table 4. Comparative Examples 1 and 2 and Examples 1 to 16 performed device fabrication according to the process of Comparative Example 1, except that the concentration of each functional layer material and doping material changed; meanwhile, compared to the bottom light-emitting device, the top light-emitting device was subjected to corresponding structural adjustments. The hierarchical structures of these devices are shown in Table 3. H6 has a singlet energy level of 3.0 eV and a triplet energy level of 2.8 eV; H58 has a singlet energy level of 2.90 eV and a triplet energy level of 2.78 eV; H91 has a singlet energy level of 3.3 eV and a triplet energy level of 2.85 eV; 1198 has a singlet energy level of 3.20 eV and a triplet energy level of 2.88 eV The test results of the fabricated OLED device are shown in Table 4.

TABLE 3

| No. | Substrate | Anode | Hole injection layer | Hole transport layer | Electron block layer | Light-emitting layer | Hole block layer | Electron injection layer | Cathode |
|---|---|---|---|---|---|---|---|---|---|
| Comparative Example 1 | Glass | ITO | HAT-CN (10 nm) | NPB (50 nm) | TCTA (60 nm) | CBP:GD-19 = 100:6 (40 nm) | TPBi (35 nm) | LiF (1 nm) | Al (80 nm) |
| Comparative Example 2 | Glass | ITO | HAT-CN (10 nm) | NPB (50 nm) | TCTA (60 nm) | CBP:TADF-1 = 100:6 (40 nm) | TPBi (35 nm) | LiF (1 nm) | Al (80 nm) |

TABLE 3-continued

| No. | Substrate | Anode | Hole injection layer | Hole transport layer | Electron block layer | Light-emitting layer | Hole block layer | Electron injection layer | Cathode |
|---|---|---|---|---|---|---|---|---|---|
| Example 1 | Glass | ITO | HAT-CN (10 nm) | NPB (50 nm) | TCTA (60 nm) | CBP:B-1 = 100:6 (40 nm) | TPBi (35 nm) | LiF (1 nm) | Al (80 nm) |
| Example 2 | Glass | ITO | HAT-CN (10 nm) | NPB (50 nm) | TCTA (60 nm) | CBP:B-10 = 100:6 (40 nm) | TPBi (35 nm) | LiF (1 nm) | Al (80 nm) |
| Example 3 | Glass | ITO | HAT-CN (10 nm) | NPB (50 nm) | TCTA (60 nm) | H6:B-1 = 100:6 (40 nm) | TPBi (35 nm) | LiF (1 nm) | Al (80 nm) |
| Example 4 | Glass | ITO | HAT-CN (10 nm) | NPB (50 nm) | TCTA (60 nm) | H58:B-1 = 100:6 (40 nm) | TPBi (35 nm) | LiF (1 nm) | Al (80 nm) |
| Example 5 | Glass | ITO | HAT-CN (10 nm) | NPB (50 nm) | TCTA (60 nm) | H6:H91:B-1 = 50:50:6 (40 nm) | TPBi (35 nm) | LiF (1 nm) | Al (80 nm) |
| Example 6 | Glass | ITO | HAT-CN (10 nm) | NPB (50 nm) | TCTA (60 nm) | H58:H98:B-1 = 50:50:6 (40 nm) | TPBi (35 nm) | LiF (1 nm) | Al (80 nm) |
| Example 7 | Glass | ITO | HAT-CN (10 nm) | NPB (50 nm) | TCTA (60 nm) | H58:H98:B-1 = 50:50:12 (40 nm) | TPBi (35 nm) | LiF (1 nm) | Al (80 nm) |
| Example 8 | Glass | ITO | HAT-CN (10 nm) | NPB (50 nm) | TCTA (60 nm) | H58:H98:B-1 = 50:50:18 (40 nm) | TPBi (35 nm) | LiF (1 nm) | Al (80 nm) |
| Example 9 | Glass | ITO | HI-11 (10 nm) | NPB (50 nm) | TCTA (60 nm) | H58:H98:B-1 = 50:50:12 (40 nm) | TPBi (35 nm) | LiF (1 nm) | Al (80 nm) |
| Example 10 | Glass | ITO | HAT-CN (10 nm) | HT-18 (50 nm) | TCTA (60 nm) | H58:H98:B-1 = 50:50:12 (40 nm) | TPBi (35 nm) | LiF (1 nm) | Al (80 nm) |
| Example 11 | Glass | ITO | HAT-CN (10 nm) | NPB (50 nm) | HT-22 (60 nm) | H58:H98:B-1 = 50:50:12 (40 nm) | TPBi (35 nm) | LiF (1 nm) | Al (80 nm) |
| Example 12 | Glass | ITO | HAT-CN (10 nm) | NPB (50 nm) | TCTA (60 nm) | H58:H98:B-1 = 50:50:12 (40 nm) | ET-23 (35 nm) | LiF (1 nm) | Al (80 nm) |
| Embodiment 13 | Glass | ITO | HAT-CN (10 nm) | NPB (50 nm) | TCTA (60 nm) | H58:H98:B-1 = 50:50:12 (40 nm) | TPBi (35 nm) | Li$_2$CO$_3$ (1 nm) | Al (80 nm) |
| Example 14 | Glass | ITO | HAT-CN (10 nm) | NPB (50 nm) | TCTA (60 nm) | H58:H98:B-1 = 50:50:12 (40 nm) | TPBi (35 nm) | LiF (1 nm) | Mg:Ag = 9:1 (10 nm) |
| Example 15 | Polyimide | ITO | HAT-CN (10 nm) | NPB (50 nm) | TCTA (60 nm) | H58:H98:B-1 = 50:50:12 (40 nm) | TPBi (35 nm) | LiF (1 nm) | Al (80 nm) |
| Example 16 | Glass | IGZO | HAT-CN (10 nm) | NPB (50 nm) | TCTA (60 nm) | H58:H98:B-1 = 50:50:12 (40 nm) | TPBi (35 nm) | LiF (1 nm) | Al (80 nm) |

TABLE 4

| Code of device | External quantum efficiency (10 Ma/cm$^2$) | Spectral FWHM of device (nm) | Color coordinate | Maximum external quantum efficiency | LT90 lifetime (h) |
|---|---|---|---|---|---|
| Comparative Example 1 | 0.06 | 70 | 0.32, 0.63 | 0.08 | 100 |
| Comparative Example 2 | 0.12 | 110 | 0.31, 0.59 | 0.20 | 50 |
| Example 1 | 0.20 | 60 | 0.29, 0.63 | 0.24 | 110 |
| Example 2 | 0.21 | 55 | 0.27, 0.64 | 0.25 | 125 |
| Example 3 | 0.21 | 58 | 0.29, 0.63 | 0.25 | 130 |
| Example 4 | 0.22 | 59 | 0.28, 0.64 | 0.25 | 140 |
| Example 5 | 0.22 | 61 | 0.27, 0.64 | 0.28 | 170 |
| Example 6 | 0.22 | 59 | 0.27, 0.64 | 0.28 | 190 |
| Example 7 | 0.25 | 60 | 0.28, 0.64 | 0.29 | 200 |
| Example 8 | 0.17 | 59 | 0.27, 0.64 | 0.25 | 170 |
| Example 9 | 0.24 | 60 | 0.27, 0.63 | 0.29 | 190 |
| Example 10 | 0.23 | 58 | 0.28, 0.64 | 0.28 | 192 |
| Example 11 | 0.23 | 61 | 0.27, 0.64 | 0.29 | 188 |
| Example 12 | 0.25 | 59 | 0.27, 0.63 | 0.29 | 195 |
| Example 13 | 0.25 | 61 | 0.27, 0.64 | 0.29 | 205 |
| Example 14 | 0.25 | 50 | 0.26, 0.63 | 0.28 | 198 |
| Example 15 | 0.24 | 59 | 0.27, 0.63 | 0.29 | 208 |
| Example 16 | 0.25 | 59 | 0.28, 0.64 | 0.28 | 208 |

From the above device data, it can be seen that the boron-containing compound can make full use of triplet energy compared to traditional fluorescent materials, thereby greatly improving device efficiency. Compared with the known TADF green light materials, the spectral FWHM of the boron-containing compound is significantly reduced, and its color purity is significantly improved; the device efficiency roll-off phenomenon is significantly suppressed, and the device lifetime is significantly improved. By using the above single-body or dual-body matching materials, the device efficiency is significantly improved compared to that of the traditional host material CBP, because the triplet energy level of the CBP material is lower, and the triplet energy of the guest material may return to the host material, resulting in the reduction of device efficiency; while the dual body has an increased carrier recombination area relative to the single body, and moreover it can dilute the exciton, so the efficiency and lifetime of the device are improved. By further adjustment of the guest doping concentration, it can be found that the optimal doping mass ratio of the guest doping is about 12%, because the doping concentration is low and the energy transfer of the host and guest materials is insufficient; if the doping concentration is too high, it is easy to cause triplet-triplet quenching, thus reducing the efficiency and lifetime of the device. Furthermore, by adjusting other functional layer materials, the efficiency, color purity, and spectral FWHM of the device are not significantly different, but a large difference in device lifetime occurs, which is mainly caused by the inconsistency of the stability of other functional layer materials.

The hierarchical structures of Comparative Example 3, Comparative Example 4, and Examples 17 to 32 are shown in Table 5. H9 has a singlet energy level of substituted or unsubstituted 3.08 eV and a triplet energy level of 2.88 eV; H54 has a singlet energy level of 3.04 eV and a triplet energy level of 2.89 eV; H93 has a singlet energy level of 3.38 eV and a triplet energy level of 2.92 eV; H101 has a singlet energy level of 3.35 eV and a triplet energy level of 2.95 eV. The test results of the fabricated OLED device are shown in Table 6.

TABLE 5

| No. | Substrate | Anode | Hole injection layer | Hole transport layer | Electron block layer | Light-emitting layer | Hole block layer | Electron injection layer | Cathode |
|---|---|---|---|---|---|---|---|---|---|
| Comparative Example 3 | Glass | ITO | HAT-CN (10 nm) | NPB (50 nm) | TCTA (20 nm) | mCBP:DSA-Ph = 100:4 (25 nm) | TPBi (35 nm) | LiF (1 nm) | Al (80 nm) |
| Comparative Example 4 | Glass | ITO | HAT-CN (10 nm) | NPB (50 nm) | TCTA (20 nm) | mCBP:TADF-2 = 100:10 (25 nm) | TPBi (35 nm) | LiF (1 nm) | Al (80 nm) |
| Example 17 | Glass | ITO | HAT-CN (10 nm) | NPB (50 nm) | TCTA (20 nm) | mCBP:B-15 = 100:10 (25 nm) | TPBi (35 nm) | LiF (1 nm) | Al (80 nm) |
| Example 18 | Glass | ITO | HAT-CN (10 nm) | NPB (50 nm) | TCTA (20 nm) | mCBP:B-20 = 100:10 (25 nm) | TPBi (35 nm) | LiF (1 nm) | Al (80 nm) |
| Example 19 | Glass | ITO | HAT-CN (10 nm) | NPB (50 nm) | TCTA (20 nm) | H9: B-15 = 100:10 (25 nm) | TPBi (35 nm) | LiF (1 nm) | Al (80 nm) |
| Example 20 | Glass | ITO | HAT-CN (10 nm) | NPB (50 nm) | TCTA (20 nm) | H54:B-15 = 100:10 (25 nm) | TPBi (35 nm) | LiF (1 nm) | Al (80 nm) |
| Example 21 | Glass | ITO | HAT-CN (10 nm) | NPB (50 nm) | TCTA (20 nm) | H9:H93:B-15 = 50:50:10 (25 nm) | TPBi (35 nm) | LiF (1 nm) | Al (80 nm) |
| Example 22 | Glass | ITO | HAT-CN (10 nm) | NPB (50 nm) | TCTA (20 nm) | H54:H101:B-15 = 50:50:10 (25 nm) | TPBi (35 nm) | LiF (1 nm) | Al (80 nm) |
| Example 23 | Glass | ITO | HAT-CN (10 nm) | NPB (50 nm) | TCTA (20 nm) | H54:H101:B-15 = 50:50:6 (25 nm) | TPBi (35 nm) | LiF (1 nm) | Al (80 nm) |
| Example 24 | Glass | ITO | HAT-CN (10 nm) | NPB (50 nm) | TCTA (20 nm) | H54:H101:B-15 = 50:50:17 (25 nm) | TPBi (35 nm) | LiF (1 nm) | Al (80 nm) |
| Example 25 | Glass | ITO | HI-8 (10 nm) | NPB (50 nm) | TCTA (20 nm) | H54:H101:B-15 = 50:50:10 (25 nm) | TPBi (35 nm) | LiF (1 nm) | Al (80 nm) |
| Example 26 | Glass | ITO | HAT-CN (10 nm) | HT-16 (50 nm) | TCTA (20 nm) | H54:H101:B-15 = 50:50:10 (25 nm) | TPBi (35 nm) | LiF (1 nm) | Al (80 nm) |
| Example 27 | Glass | ITO | HAT-CN (10 nm) | NPB (50 nm) | HT-24 (20 nm) | H54:H101:B-15 = 50:50:10 (25 nm) | TPBi (35 nm) | LiF (1 nm) | Al (80 nm) |
| Example 28 | Glass | ITO | HAT-CN (10 nm) | NPB (50 nm) | TCTA (20 nm) | H54:H101:B-15 = 50:50:10 (25 nm) | ET-21 (35 nm) | LiF (1 nm) | Al (80 nm) |
| Example 29 | Glass | ITO | HAT-CN (10 nm) | NPB (50 nm) | TCTA (20 nm) | H54:H101:B-15 = 50:50:10 (25 nm) | TPBi (35 nm) | CaC$_2$O$_4$ (1 nm) | Al (80 nm) |
| Example 30 | Glass | ITO | HAT-CN (10 nm) | NPB (50 nm) | TCTA (20 nm) | H54:H101:B-15 = 50:50:10 (25 nm) | TPBi (35 nm) | LiF (1 nm) | Mg:Ag = 9:1 (10 nm) |
| Example 31 | Polyethylene | ITO | HAT-CN (10 nm) | NPB (50 nm) | TCTA (20 nm) | H54:H101:B-15 = 50:50:10 (25 nm) | TPBi (35 nm) | LiF (1 nm) | Al (80 nm) |
| Example 32 | Glass | IGZO | HAT-CN (10 nm) | NPB (50 nm) | TCTA (20 nm) | H54:H101:B-15 = 50:50:10 (25 nm) | TPBi (35 nm) | LiF (1 nm) | Al (80 nm) |

TABLE 6

| Code of device | External quantum efficiency (10 Ma/cm$^2$) | Spectral FWHM of device (nm) | Color coordinate | Maximum external quantum efficiency | LT90 lifetime (h) |
|---|---|---|---|---|---|
| Comparative Example 3 | 0.03 | 80 | 0.18, 0.31 | 0.05 | 30 |
| Comparative Example 4 | 0.06 | 100 | 0.16, 0.24 | 0.18 | 20 |
| Example 17 | 0.11 | 60 | 0.14, 0.16 | 0.20 | 30 |
| Example 18 | 0.10 | 63 | 0.13, 0.20 | 0.20 | 32 |
| Example 19 | 0.13 | 59 | 0.14, 0.17 | 0.21 | 40 |
| Example 20 | 0.12 | 62 | 0.13, 0.15 | 0.20 | 42 |
| Example 21 | 0.15 | 59 | 0.14, 0.16 | 0.22 | 52 |
| Example 22 | 0.16 | 61 | 0.13, 0.16 | 0.22 | 50 |
| Example 23 | 0.11 | 60 | 0.14, 0.17 | 0.20 | 53 |
| Example 24 | 0.10 | 59 | 0.13, 0.15 | 0.20 | 49 |
| Example 25 | 0.15 | 60 | 0.14, 0.17 | 0.22 | 51 |
| Example 26 | 0.16 | 58 | 0.13, 0.15 | 0.22 | 48 |
| Example 27 | 0.15 | 61 | 0.14, 0.17 | 0.22 | 47 |
| Example 28 | 0.14 | 59 | 0.14, 0.17 | 0.21 | 52 |
| Example 29 | 0.15 | 51 | 0.13, 0.15 | 0.21 | 50 |
| Example 30 | 0.16 | 60 | 0.14, 0.17 | 0.22 | 45 |
| Example 31 | 0.14 | 59 | 0.13, 0.15 | 0.21 | 51 |
| Example 32 | 0.15 | 59 | 0.14, 0.16 | 0.21 | 50 |

From the above device data, it can be seen that the boron-containing compound can make full use of triplet energy compared to traditional fluorescent materials, thereby greatly improving device efficiency. Compared with the known TADF blue light materials, the spectral FWHM of the boron-containing compound is significantly reduced, and its color purity is significantly improved; the device efficiency roll-off phenomenon is significantly suppressed, and the device lifetime is significantly improved. By using the above single-body or dual-body matching materials, the device efficiency is significantly improved compared to that of the traditional host material mCBP; while the dual body has an increased carrier recombination area relative to the single body, and moreover it can dilute the exciton, so the efficiency and lifetime of the device are improved. By further adjustment of the guest doping concentration, it can be found that the optimal doping mass ratio of the guest doping is about 10%, because the doping concentration is low and the energy transfer of the host and guest materials is insufficient; if the doping concentration is too high, it is easy to cause triplet-triplet quenching, thus reducing the efficiency and lifetime of the device. Furthermore, by adjusting other functional layer materials, the efficiency, color purity, and spectral FWHM of the device are not significantly different, but a large difference in device lifetime occurs, which is mainly caused by the inconsistency of the stability of other functional layer materials.

The hierarchical structures of Comparative Example 5, Comparative Example 6, and Examples 33 to 48 are shown in Table 7. H7 has a singlet energy level of 2.62 eV and a triplet energy level of 2.48 eV; H67 has a singlet energy level of 2.68 eV and a triplet energy level of 2.48 eV; H100 has a singlet energy level of 3.0 eV and a triplet energy level of 2.72 eV; H102 has a singlet energy level of 3.10 eV and a triplet energy level of 2.75 eV The test results of the fabricated OLED device are shown in Table 8.

TABLE 7

| No. | Substrate | Anode | Hole injection layer | Hole transport layer | Electron block layer | Light-emitting layer | Hole block layer | Electron injection layer | Cathode |
|---|---|---|---|---|---|---|---|---|---|
| Comparative Example 5 | Glass | ITO | HAT-CN (30 nm) | NPB (140 nm) | TCTA (20 nm) | CBP:DCJTB = 100:3 (40 nm) | TPBi (35 nm) | LiF (1 nm) | Al (80 nm) |
| Comparative Example 6 | Glass | ITO | HAT-CN (30 nm) | NPB (140 nm) | TCTA (20 nm) | CBP:TADF-3 = 100:10 (40 nm) | TPBi (35 nm) | LiF (1 nm) | Al (80 nm) |
| Example 33 | Glass | ITO | HAT-CN (30 nm) | NPB (140 nm) | TCTA (20 nm) | CBP:B-34 = 100:10 (40 nm) | TPBi (35 nm) | LiF (1 nm) | Al (80 nm) |
| Example 34 | Glass | ITO | HAT-CN (30 nm) | NPB (140 nm) | TCTA (20 nm) | CBP:B-40 = 100:10 (40 nm) | TPBi (35 nm) | LiF (1 nm) | Al (80 nm) |
| Example 35 | Glass | ITO | HAT-CN (30 nm) | NPB (140 nm) | TCTA (20 nm) | H7:B-40 = 100:10 (40 nm) | TPBi (35 nm) | LiF (1 nm) | Al (80 nm) |
| Example 36 | Glass | ITO | HAT-CN (30 nm) | NPB (140 nm) | TCTA (20 nm) | H67:B-40 = 100:10 (40 nm) | TPBi (35 nm) | LiF (1 nm) | Al (80 nm) |
| Example 37 | Glass | ITO | HAT-CN (30 nm) | NPB (140 nm) | TCTA (20 nm) | H7:H100:B-40 = 50:50:10 (40 nm) | TPBi (35 nm) | LiF (1 nm) | Al (80 nm) |
| Example 38 | Glass | ITO | HAT-CN (30 nm) | NPB (140 nm) | TCTA (20 nm) | H67:H102:B-40 = 50:50:10 (40 nm) | TPBi (35 nm) | LiF (1 nm) | Al (80 nm) |
| Example 39 | Glass | ITO | HAT-CN (30 nm) | NPB (140 nm) | TCTA (20 nm) | H7:H100:B-40 = 50:50:6 (40 nm) | TPBi (35 nm) | LiF (1 nm) | Al (80 nm) |
| Example 40 | Glass | ITO | HAT-CN (30 nm) | NPB (140 nm) | TCTA (20 nm) | H7:H100:B-40 = 50:50:18 (40 nm) | TPBi (35 nm) | LiF (1 nm) | Al (80 nm) |
| Example 41 | Glass | ITO | HI-8 (30 nm) | NPB (140 nm) | TCTA (20 nm) | H7:H100:B-40 = 50:50:10 (40 nm) | TPBi (35 nm) | LiF (1 nm) | Al (80 nm) |
| Example 42 | Glass | ITO | HAT-CN (30 nm) | HT-16 (140 nm) | TCTA (20 nm) | H7:H100:B-40 = 50:50:10 (40 nm) | TPBi (35 nm) | LiF (1 nm) | Al (80 nm) |
| Example 43 | Glass | ITO | HAT-CN (30 nm) | NPB (140 nm) | HT-24 (20 nm) | H7:H100:B-40 = 50:50:10 (40 nm) | TPBi (35 nm) | LiF (1 nm) | Al (80 nm) |
| Example 44 | Glass | ITO | HAT-CN (30 nm) | NPB (140 nm) | TCTA (20 nm) | H7:H100:B-40 = 50:50:10 (40 nm) | ET-21 (35 nm) | LiF (1 nm) | Al (80 nm) |
| Example 45 | Glass | ITO | HAT-CN (30 nm) | NPB (140 nm) | TCTA (20 nm) | H7:H100:B-40 = 50:50:10 (40 nm) | TPBi (35 nm) | $CaC_2O_4$ (1 nm) | Al (80 nm) |
| Example 46 | Glass | ITO | HAT-CN (30 nm) | NPB (140 nm) | TCTA (20 nm) | H7:H100:B-40 = 50:50:10 (40 nm) | TPBi (35 nm) | LiF (1 nm) | Mg:Ag = 9:1 (10 nm) |
| Example 47 | Polyethylene | ITO | HAT-CN (30 nm) | NPB (140 nm) | TCTA (20 nm) | H7:H100:B-40 = 50:50:10 (40 nm) | TPBi (35 nm) | LiF (1 nm) | Al (80 nm) |
| Example 48 | Glass | IGZO | HAT-CN (30 nm) | NPB (140 nm) | TCTA (20 nm) | H7:H100:B-40 = 50:50:10 (40 nm) | TPBi (35 nm) | LiF (1 nm) | Al (80 nm) |

TABLE 8

| Code of device | External quantum efficiency (10 Ma/cm$^2$) | Spectral FWHM of device (nm) | Color coordinate | Maximum external quantum efficiency | LT90 lifetime (h) |
|---|---|---|---|---|---|
| Comparative Example 5 | 0.03 | 73 | 0.67, 0.32 | 0.05 | 150 |
| Comparative Example 6 | 0.07 | 102 | 0.43, 0.51 | 0.18 | 50 |
| Example 33 | 0.11 | 62 | 0.66, 0.33 | 0.18 | 100 |
| Example 34 | 0.13 | 55 | 0.65, 0.34 | 0.20 | 130 |
| Example 35 | 0.13 | 56 | 0.66, 0.34 | 0.22 | 150 |
| Example 36 | 0.14 | 57 | 0.66, 0.33 | 0.22 | 160 |
| Example 37 | 0.15 | 55 | 0.66, 0.33 | 0.22 | 200 |
| Example 38 | 0.17 | 56 | 0.65, 0.34 | 0.23 | 210 |
| Example 39 | 0.12 | 56 | 0.66, 0.34 | 0.20 | 180 |
| Example 40 | 0.11 | 57 | 0.66, 0.33 | 0.20 | 160 |
| Example 41 | 0.17 | 56 | 0.66, 0.33 | 0.22 | 220 |
| Example 42 | 0.17 | 57 | 0.65, 0.34 | 0.22 | 210 |
| Example 43 | 0.16 | 55 | 0.66, 0.33 | 0.22 | 200 |
| Example 44 | 0.17 | 56 | 0.65, 0.34 | 0.22 | 205 |
| Example 45 | 0.17 | 56 | 0.66, 0.33 | 0.22 | 206 |
| Example 46 | 0.17 | 57 | 0.65, 0.34 | 0.22 | 211 |
| Example 47 | 0.16 | 55 | 0.66, 0.33 | 0.22 | 214 |
| Example 48 | 0.17 | 56 | 0.65, 0.34 | 0.23 | 203 |

From the above device data, it can be seen that the boron-containing compound can make full use of triplet energy compared to traditional fluorescent materials, thereby greatly improving device efficiency. Compared with the known TADF red light materials, the spectral FWHM of the boron-containing compound is significantly reduced, and its color purity is significantly improved; the device efficiency roll-off phenomenon is significantly suppressed, and the device lifetime is significantly improved. By using the above single-body or dual-body matching materials, the device efficiency is significantly improved compared to that of the traditional host material CBP; while the dual body has an increased carrier recombination area relative to the single body, and moreover it can dilute the exciton, so the efficiency and lifetime of the device are improved. By further adjustment of the guest doping concentration, it can be found that the optimal doping mass ratio of the guest doping is about 10%, because the doping concentration is low and the energy transfer of the host and guest materials is insufficient; if the doping concentration is too high, it is easy to cause triplet-triplet quenching, thus reducing the efficiency and lifetime of the device. Furthermore, by adjusting other functional layer materials, the efficiency, color purity, and spectral FWHM of the device are not significantly different, but a large difference in device lifetime occurs, which is mainly caused by the inconsistency of the stability of other functional layer materials.

What is claimed is:

1. An organic light-emitting diode device, comprising a substrate layer, an anode layer, a light-emitting layer and a cathode layer,
wherein the light-emitting layer comprises a host material and a doping material; the doping material is a boron-containing organic compound with a singlet-triplet energy gap of not more than 0.2 eV and a spectral full width at half maximum of not more than 120 nm; meanwhile, singlet and triplet energy levels of the host material are both higher than singlet and triplet energy levels of the doping material; an energy gap between a lowest singlet energy level and a lowest triplet energy level of the host material is less than or equal to 0.2 eV; the lowest triplet energy level of the host material is greater than or equal to a lowest singlet energy level of the doping material.

2. The organic light-emitting diode device according to claim 1, wherein the singlet-triplet energy gap of the boron-containing organic compound is not greater than 0.1 eV.

3. The organic light-emitting diode device according to claim 1, wherein a triplet energy level in a film phase state of the host material with a lowest energy is greater than a triplet energy level of the doping material by 0.1 eV or more.

4. The organic light-emitting diode device according to claim 1, wherein a singlet-triplet energy gap in a film phase state of the host material with a lowest energy is not more than 0.15 eV.

5. The organic light-emitting diode device according to claim 1, wherein the host material of the light-emitting layer is composed of a single material, and the doping material of the light-emitting layer has a mass doping concentration of 0.5% to 30%.

6. The organic light-emitting diode device according to claim 1, wherein the host material of the light-emitting layer is composed of a mixture of two materials with different structures, and the doping material of the light-emitting layer has a mass doping concentration of 0.5% to 30%.

7. The organic light-emitting diode device according to claim 1, wherein the boron-containing organic compound takes a boron element as a core to bond with other groups by way of sp2 hybrid orbital; the other groups connected to boron are hydrogen atom, substituted or unsubstituted cycloalkyl with 3 to 10 carbon atoms, substituted or unsubstituted heterocycloalkyl with 1 to 10 carbon atoms, substituted or unsubstituted aryl with 6 to 60 carbon atoms, or substituted or unsubstituted heteroaryl with 5 to 60 carbon atoms; and the other groups connected to boron are connected individually, or are directly bonded to each other to form a ring or connected through more groups to form a ring before being connected to boron.

8. The organic light-emitting diode device according to claim 1, wherein in the boron-containing organic compound, a group connected to boron is substituted or unsubstituted phenyl, substituted or unsubstituted biphenyl, substituted or unsubstituted terphenyl, substituted or unsubstituted pyrimidinyl, substituted or unsubstituted pyridyl, substituted or unsubstituted naphthyl, substituted or unsubstituted anthryl, substituted or unsubstituted phenanthrenyl, substituted or unsubstituted triazinyl, substituted or unsubstituted quinolinyl, substituted or unsubstituted dibenzofuranyl, substituted or unsubstituted dibenzothienyl, substituted or unsubstituted 9,9-dimethylfluorenyl, substituted or unsubstituted 9,9-diphenylfluorenyl, substituted or unsubstituted carbazolyl, substituted or unsubstituted benzocarbazolyl, substituted or unsubstituted thienyl, substituted or unsubstituted benzothienyl, substituted or unsubstituted furanyl, substituted or unsubstituted benzofuranyl, substituted or unsubstituted benzimidazolyl, substituted or unsubstituted acridinyl, substituted or unsubstituted phenoxazinyl, or substituted or unsubstituted phenothiazinyl; and groups connected to boron are connected individually, or are directly bonded to each other to form a ring or connected through more groups to form a ring before being connected to boron.

9. The organic light-emitting diode device according to claim 1, wherein the boron-containing organic compound is represented by formula (1):

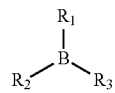

formula (1)

wherein $R_1$, $R_2$, and $R_3$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_1$, $R_2$, and $R_3$ do not simultaneously represent hydrogen atom.

10. The organic light-emitting diode device according to claim 1, wherein the boron-containing organic compound is represented by formula (2):

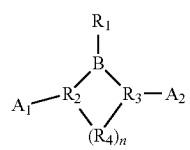

formula (2)

wherein $R_1$, $A_1$ and $A_2$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms;

wherein $R_2$ and $R_3$ independently represent a multivalent group derived from substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms;

in formula (2), n is equal to 0 or 1;

when n is equal to 0, $R_2$ and $R_3$ are bonded to each other to form a ring;

when n is equal to 1, $R_4$ independently represents oxygen atom, sulfur atom, boron atom substituted by alkyl or aryl, alkylene substituted by linear or branched alkyl with 1 to 10 carbon atoms, alkylene substituted by aryl, imino substituted by alkyl, imino substituted by aryl, substituted or unsubstituted arylene with 6 to 60 carbon atoms, or substituted or unsubstituted heteroarylene with 5 to 60 carbon atoms.

11. The organic light-emitting diode device according to claim 1, wherein the boron-containing organic compound is represented by formula (3):

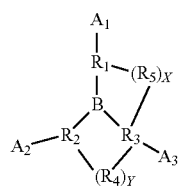

formula (3)

wherein $A_1$, $A_2$, and $A_3$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms;

wherein $R_1$, $R_2$, and $R_3$ independently represent a multivalent group derived from substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms;

in formula (3), X and Y are independently equal to 0 or 1;

when X and Y are independently equal to 0, $R_2$ and $R_3$ are bonded to each other to form a ring, and $R_1$ and $R_3$ are bonded to each other to form a ring;

when X and Y are independently equal to 1, $R_4$ and $R_5$ independently represent oxygen atom, sulfur atom, boron atom substituted by alkyl or aryl, alkylene substituted by linear or branched alkyl with 1 to 10 carbon atoms, alkylene substituted by aryl, imino substituted by alkyl, imino substituted by aryl, substituted or unsubstituted arylene with 6 to 60 carbon atoms, or substituted or unsubstituted heteroarylene with 5 to 60 carbon atoms.

12. The organic light-emitting diode device according to claim 1, wherein the boron-containing organic compound is represented by formula (4):

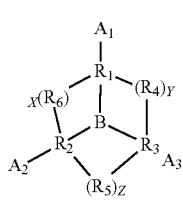

formula (4)

wherein $A_1$, $A_2$, and $A_3$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms;

wherein $R_1$, $R_2$, and $R_3$, independently represent a multivalent group derived from substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms;

in formula (4), X, Y and Z are independently equal to 0 or 1;

when X, Y and Z are independently equal to 0, $R_2$ and $R_3$ are bonded to each other to form a ring, $R_1$ and $R_3$ are bonded to each other to form a ring, and $R_1$ and $R_2$ are bonded to each other to form a ring;

when X, Y and Z are independently equal to 1, $R_4$, $R_5$ and $R_6$ independently represent oxygen atom, sulfur atom, boron atom substituted by alkyl or aryl, alkylene substituted by linear or branched alkyl with 1 to 10 carbon atoms, alkylene substituted by aryl, imino substituted by alkyl, imino substituted by aryl, substituted or unsubstituted arylene with 6 to 60 carbon atoms, or substituted or unsubstituted heteroarylene with 5 to 60 carbon atoms.

13. The organic light-emitting diode device according to claim 1, wherein the boron-containing organic compound is represented by formula (5):

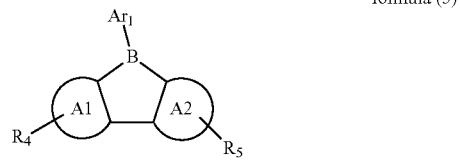

formula (5)

wherein $Ar_1$, A1, and A2 independently represent substituted or unsubstituted aryl with 6 to 60 carbon atoms or substituted or unsubstituted heteroaryl with 2 to 60 carbon atoms; $R_4$ and $R_5$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_4$ and $R_5$ do not simultaneously represent hydrogen atom.

14. The organic light-emitting diode device according to claim 1, wherein the boron-containing organic compound is represented by formula (6):

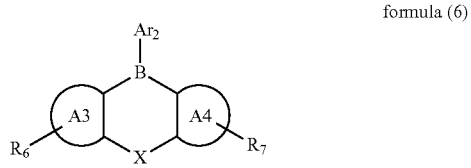

formula (6)

wherein $Ar_2$, A3, and A4 independently represent substituted or unsubstituted aryl with 6 to 60 carbon atoms or substituted or unsubstituted heteroaryl with 5 to 60 carbon atoms; $R_6$ and $R_7$ independently represent hydrogen atom, substituted or unsubstituted cycloalkyl with 3 to 10 carbon atoms, substituted or unsubstituted heterocycloalkyl with 3 to 10 carbon atoms, substituted or unsubstituted aryl with 6 to 60 carbon atoms, or substituted or unsubstituted heteroaryl with 5 to 60 carbon atoms; and $R_6$ and $R_7$ do not simultaneously represent hydrogen atom;

X represents oxygen atom, sulfur atom, boron atom substituted by alkyl or aryl, alkylene substituted by linear alkyl with 1 to 10 carbon atoms, alkylene substituted by branched alkyl with 1 to 10 carbon atoms, alkylene substituted by aryl, imino substituted by alkyl, or imino substituted by aryl.

15. The organic light-emitting diode device according to claim 13, wherein $Ar_1$, A1, and A2 independently represent substituted or unsubstituted phenyl, substituted or unsubstituted biphenyl, substituted or unsubstituted terphenyl, substituted or unsubstituted pyrimidine, substituted or unsubstituted pyridyl, substituted or unsubstituted naphthyl, substituted or unsubstituted anthryl, substituted or unsubstituted phenanthryl, substituted or unsubstituted triazinyl, substituted or unsubstituted quinolinyl, substituted or unsubstituted dibenzofuranyl, substituted or unsubstituted dibenzothienyl, substituted or unsubstituted 9,9-dimethylfluorenyl, substituted or unsubstituted 9,9-diphenyl Fluorenyl, substituted or unsubstituted carbazolyl, substituted or unsubstituted benzocarbazolyl, substituted or unsubstituted thienyl, substituted or unsubstituted benzothienyl, substituted or unsubstituted furanyl, substituted or unsubstituted benzofuranyl, substituted or unsubstituted benzimidazolyl, substituted or unsubstituted acridinyl, substituted or unsubstituted phenoxazinyl, or substituted or unsubstituted phenothiazinyl.

16. The organic light-emitting diode device according to claim 13, wherein $R_4$ and $R_5$ are independently represented by formula (7), (8) or (9):

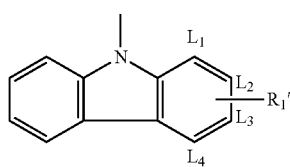

formula (7)

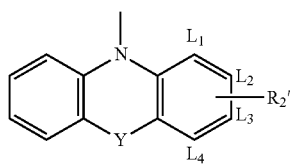

formula (8)

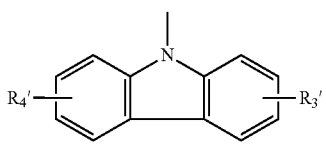

formula (9)

wherein $R_1'$ and $R_2'$ independently represents hydrogen atom or a structure of formula (10);

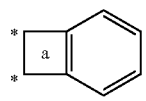

formula (10)

in formula (10), a is

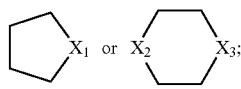

$X_1$, $X_2$, and $X_3$ independently represent oxygen atom, sulfur atom, selenium atom, alkylene substituted by linear or branched alkyl with 1 to 10 carbon atoms, alkylene substituted by aryl, imino substituted by alkyl, or imino substituted by aryl;

formula (10) is connected to formula (7) or formula (8) through $CL_1$-$CL_2$ bond, $CL_2$-$CL_3$ bond, or $CL_3$-$CL_4$ bond;

$R_3'$ and $R_4'$ independently represent hydrogen atom, cycloalkyl or heteroalkyl with 3 to 10 carbon atoms, substituted or unsubstituted phenyl, substituted or unsubstituted naphthyl, substituted or unsubstituted pyrimidinyl, substituted or unsubstituted carbazolyl, substituted or unsubstituted dibenzofuranyl, substituted or unsubstituted 9,9-dimethylfluorenyl, substituted or unsubstituted dibenzothienyl, substituted or unsubstituted N-phenylcarbazolyl, or substituted or unsubstituted arylamino;

Y represents oxygen atom, sulfur atom, alkylene substituted by linear alkyl with 1 to 10 carbon atoms, alkylene substituted by branched alkyl with 1 to 10 carbon atoms, alkylene substituted by aryl, imino substituted by alkyl, or imino substituted by aryl.

17. The organic light-emitting diode device according to claim 1, wherein the organic light-emitting diode device further comprises a hole injection/transport layer, wherein the hole injection/transport layer comprises one or more of a hole injection layer, a hole transport layer, a buffer layer, and an electron block layer; and a material of the hole injection layer is represented by the following structural formula (1b), (2b) or (3b):

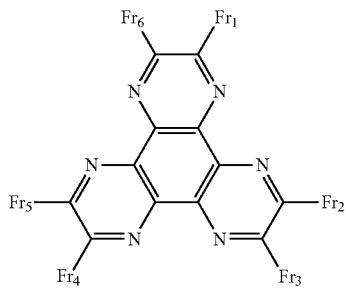

formula (1b)

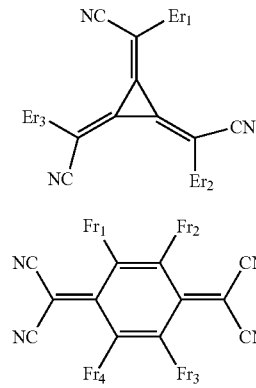

formula (2b)

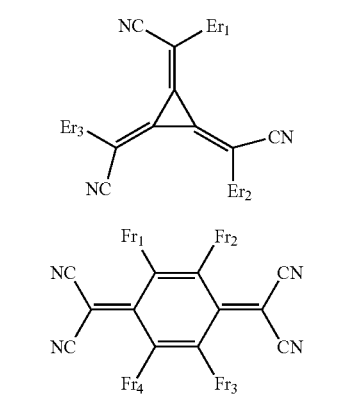

formula (3b)

wherein, in formula (2b), $Er_1$ to $Er_3$ independently represent substituted or unsubstituted aryl with 6 to 60 carbon atoms or substituted or unsubstituted heteroaryl with 5 to 60 carbon atoms; $Er_1$ to $Er_3$ are identical or different;

wherein, in formula (1b) and formula (3b), $Fr_1$ to $Fr_6$ independently represent hydrogen atom, nitrile group, halogen, amide group, alkoxy, ester group, nitro group, carbon atom substituted by linear or branched alkyl with 1 to 60 carbon atoms, substituted or unsubstituted aryl with 6 to 60 carbon atoms, or substituted or unsubstituted heteroaryl with 5 to 60 carbon atoms.

18. The organic light-emitting diode device according to claim 1, wherein the organic light-emitting diode device further comprises a hole injection/transport layer, wherein the hole injection/transport layer comprises one or more of a hole injection layer, a hole transport layer, a buffer layer, and an electron block layer; and a material of the hole transport layer is one of carbazole, fluorene, pyrazoline, furan, thiophene, xanthene, dimethylanthracene, and triarylamine compounds.

19. The organic light-emitting diode device according to claim 1, wherein the organic light-emitting diode device further comprises an electron injection/transport layer, wherein the electron injection/transport layer comprises one or more of an electron injection layer, an electron transport layer, and a hole block layer; and a material of the electron injection layer is a compound containing lithium or cesium.

20. The organic light-emitting diode device according to claim 1, wherein the organic light-emitting diode device further comprises an electron injection/transport layer, wherein the electron injection/transport layer comprises one or more of an electron injection layer, an electron transport layer, and a hole block layer; and a material of the electron transport layer is one of pyrimidines, pyridines, naphthalenes, anthracenes, phenanthrenes, triazines, quinolines, dibenzofurans, dibenzothiophenes, fluorenes, spirofluorenes, benzothiophenes, benzofurans, and benzimidazolyl compounds.

21. The organic light-emitting diode device according to claim 14, wherein $Ar_2$, A3, and A4 independently represent substituted or unsubstituted phenyl, substituted or unsubstituted biphenyl, substituted or unsubstituted terphenyl, substituted or unsubstituted pyrimidine, substituted or unsubstituted pyridyl, substituted or unsubstituted naphthyl, substituted or unsubstituted anthryl, substituted or unsubstituted phenanthryl, substituted or unsubstituted triazinyl, substituted or unsubstituted quinolinyl, substituted or unsubstituted dibenzofuranyl, substituted or unsubstituted dibenzothienyl, substituted or unsubstituted 9,9-dimethylfluorenyl, substituted or unsubstituted 9,9-diphenyl Fluorenyl, substituted or unsubstituted carbazolyl, substituted or unsubstituted benzocarbazolyl, substituted or unsubstituted thienyl, substituted or unsubstituted benzothienyl, substituted or unsubstituted furanyl, substituted or unsubstituted benzofuranyl, substituted or unsubstituted benzimidazolyl, substituted or unsubstituted acridinyl, substituted or unsubstituted phenoxazinyl, or substituted or unsubstituted phenothiazinyl.

22. The organic light-emitting diode device according to claim 14, wherein $R_6$ and $R_7$ are independently represented by formula (7), (8) or (9):

formula (7)

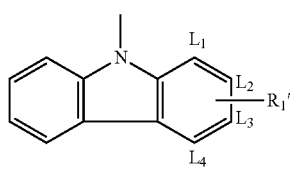

formula (8)

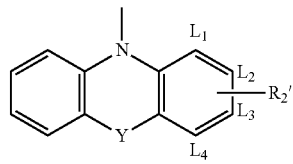

formula (9)

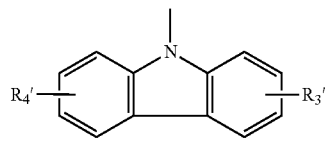

wherein $R_1'$ and $R_2'$ independently represents hydrogen atom or a structure of formula (10);

formula (10)

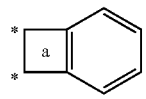

in formula (10), a is

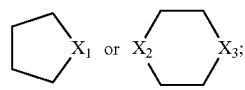

$X_1$, $X_2$, and $X_3$ independently represent oxygen atom, sulfur atom, selenium atom, alkylene substituted by linear or branched alkyl with 1 to 10 carbon atoms, alkylene substituted by aryl, imino substituted by alkyl, or imino substituted by aryl;

formula (10) is connected to formula (7) or formula (8) through $CL_1$-$CL_2$ bond, $CL_2$-$CL_3$ bond, or $CL_3$-$CL_4$ bond;

$R_3'$ and $R_4'$ independently represent hydrogen atom, cycloalkyl or heteroalkyl with 3 to 10 carbon atoms, substituted or unsubstituted phenyl, substituted or unsubstituted naphthyl, substituted or unsubstituted pyrimidinyl, substituted or unsubstituted carbazolyl, substituted or unsubstituted dibenzofuranyl, substituted or unsubstituted 9,9-dimethylfluorenyl, substituted or unsubstituted dibenzothienyl, substituted or unsubstituted N-phenylcarbazolyl, or substituted or unsubstituted arylamino;

Y represents oxygen atom, sulfur atom, alkylene substituted by linear alkyl with 1 to 10 carbon atoms, alkylene substituted by branched alkyl with 1 to 10 carbon atoms, alkylene substituted by aryl, imino substituted by alkyl, or imino substituted by aryl.

* * * * *